(12) United States Patent
Gatt

(10) Patent No.: US 12,733,409 B2
(45) **Date of Patent: *Sep. 8, 2026**

(54) SUPERCONDUCTING COMPOUNDS AND METHODS FOR MAKING THE SAME

(71) Applicant: Quantum Designed Materials Ltd., Rehovot (IL)

(72) Inventor: Refael Gatt, Mazkeret Batya (IL)

(73) Assignee: Quantum Designed Materials Ltd., Rehovot (IL)

( * ) Notice: Subject to any disclaimer, the term of this patent is extended or adjusted under 35 U.S.C. 154(b) by 672 days.

This patent is subject to a terminal disclaimer.

(21) Appl. No.: 18/136,837

(22) Filed: Apr. 19, 2023

(65) Prior Publication Data

US 2023/0345845 A1 Oct. 26, 2023

Related U.S. Application Data

(63) Continuation of application No. 15/733,204, filed as application No. PCT/IB2018/001574 on Dec. 12, 2018, now Pat. No. 11,683,997.

(Continued)

(51) Int. Cl.
*H10N 60/85* (2023.01)
*C23C 16/02* (2006.01)
(Continued)

(52) U.S. Cl.
CPC ......... *H10N 60/85* (2023.02); *C23C 16/0272* (2013.01); *C23C 16/408* (2013.01);
(Continued)

(58) Field of Classification Search
CPC ....... H01B 1/08; H01L 39/005; H01L 39/126; H01L 39/2441; H01L 39/2432; C30B 29/22; C23C 16/408; C23C 16/0272
See application file for complete search history.

(56) References Cited

U.S. PATENT DOCUMENTS 3,665,205 A 5/1972 Bridenbaugh
4,921,834 A 5/1990 Hasegawa et al.
(Continued)

FOREIGN PATENT DOCUMENTS

CN 88100501 8/1988
CN 107112411 A 8/2017
(Continued)

OTHER PUBLICATIONS

Bardeen et al., "Theory of Superconductivity", Physical Review, Dec. 1957, 108(5):1175-1204.
(Continued)

*Primary Examiner* — Jaehwan Oh
(74) *Attorney, Agent, or Firm* — Fish & Richardson P.C.

(57) ABSTRACT

A superconducting article includes a substrate and a superconducting metal oxide film formed on the substrate. The metal oxide film including ions of an alkali metal, ions of a transition metal, and ions of an alkaline earth metal or a rare earth metal. For instance, the metal oxide film can include Rb ions, La ions, and Cu ions. The superconducting metal oxide film can have a critical temperature for onset of superconductivity of greater than 250 K, e.g., greater than room temperature.

21 Claims, 50 Drawing Sheets

Related U.S. Application Data

(60) Provisional application No. 62/597,918, filed on Dec. 12, 2017.

(51) Int. Cl.

| | |
|---|---|
| ***C23C 16/40*** | (2006.01) |
| ***C23C 16/455*** | (2006.01) |
| ***C23C 16/56*** | (2006.01) |
| ***C30B 23/00*** | (2006.01) |
| ***C30B 23/02*** | (2006.01) |
| ***C30B 25/16*** | (2006.01) |
| ***C30B 25/18*** | (2006.01) |
| ***C30B 29/22*** | (2006.01) |
| ***H01B 1/08*** | (2006.01) |
| ***H10N 60/01*** | (2023.01) |
| ***H10N 60/12*** | (2023.01) |

(52) U.S. Cl.

CPC ........ *C23C 16/45531* (2013.01); *C23C 16/56* (2013.01); *C30B 23/005* (2013.01); *C30B 23/025* (2013.01); *C30B 25/165* (2013.01); *C30B 25/183* (2013.01); *C30B 29/22* (2013.01); *H01B 1/08* (2013.01); *H10N 60/01* (2023.02); *H10N 60/12* (2023.02)

(56) References Cited

U.S. PATENT DOCUMENTS

| | | | | |
|---|---|---|---|---|
| 5,401,713 | A | 3/1995 | Torii | |
| 5,482,789 | A | 1/1996 | O'Hara | |
| 5,696,392 | A | 12/1997 | Kookrin et al. | |
| 5,756,427 | A | 5/1998 | Zhou | |
| 8,784,936 | B2 | 7/2014 | Xu et al. | |
| 11,683,997 | B2 | 6/2023 | Gatt | |
| 2002/0098986 | A1 | 7/2002 | Kintaka | |
| 2005/0213282 | A1* | 9/2005 | Kondo | C30B 23/02 257/E29.164 |
| 2006/0258539 | A1 | 11/2006 | Matsumoto et al. | |
| 2009/0137398 | A1 | 5/2009 | Bozovic et al. | |
| 2014/0011683 | A1 | 1/2014 | Harshman et al. | |
| 2014/0113828 | A1* | 4/2014 | Gilbert | G01K 7/006 252/500 |
| 2015/0175642 | A1* | 6/2015 | Sakurai | C07C 251/08 427/255.31 |
| 2016/0118570 | A1* | 4/2016 | Gatt | C04B 35/453 505/121 |
| 2019/0157539 | A1* | 5/2019 | Gatt | C04B 35/45 |
| 2021/0104656 | A1 | 4/2021 | Gatt | |
| 2025/0255198 | A1 | 8/2025 | Gatt | |

FOREIGN PATENT DOCUMENTS

| | | |
|---|---|---|
| JP | 2005239535 | 9/2005 |
| KR | 19910002310 | 4/1991 |
| TW | I811273 B | 8/2023 |
| WO | WO 2010071364 | 9/2010 |
| WO | WO 2016067205 | 5/2016 |
| WO | WO 2019116103 | 6/2019 |
| WO | WO 2024039442 A2 | 2/2024 |

OTHER PUBLICATIONS

Bednorz et al., "Possible High Tc Superconductivity in the Ba—La—Cu—O System", Condensed Matter, 1986, 64:189-193.
Deutscher et al., "Short Coherence Length Superconductors and the Fermi Velocity Paradox", Chinese Journal of Physics, Dec. 1993, 31(6-II):805-812.
Drozdov et al., "Conventional Superconductivity at 203 Kelvin at High Pressures in the Sulfer Hydride System", Nature, Aug. 2015, 525:73-76.
European Extended Search Report in EP Appln. No. 18888221.1, dated Nov. 11, 2021, 10 pages.
European Search Report in EP Appln. No. 18888221.1, dated Aug. 10, 2021, 11 pages.
Lees et al., "Synthesis, Structure, and Magnetic Characterization of Pulsed Laser-Ablated Superconducting La2CuO4Fx Thin Films," Chem. Mater, Sep. 1998, 10(10):3146-3155.
Office Action in Taiwanese Appln. No. 107144837, dated May 16, 2022, 74 pages (with English Machine Translation).
PCT International Preliminary Report on Patentability in International Appln. No. PCT/IB2018/001574, dated Jun. 16, 2020, 10 pages.
PCT International Search Report and Written Opinion in International Appln. No. PCT/IB2018/001574, dated Aug. 29, 2019, 31 pages.
PCT Invitation to Pay Additional Fees and, Where Applicable, Protest Fee in International Appln. No. PCT/IB2018/001574, dated Jun. 28, 2019, 2 pages.
Wu et al., "Superconductivity at 93 K in a New Mixed-Phase Y—Ba—Cu—O Compound System at Ambient Pressure", Physical Review Letters, Mar. 1987, 58(9):908-910.
Günther et al., "Low temperature synthesis and properties of superconducting alkali substituted La2CuO4 phases," Physica C: Superconductivity, Dec. 1992, 203(1-2):115-120.
Boulesteix et al., "Conductivity of Layered Superconducting Crystals in the Normal State: Case of Bi2+Sr2Cal-yCu2O8-ps—Importance of the Oxygen and Cationic Concentrations, Role of Superconducting Fluctuations above Tc," Key Engineering Materials, Feb. 1998, 155-156:413-428.
Chen et al., "Experimental Investigation on 100 A-Class PCL for DC HTS Devices," IEEE Transactions on Applied Superconductivity, Jun. 2016, 26(4):4800805, 5 pages.
Chu et al., "Superconductivity above 150 K in HgBa2Ca2Cu3O8+ δ at high pressures," Nature, Sep. 23, 1993, 365(6444):323-325.
Dai et al., "Synthesis and neutron powder diffraction study of the superconductor HgBa2Ca2Cu3O8+ δ by Tl substitution," Physica C: Superconductivity, Mar. 1, 1995, 243(3-4):201-206.
Dou et al., "Mechanism of the Tc enhancement in Bi2Sr2CaCu2O8+y by sodium doping," Physica C: Superconductivity, Dec. 1, 1991, 185(part 2):811-812.
Gatt et al., "Hg-1212 and Hg-1223 single crystals: Synthesis and characterisation," Physica C: Superconductivity, Mar. 15, 1997, 276(3-4):270-276.
Gatt, "Is a Superconductor a Perfect Insulator?" Journal of Superconductivity and Novel Magnetism, 2020, 33:1345-1355.
Hamlin, "Superconductivity Near Room Temperature," Nature, May 2019, 569:491-492.
Kawai et al., "Effect of alkaline metal substitutions to Bi—Sr—Ca—Cu—O superconductor," Physica C: Superconductivity, Dec. 15, 1989, 161(5-6):561-566.
Kononets, "Growth from melt by micro-pulling down ( -PD) al ld Czochralski (Cz) techniques and characterization of LGSO and garnet scintillator crystals," Theoretical and/or physical chemistry, Université Claude Bernard—Lyon I, Dec. 2014, 155 pages.
Lebbou et al., "Superconductor Bi2212 fiber growth from the melt by micro-pulling down technique," Physica C., 2000, 336:254-260.
Liu et al., "Electrical and magnetic properties of the Tl—Sr—V—O system," Physica C: Superconductivity, Oct. 1991, 181(4-6):303-310.
Low Level Measurements Handbook, Precision DC Current, Voltage, and Resistance Measurements, 6th ed., Jan. 1, 2004, 246 pages.
Mansori et al., "Bi-2201, Bi-2212 and (Bi,Pb)-2223 fibers have been grown using the micro-pulling down (μ-PD) technique," Physica C: Superconductivity, Nov. 2006, 449(1):9-14.
Norman et al., "Phenomenological models for the gap anisotropy of Bi2Sr2CaCu2O8 as measured by angle-resolved photoemission spectroscopy," Physical Review B, Jul. 1, 1995, 52(1):615-622.
Office Action in Taiwanese Appln. No. 112126380, mailed on Feb. 17, 2025, 11 pages (with English translation).
Office Action in Taiwanese Appln. No. 112126380, mailed on Mar. 15, 2024, 7 pages (with English Translation).

(56) References Cited

OTHER PUBLICATIONS

Ohsaki et al., "Verification of metal layer design for large-capacity superconducting fault current limiting elements using YBCO thin film," Journal of Physics: Conference Series, Mar. 2008, 97(1):012305, 7 pages.
Ozcelik et al., "Effect of K substitution on Structural, Electrical and Magnetic Properties of Bi-2212 system," Journal of Materials Science: Materials in Electronics, Oct. 2014, 25:4476-4482.
Panas et al., "Possible influences of ionic charges, radii, softness and magnetic impurities on the superconductivity in cuprates," Chemical physics letters, Sep. 6, 1996, 259(3-4):247-251.
Precker et al., "Identification of a possible superconducting transition above room temperature in natural graphite crystals," New Journal of Physics, Jun. 30, 2016, 18(11):113041.
Putilin et al., "Superconductivity at 94 K in HgBa2Cu04+δ," Nature, Mar. 18, 1993, 362(6417):226-228.
Roeser et al., "Correlation between oxygen excess density and critical transition temperature in superconducting Bi-2201, Bi-2212 and Bi-2223," Acta Astronautica, Dec. 2008, 63(11-12):1372-1375.
Ruan et al., "The systematic study of the normal-state transport properties of Bi-2212 crystals," Journal of Physics: Condensed Matter, May 1999, 11(18):3743-3750.
Stiufiuc et al., "Anomalous Normal State Properties of Underdoped Bi 2212 Thin Films," International Journal of Modern Physics, Jun. 20, 2004, 18(15):2209-2214.
Sykorova et al., "Effect of doping on properties of Bi-based superconductors," Physica Status Solidi (c), Apr. 8, 2004, 1(7):1952-1956.
Tang et al., "Effects of Different Alkali Metal Substitution on the Interlayer Coupling in '2212' Bismuth Superconductors," J. Sci. Soc. Thailand, Aug. 1994, 20:135-143.
Wei et al., "A New Type of DC Superconducting Fault Current Limiter," IEEE Transactions on Applied Superconductivity, Aug. 2019, 29(5):5602905, 5 pages.
Zhao et al., "Normal-state reentrant behavior in superconducting Bi2Sr2CaCu2O8/Bi2Sr2Ca2Cu3O10 intergrowth single crystals," Physical Review B, Feb. 1, 1995, 51(5):3134-3139.
Zhigadlo et al., "The effects of Cs doping, heat treatments on the phase formation and superconducting properties of (Bi, Pb)—Sr—Ca—Cu—O ceramics," Physica C: Superconductivity, Apr. 20, 1998, 299(3-4):327-337.

* cited by examiner

| Ionic Charge (1) | Ionic Radius (1) | Ionic Charge (2) | Ionic Radius (2) | material | No of layers | Tc [K] |
|---|---|---|---|---|---|---|
| +3 (La) | 1.25 | N/A | N/A | LBCO | 1 | 35 |
| +2 (Ba) | 1.98 | N/A | N/A | Hg1201 | 1 | 90 |
| +2 (Sr) | 1.91 | +2 (Ca) | 1.74 | Bi2212 | 2 | 80 |
| +2 (Ba) | 1.98 | +3 (Y) | 1.62 | YBCO | 2 | 92 |
| +2 (Ba) | 1.98 | +2 (Ca) | 1.74 | Tl2212 | 2 | 110 |
| +2 (Ba) | 1.98 | +2 (Ca) | 1.74 | Hg2212 | 2 | 125 |
| +2 (Sr) | 1.91 | +2 (Ca) | 1.74 | Bi2223 | 3 | 110 |
| +2 (Ba) | 1.98 | +2 (Ca) | 1.74 | Tl2223 | 3 | 121 |
| +2 (Ba) | 1.98 | +2 (Ca) | 1.74 | Hg1223 | 3 | 134 |
| +2 (Sr) | 1.91 | N/A | N/A | Bi2201 | 1 | 12 |

| Elem | Wt % | At % | K-Ratio | Z | A | F |
|---|---|---|---|---|---|---|
| C K | 4.67 | 22.96 | 0.0094 | 1.2588 | 0.1603 | 1.0001 |
| O K | 8.46 | 31.25 | 0.0167 | 1.2365 | 0.1598 | 1.0002 |
| SrL | 15.62 | 10.54 | 0.1126 | 0.9676 | 0.7446 | 1.0005 |
| K K | 2.55 | 3.85 | 0.0181 | 1.1465 | 0.6192 | 1.0028 |
| CaK | 4.07 | 6.00 | 0.0330 | 1.1680 | 0.6927 | 1.0009 |
| CuK | 11.00 | 10.24 | 0.1157 | 1.0686 | 0.9594 | 1.0259 |
| BiL | 53.64 | 15.17 | 0.4465 | 0.8193 | 1.0071 | 1.0089 |
| Total | 100.00 | 100.00 | | | | |

Standard:
O SiO2 1-Jun-1999 12:00 AM
K MAD-10 Feldspar 1-Jun-1999 12:00 AM
Ca Wollastonite 1-Jun-1999 12:00 AM
Cu Cu 1-Jun-1999 12:00 AM
Sr SrF2 1-Jun-1999 12:00 AM
Bi Bi 1-Jun-1999 12:00 AM

| Element | App Conc. | Intensity Comm. | Weight% | Weight% Sigma | Atomic% |
|---|---|---|---|---|---|
| O K | 6.88 | 0.7927 | 15.71 | 0.21 | 50.78 |
| K K | 5.81 | 1.0754 | 9.77 | 0.10 | 12.92 |
| Ca K | 1.81 | 1.0479 | 3.13 | 0.07 | 4.04 |
| Cu K | 10.08 | 1.0275 | 17.74 | 0.29 | 14.44 |
| Sr L | 6..32 | 0.8635 | 13.24 | 0.16 | 7.81 |
| Bi M | 17.72 | 0.7936 | 40.41 | 0.29 | 10.00 |
| | | | | | |
| Totals | | | 100.00 | | |

Spectrum processing:
No peaks omitted

Processing option: All elements analyzed (Normalized)
Number of iterations = 3

Standard:
O SiO2 1-Jun-1999 12:00 AM
K MAD-10 Feldspar 1-Jun-1999 12:00 AM
Ca Wollastonite 1-Jun-1999 12:00 AM
Cu Cu 1-Jun-1999 12:00 AM
Sr SrF2 1-Jun-1999 12:00 AM
Bi Bi 1-Jun-1999 12:00 AM

| Element | App Conc. | Intensity Comm. | Weight% | Weight% Sigma | Atomic% |
|---|---|---|---|---|---|
| O K | 11.87 | 0.8254 | 15.42 | 0.16 | 55.34 |
| K K | 1.41 | 1.0623 | 1.42 | 0.05 | 2.08 |
| Ca K | 4.57 | 1.0699 | 4.58 | 0.06 | 6.57 |
| Cu K | 13.63 | 1.0673 | 13.68 | 0.20 | 12.37 |
| Sr L | 12.7 | 0.8929 | 15.24 | 0.13 | 9.99 |
| Bi M | 37.33 | 0.8056 | 49.66 | 0.22 | 13.65 |
| Totals | | | 100.00 | | |

| Elem | Wt % | At % | K-Ratio | Z | A | F |
|---|---|---|---|---|---|---|
| C K | 2.48 | 13.21 | 0.0055 | 1.3001 | 0.1703 | 1.0001 |
| O K | 8.07 | 32.32 | 0.0218 | 1.2735 | 0.2123 | 1.0003 |
| RbL | 1.94 | 1.46 | 0.0147 | 0.9889 | 0.7635 | 1.0002 |
| SrL | 16.79 | 12.28 | 0.1334 | 0.9872 | 0.8044 | 1.0003 |
| BiM | 48.30 | 14.81 | 0.3886 | 0.8542 | 0.9417 | 1.0001 |
| CaK | 5.60 | 8.96 | 0.0540 | 1.1934 | 0.8075 | 1.0008 |
| CuK | 16.81 | 16.95 | 0.1812 | 1.0960 | 0.9798 | 1.0037 |
| Total | 100.00 | 100.00 | | | | |

| Elem | Wt % | At % | K-Ratio | Z | A | F |
|---|---|---|---|---|---|---|
| C K | 3.01 | 21.65 | 0.0056 | 1.3183 | 0.1424 | 1.0001 |
| O K | 2.78 | 15.05 | 0.0056 | 1.2947 | 0.1547 | 1.0002 |
| SrL | 7.42 | 7.32 | 0.0546 | 1.0118 | 0.7276 | 1.0001 |
| CaK | 1.41 | 3.04 | 0.0113 | 1.2260 | 0.6556 | 1.0007 |
| CuK | 9.51 | 12.94 | 0.1054 | 1.1298 | 0.9524 | 1.0306 |
| BiL | 61.54 | 25.47 | 0.5427 | 0.8739 | 1.0053 | 1.0039 |
| RbK | 14.35 | 14.52 | 0.1547 | 1.0854 | 0.9933 | 1.0000 |
| Total | 100.00 | 100.00 | | | | |

| Elem | Wt % | At % | K-Ratio | Z | A | F |
|---|---|---|---|---|---|---|
| C K | 2.12 | 13.96 | 0.0037 | 1.2997 | 0.1357 | 1.0001 |
| O K | 4.54 | 22.39 | 0.0093 | 1.2765 | 0.1611 | 1.0003 |
| CaK | 2.75 | 5.42 | 0.0230 | 1.2068 | 0.6905 | 1.0040 |
| CsL | 7.26 | 4.31 | 0.0569 | 0.9441 | 0.8287 | 1.0017 |
| CuK | 10.04 | 12.47 | 0.1081 | 1.1052 | 0.9541 | 1.0215 |
| BiL | 46.96 | 17.73 | 0.4070 | 0.8491 | 1.0056 | 1.0152 |
| SrK | 26.33 | 23.71 | 0.2741 | 1.0538 | 0.9880 | 1.0000 |
| Total | 100.00 | 100.00 | | | | |

| Elem | Wt % | At % | K-Ratio | Z | A | F |
|---|---|---|---|---|---|---|
| C K | 2.71 | 15.15 | 0.0048 | 1.2781 | 0.1385 | 1.0001 |
| O K | 7.67 | 32.21 | 0.0155 | 1.2554 | 0.1608 | 1.0003 |
| CaK | 3.41 | 5.72 | 0.0281 | 1.1861 | 0.6946 | 1.0021 |
| CsL | 2.85 | 1.44 | 0.0220 | 0.9278 | 0.8301 | 1.0017 |
| CuK | 9.77 | 10.33 | 0.1039 | 1.0845 | 0.9585 | 1.0232 |
| BiL | 47.87 | 15.40 | 0.4071 | 0.8314 | 1.0073 | 1.0154 |
| SrK | 25.73 | 19.74 | 0.2621 | 1.0306 | 0.9885 | 1.0000 |
| Total | 100.00 | 100.00 | | | | |

| Elem | Wt% | At% | K-Ratio | Z | A | F |
|---|---|---|---|---|---|---|
| C K | 6.34 | 24.87 | 0.0110 | 1.2261 | 0.1421 | 1.0001 |
| O K | 12.77 | 37.62 | 0.0267 | 1.2046 | 0.1734 | 1.0004 |
| CuL | 14.52 | 10.77 | 0.0620 | 1.0054 | 0.4243 | 1.0011 |
| Rbl | 16.07 | 8.86 | 0.1107 | 0.9428 | 0.7307 | 1.0002 |
| SrL | 12.17 | 6.55 | 0.0896 | 0.0437 | 0.7801 | 1.0002 |
| BiM | 35.25 | 7.95 | 0.2526 | 0.8201 | 0.8738 | 1.0001 |
| CaK | 2.88 | 3.39 | 0.0243 | 1.1345 | 0.7403 | 1.0013 |
| Total | 100.00 | 100.00 | | | | |

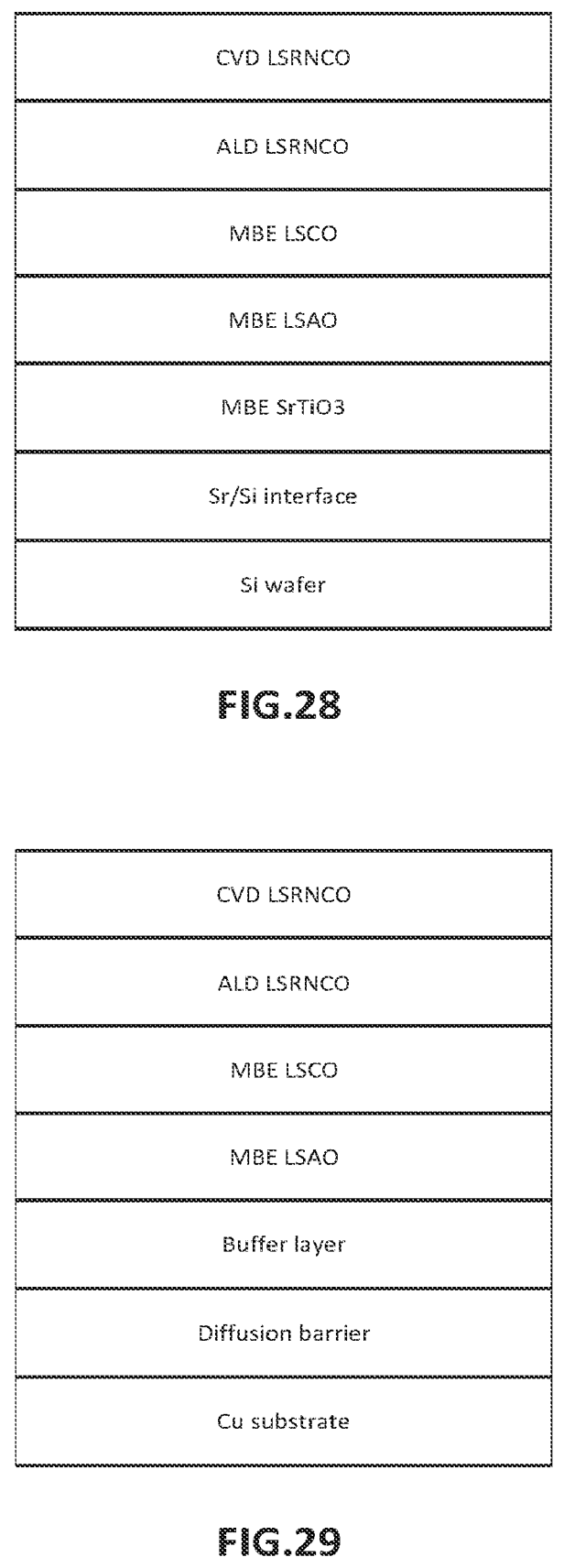

CVD LSRNCO
ALD LSRNCO
MBE LSCO
MBE LSAO
MBE SrTiO3
Sr/Si interface
Si wafer

FIG.28

CVD LSRNCO
ALD LSRNCO
MBE LSCO
MBE LSAO
Buffer layer
Diffusion barrier
Cu substrate

FIG.29

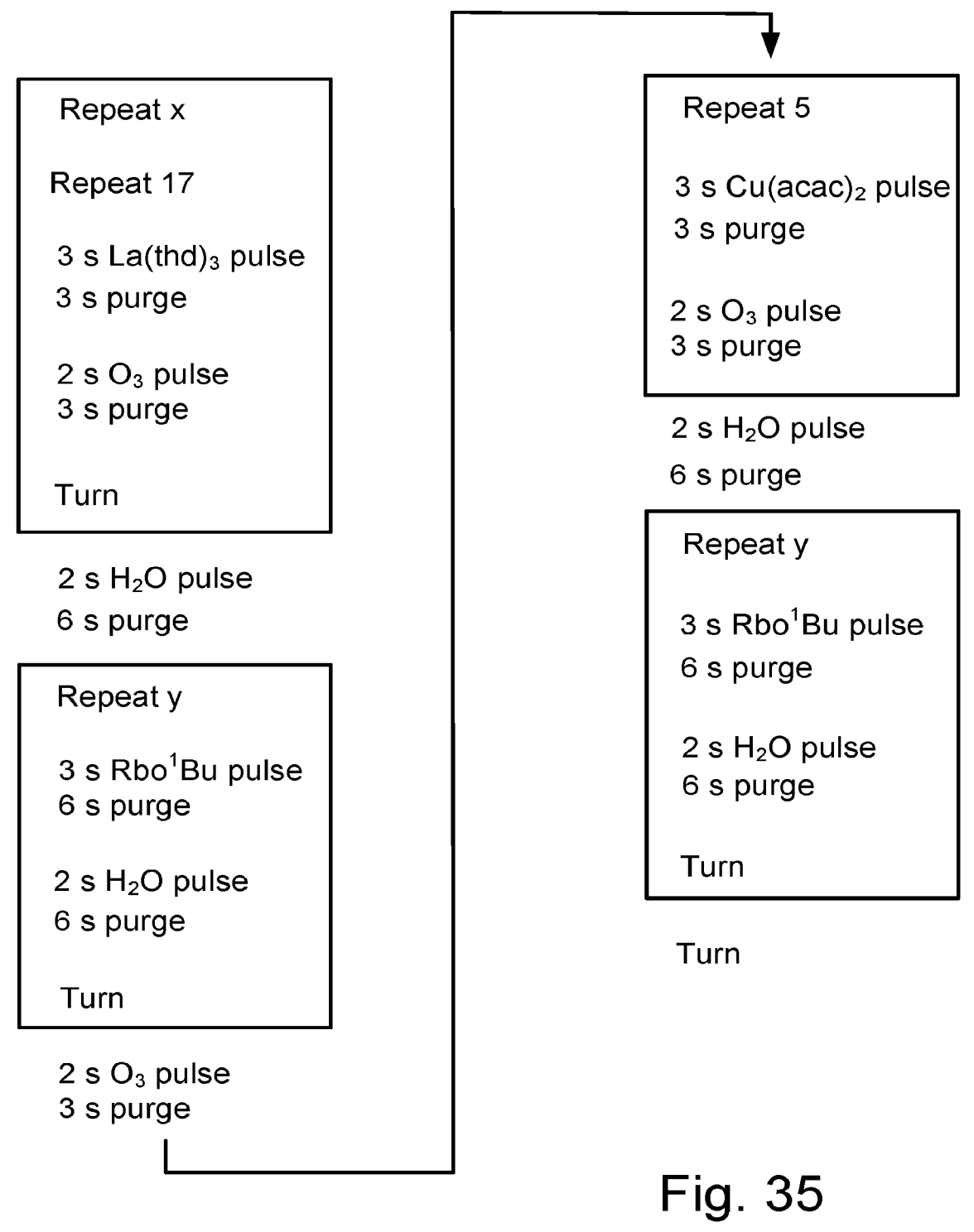

Repeat x

Repeat 17

3 s $La(thd)_3$ pulse
3 s purge 2 s $O_3$ pulse
3 s purge

Turn 2 s $H_2O$ pulse
6 s purge

Repeat y 3 s Rbo[1]Bu pulse
6 s purge 2 s $H_2O$ pulse
6 s purge

Turn 2 s $O_3$ pulse
3 s purge

Repeat 5

3 s $Cu(acac)_2$ pulse
3 s purge 2 s $O_3$ pulse
3 s purge 2 s $H_2O$ pulse
6 s purge Repeat y 3 s Rbo[1]Bu pulse
6 s purge 2 s $H_2O$ pulse
6 s purge Turn Turn

Fig. 35

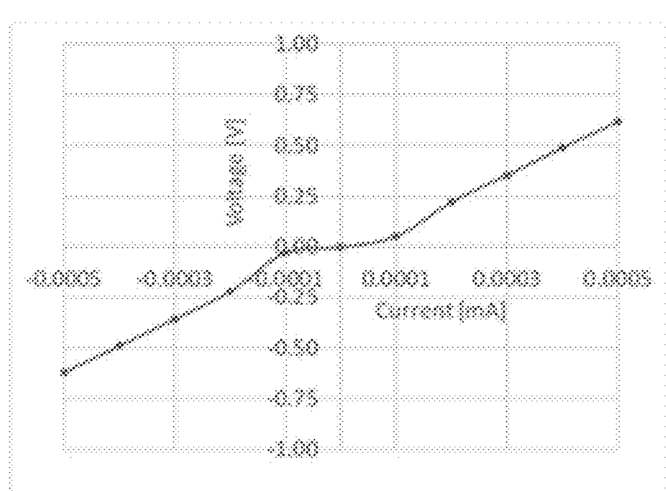
Fig. 38A
0.10
0.05
0.00
-0.05
-0.10
Voltage [V]
-0.150 -0.100 -0.050 0.000 0.050 0.100 0.150
Current [A]
Fig. 38B
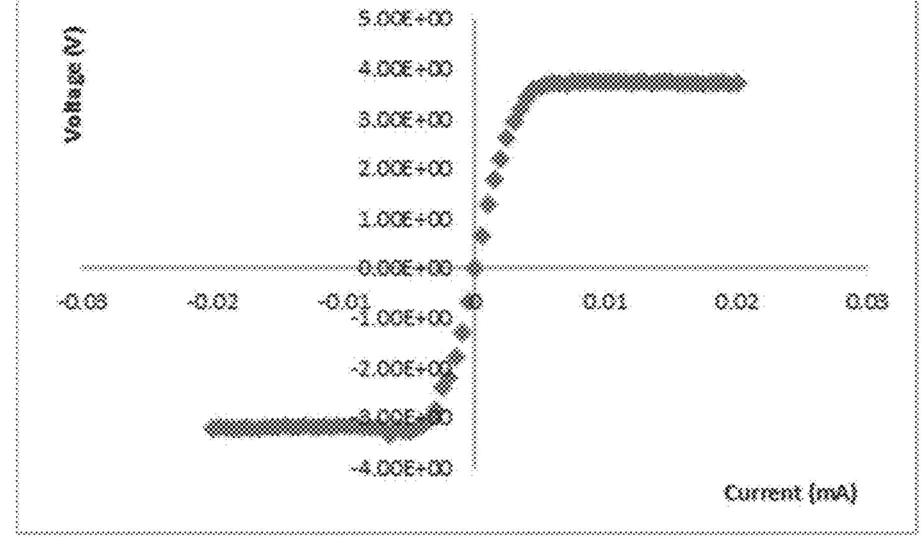
Fig. 38C

SUPERCONDUCTING COMPOUNDS AND METHODS FOR MAKING THE SAME

CLAIM OF PRIORITY

This application is a continuation of U.S. patent application Ser. No. 15/733,204, filed Jun. 10, 2020, which is a 371 of PCT/IB2018/001574, filed Dec. 12, 2018, which claims priority to U.S. Patent Application Ser. No. 62/597,918, filed on Dec. 12, 2017, the contents of which are incorporated here by reference in their entirety.

TECHNICAL FIELD

This disclosure relates to high temperature superconductors, as well as related methods and devices.

BACKGROUND

In 1986, Bednorz and Muller surprised the solid state physics community with their announcement of a new class of superconducting materials having critical temperatures (Tc) significantly higher than those achieved previously [Bednorz, et al., *Z. Phys. B* 64, 189 (1986)]. These materials are ceramics consisting of copper oxide layers separated by buffer cations. In Bednorz and Muller's original compound (LBCO), the buffer cations are lanthanum and barium. Inspired by their work and motivated by his own critical temperature under pressure measurements, Paul Chu synthesized a similar material in which the buffer ions were yttrium and barium. This material was YBCO, the first superconductor with a Tc above the boiling point of liquid nitrogen (77K) [Wu, et al., *Phys. Rev. Lett.* 58, 908 (1987)]. The highest critical temperature reported to date is 203K, obtained for sulfur hydride at a pressure of 90 GPa. [Drozdov et al., Nature 525, 73(2015)]

SUMMARY

This disclosure is based on the unexpected discovery that certain metal oxides containing alkali metal ions in their crystal structures are superconductors at extremely high temperatures (e.g., up to about 550K).

In an aspect, this disclosure features a compound of formula (I):

$$L_nD_m(B_xB'_{1-x})_r(Z_tZ'_{1-t})_qM_pA_y(I), \tag{I}$$

in which n is a number from 0 to 3; m is a number from 0 to 6, x is a number from 0.1 to 1; r is a number from 1 to 8; t is a number from 0 to 1; q is a number from 0 to 6; p is a number from 1 to 7; y is a number from 1 to 20; L includes at least one metal ion selected from the group consisting of transition metal ions and post-transition metal ions; D includes at least one element selected from the group consisting of the elements in Groups IIIA and IVA in the Periodic Table; B includes at least one first alkali metal ion; B' includes at least one first ion selected from the group consisting of alkaline earth metal ions and rare earth metal ions; Z includes at least one second alkali metal ion; Z' includes at least one second ion selected from the group consisting of alkaline earth metal ions and rare earth metal ions; M includes at least one transition metal ion; and A includes at least one anion. The compound of formula (I) is a crystalline compound.

In an aspect, this disclosure features a compound, which is a crystalline metal oxide containing at least one transition metal ion (e.g., Cu ion) and at least one alkaline earth metal ion (e.g., Sr or Ca) or at least one rare earth metal ion in which from 10% to 100% of the at least one alkaline earth metal ion or at least one rare earth metal ion is replaced by an alkali metal ion.

In an aspect, this disclosure features a compound having a crystal structure, in which the crystal structure includes a plurality of cell units; at least 10% of the cell units include a cluster; the cluster includes a plurality of anions, a plurality of transition metal ions, and at least one alkali metal ion; each transition metal ion forms a covalent bond with at least one anion; the plurality of anions define a plane; the at least one alkali metal ion is located approximate to the plane; the distance between the at least one alkali metal ion and the plane is less than twice of the radius of the at least one alkali metal ion; and at least two of the plurality of anions have a distance of from 3.8 Å to 4.2 Å.

In an aspect, this disclosure features a crystalline compound that includes (1) from 1 at % to 30 at % of a first metal ion selected from the group consisting of transition metal ions and post-transition metal ions; (2) from 1 at % to 20 at % of a second metal ion, the second metal ion being an alkali metal ion; (3) from 0 at % to 30 at % of a third metal ion selected from the group consisting of alkaline earth metal ions and rare earth metal ions; (4) from 0 at % to 30 at % of a fourth metal ion selected from the group consisting of alkaline earth metal ions and rare earth metal ions, the fourth metal ion being different from the third metal ion; (5) from 10 at % to 30 at % of a fifth metal ion, the fifth metal ion being a transition metal ion and being different from the first metal ion; (6) from 0 at % to 30 at % of a Group IIIA or IVA element; and (7) from 10 at % to 60 at % of an anion.

In an aspect, this disclosure features a method that includes (1) mixing a crystalline metal oxide with an alkali metal salt containing an alkali metal ion to form a mixture, in which the metal oxide contain at least one transition metal ion and at least one alkaline earth metal ion and the atomic ratio between the alkali metal ion and the at least one alkaline earth metal ion is higher than 1:1; and (2) sintering the mixture at an elevated temperature to form a crystalline compound containing the alkali metal ion.

In an aspect, this disclosure features a device that is superconductive (e.g., exhibiting superconductive properties such as capable of carrying a superconductive current) at a temperature of at least 200K (e.g., at least 273K).

In an aspect, this disclosure features a composition containing the superconducting compound described herein.

In an aspect, this disclosure features a method of forming a superconducting article that includes forming a superconducting metal oxide film on a substrate by atomic layer deposition. The metal oxide film includes ions of an alkali metal and ions of a transition metal, and ions of one or more of an alkaline earth metal and a rare earth metal. The forming includes exposing the substrate to one or more pulses of a reactant including one or more of the alkaline earth metal and the rare earth metal; exposing the substrate to one or more pulses of a reactant including the transition metal; and exposing the substrate to one or more pulses of a reactant including the alkali metal. The method includes annealing the substrate with the metal oxide film formed thereon.

Embodiments can include one or more of the following features.

Forming the metal oxide film on the substrate includes carrying out the atomic layer deposition process at a deposition temperature of between 200° C. and 300° C. Forming the metal oxide film on the substrate includes carrying out the atomic layer deposition process at a reactor pressure of between 1 mBar and 5 mBar. Forming the metal oxide film includes forming a metal oxide film having a thickness of between 30 nm and 1 μm. Annealing the substrate includes annealing the substrate at a temperature of between 600° C. and 700° C. Annealing the substrate includes heating the substrate at a ramp rate of between 1° C./second and 5° C./second, e.g., between 2° C./second and 4° C./second.

Exposing the substrate to one or more pulses of a reactant including the alkaline earth metal or the rare earth metal includes exposing the substrate to between 5 and 25 pulses of the reactant including the alkaline earth metal or the rare earth metal. Exposing the substrate to one or more pulses of a reactant including the alkaline earth metal or the rare earth metal includes providing the reactant including the alkaline earth metal or the rare earth metal at a temperature of between 175° C. and 200° C. Exposing the substrate to one or more pulses of a reactant including the alkali metal includes exposing the substrate to between 1 and 5 pulses of the reactant including the alkali metal. Exposing the substrate to one or more pulses of a reactant including the alkali metal includes providing the reactant including the alkali metal at a temperature of between 150° C. and 200° C. Exposing the substrate to one or more pulses of a reactant including the transition metal includes providing the reactant including the transition metal at a temperature of between 125° C. and 150° C. Exposing the substrate to one or more pulses of a reactant including the transition metal includes exposing the substrate to between 1 and 10 pulses of the reactant including the transition metal. Forming the film includes exposing the substrate to a pulse sequence including one or more pulses of the reactant including the alkaline earth metal and the rare earth metal, followed by one or more pulses of the reactant including the transition metal, followed by one or more pulses of the reactant including the alkali metal, followed by one or more pulses of the reactant including the transition metal.

The alkali metal ions include one or more of Li ions, Na ions, K ions, Rb ions, and Cs ions. The transition metal ions include one or more of Cu ions and Fe ions. Forming the metal oxide film on the substrate includes forming a metal oxide film including La ions, Rb ions, and Cu ions. The metal oxide film has a composition of $(Rb_xLa_{1-x})_2CuO_4$. x is greater than or equal to 0.5.

Forming the metal oxide film on the substrate includes exposing the substrate to one or more pulses of each of $La(thd)_3$, $Cu(acac)_2$, RbO-t-Bu, $H_2O$, and $O_3$. Forming the metal oxide film on the substrate includes exposing the substrate to a pulse sequence including one or more pulses of $La(thd)_3$, followed by one or more pulses of $Cu(acac)_2$, followed by one or more pulses of RbO-t-Bu, followed by one or more pulses of $Cu(acac)_2$.

The method includes exposing the substrate to one or more pulses of ozone. The method includes exposing the substrate to one or more pulses of $H_2O$.

Forming the metal oxide film on the substrate includes forming the metal oxide film at a growth rate of between 0.2 Å/cycle and 3 Å/cycle.

The method includes forming one or more of a diffusion barrier and a buffer layer on the substrate.

Forming a superconducting metal oxide film includes forming crystalline regions including the alkali metal ions.

Forming a superconducting metal oxide film includes forming a metal oxide film having a critical temperature of greater than 250 K.

Forming a superconducting metal oxide film includes forming a metal oxide film in which the alkali metal ions replace at least some of the alkaline earth or rare earth ions, and in which the metal oxide film has a critical temperature at least 50% greater than a critical temperature of a metal oxide film in which alkali ions do not replace the alkaline earth or rare earth ions. The metal oxide film has a critical temperature at least 100% greater than a critical temperature of the metal oxide film in which alkali ions do not replace the alkaline earth or rare earth ions. The metal oxide film includes La ions, Rb ions, and Cu ions and has a critical temperature at least 50% greater than a metal oxide film including La ions and Cu ions and not including Rb ions.

In an aspect, this disclosure features a superconducting article that is formed by a method including forming, on a substrate, a metal oxide film including ions of an alkali metal and ions of a transition metal, and ions of one or more of an alkaline earth metal and a rare earth metal by atomic layer deposition. Forming the metal oxide film includes exposing the substrate to one or more pulses of a reactant including one or more of the alkaline earth metal and the rare earth metal; exposing the substrate to one or more pulses of a reactant including the transition metal; and exposing the substrate to one or more pulses of a reactant including the alkali metal; and annealing the substrate with the metal oxide film formed thereon.

Embodiments can include one or more of the following features.

The substrate includes a semiconductor wafer. The substrate includes a metal substrate. The substrate includes an LaAlO3 substrate.

The metal oxide film has a thickness of between 30 nm and 1 μm.

The alkali metal ions include one or more of Li ions, Na ions, K ions, Rb ions, and Cs ions. The transition metal ions include one or more of Cu ions and Fe ions.

The metal oxide film includes La, Rb, Cu and O. The metal oxide film has a composition of $(Rb_xLa_{1-x})_2CuO_4$. x is greater than or equal to 0.5.

The substrate includes one or more of a diffusion barrier and a buffer layer.

The superconducting metal oxide film having a critical temperature of greater than 250 K.

In the metal oxide film, the alkali metal ions replace at least some of the alkaline earth or rare earth ions, and in which the metal oxide film has a critical temperature at least 50% greater than a critical temperature of a metal oxide film in which alkali ions do not replace the alkaline earth or rare earth ions. The metal oxide film includes La ions, Rb ions, and Cu ions and has a critical temperature at least 50% greater than a metal oxide film including La ions and Cu ions and not including Rb ions. The metal oxide film has a critical temperature at least 100% greater than a critical temperature of the metal oxide film in which alkali ions do not replace the alkaline earth or rare earth ions.

The metal oxide film includes crystalline regions including the alkali metal ions.

From 10% to 100% of the alkaline earth metal ions or rare earth metal ions are replaced in a crystal structure of the metal oxide film by the alkali metal ions.

In an aspect, this disclosure features a method of forming a superconducting article that includes growing a superconducting metal oxide film on a substrate by molecular beam epitaxy (MBE), the metal oxide film including ions of an alkali metal, ions of a transition metal, and ions of an alkaline earth metal or a rare earth metal. The growing of the film includes providing a source of the alkali metal; providing a source of the transition metal; and providing a source of one or more of the alkaline earth metal and a rare earth metal.

Embodiments can include one or more of the following features.

The method includes controlling a ratio between a flow rate of the transition metal and a flow rate of the one or more of the alkaline earth metal and the rare earth metal, in which the ratio between the flow rates affects a ratio of an amount of transition metal ions to an amount of alkaline earth metal or rare earth metal ions in the metal oxide film.

The alkali metal ions include one or more of Li ions, Na ions, K ions, Rb ions, and Cs ions. The transition metal ions include one or more of Cu ions and Fe ions. Forming the metal oxide film on the substrate includes forming a metal oxide film including La ions, Rb ions, and Cu ions. The metal oxide film has a composition of $(Rb_xLa_{1-x})_2CuO_4$. x is greater than or equal to 0.5. Forming the metal oxide film on the substrate includes forming a metal oxide film including Bi ions, Rb ions, Sr ions, and Cu ions. The metal oxide film has a composition of $Bi_2(Rb_xSr_{1-x})_2CuO_{6+\delta}$.

Growing a metal oxide film on a substrate includes maintaining a temperature at a back of the substrate of between 580° C. and 850° C. Growing a metal oxide film on a substrate includes maintaining a temperature at a front of the substrate of between 520° C. and 680° C. Providing a source of the alkali metal includes maintaining a temperature at a base of a Rb source of between 250° C. and 320° C. Providing a source of the alkaline earth metal or the rare earth metal includes maintaining a temperature at a tip of a Rb source of between 280° C. and 350° C. Providing a source of the alkaline earth metal includes maintaining a temperature at a base of a Sr source of between 400° C. and 470° C. Providing a source of the alkaline earth metal includes maintaining a temperature at a tip of a Sr source of between 450° C. and 550° C. Providing a source of the rare earth metal includes maintaining a temperature at a base of a La source of between 1450° C. and 1500° C. Providing a source of the transition metal includes maintaining a temperature at a tip of a Cu source of between 1025° C. and 1035° C. Providing a source of the transition metal includes maintaining a temperature at a base of a Cu source of between 1005° C. and 1015° C.

The method includes forming a capping layer on the metal oxide film. The method includes forming one or more of a diffusion barrier and a buffer layer on the substrate.

Forming a superconducting metal oxide film includes forming crystalline regions including the alkali metal ions.

Forming a superconducting metal oxide film includes forming a metal oxide film having a critical temperature of greater than 40 K. Forming a superconducting metal oxide film includes forming a metal oxide film including Bi ions, Rb ions, Sr ions, and Cu ions with a critical temperature of greater than 60 K. Forming a superconducting metal oxide film includes forming a metal oxide film including La ions, Rb ions, and Cu ions with a critical temperature of greater than 40 K.

In an aspect, this disclosure features a superconducting article formed by a method that includes growing a superconducting metal oxide film on a substrate by molecular beam epitaxy (MBE), the metal oxide film including ions of an alkali metal, ions of a transition metal, and ions of an alkaline earth metal or a rare earth metal. The growing of the film includes providing a source of the alkali metal; providing a source of the transition metal; and providing a source of one or more of the alkaline earth metal and a rare earth metal.

Embodiments can include one or more of the following features.

The substrate includes a semiconductor wafer. The substrate includes a metal substrate.

The alkali metal ions include one or more of Li ions, Na ions, K ions, Rb ions, and Cs ions. The transition metal ions include one or more of Cu ions and Fe ions. The metal oxide film includes La ions, Rb ions, and Cu ions. The metal oxide film has a composition of $(Rb_xLa_{1-x})_2CuO_4$. x is greater than or equal to 0.5.

The superconducting metal oxide film has a critical temperature of at least 40 K. The superconducting metal oxide film includes La ions, Rb ions, and Cu ions and has a critical temperature of at least 40 K. The superconducting metal oxide film includes Bi ions, Rb ions, Sr ions, and Cu ions and has a critical temperature of at least 60 K.

In the metal oxide film, the alkali metal ions replace at least some of the alkaline earth or rare earth ions, and in which the metal oxide film has a critical temperature at least 20% greater than a critical temperature of a metal oxide film in which alkali ions do not replace the alkaline earth or rare earth ions. The metal oxide film includes La ions, Rb ions, Cu ions, and O and has a critical temperature at least 20% greater than a metal oxide film including La ions, Cu ions, and O and not including Rb ions. The metal oxide film includes Bi ions, Rb ions, Sr ions, Cu ions, and O and has a critical temperature at least 50% greater than a metal oxide film including Bi ions, Sr ions, Cu ions, and O and not including Rb ions.

The metal oxide film includes Bi ions, Rb ions, Sr ions, and Cu ions. The metal oxide film has a composition of $Bi_2(Rb_xSr_{1-x})_2CuO_{6+\delta}$.

The metal oxide film includes crystalline regions including the alkali metal ions.

From 10% to 100% of the alkaline earth metal ions or rare earth metal ions are replaced in a crystal structure of the metal oxide film by the alkali metal ions.

The substrate includes one or more of a diffusion barrier and a buffer layer. The superconducting article includes a capping layer formed on the metal oxide film.

In an aspect, this disclosure features an electronic device that includes Josephson junctions that exhibit room temperature superconductivity.

Embodiments can include one or more of the following features.

The electronic device includes superconducting metal oxide film including ions of an alkali metal, ions of a transition metal, and ions of an alkaline earth metal or a rare earth metal. The alkali metal ions include one or more of Li ions, Na ions, K ions, Rb ions, and Cs ions. The transition metal ions include one or more of Cu ions and Fe ions. The metal oxide film has a composition of $(Rb_xLa_{1-x})_2CuO_4$.

The electronic device includes an integrated circuit including a superconducting layer including the Josephson junctions that exhibits room temperature superconductivity. The electronic device includes a cable including a superconducting coating that exhibits room temperature superconductivity.

In an aspect, this disclosure features a superconducting article that includes a substrate; and a superconducting metal oxide film formed on the substrate. The metal oxide film includes ions of an alkali metal, ions of a transition metal, and ions of an alkaline earth metal or a rare earth metal.

Embodiments can include one or more of the following features.

The alkali metal ions include one or more of Li ions, Na ions, K ions, Rb ions, and Cs ions. The transition metal ions include one or more of Cu ions and Fe ions. The metal oxide film has a composition of $(Rb_xLa_{1-x})_2CuO_4$. The metal oxide film includes Bi ions, Rb ions, Sr ions, and Cu ions. The metal oxide film has a composition of $Bi_2(Rb_xSr_{1-x})_2CuO_{6+\delta}$.

The superconducting metal oxide film includes room temperature Josephson junctions. The superconducting metal oxide film has a critical temperature of greater than 200 K. The superconducting metal oxide film has a critical temperature of at least room temperature.

Other features, objects, and advantages will be apparent from the description, drawings, and claims.

DESCRIPTION OF DRAWINGS

FIG. 28 shows an example of a multi-layer structure based on a silicon wafer.

FIG. 29 is an example of a multi-layer structure based on a copper substrate.

FIG. 35 shows pseudocode for a method of forming a high temperature superconductor using atomic layer deposition.

FIGS. 38A-38C are plots showing room temperature I-V characteristics of a Josephson junction formed from a high temperature superconductor material.

DETAILED DESCRIPTION

Figure 1:
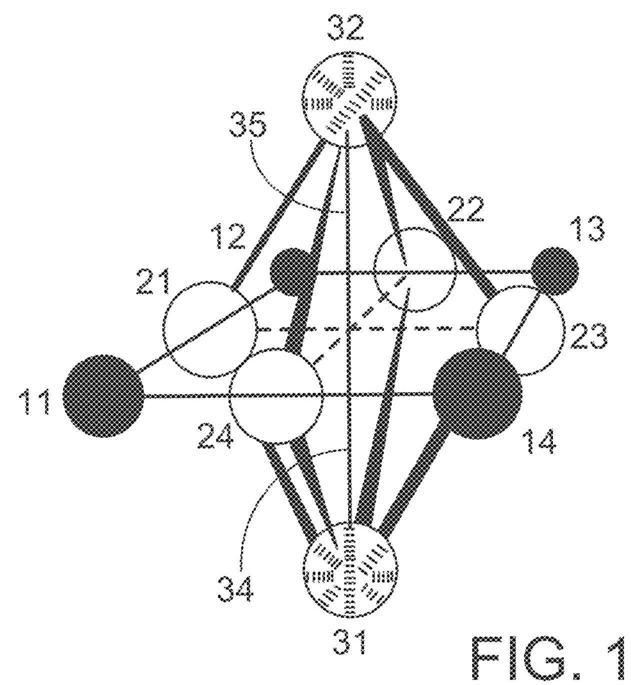
FIG. 1 is a scheme illustrating an octahedral cluster in the crystal structure of a superconducting compound described herein.

This disclosure generally relates to high temperature superconductors (HTS), i.e., compounds exhibiting superconductivity at a high temperature (e.g., from 273K to 550K).

In some embodiments, a high temperature superconductor described herein is a compound of formula (I):

$$L_nD_m(B_xB'_{1-x})_r(Z_tZ'_{1-t})_qM_pA_y(I), \quad \text{(I)}$$

in which n is any number from 0 to 3 (e.g., 0, 1, 2, or 3); m is any number from 0 to 6; x is any number from 0.1 to 1; r is any number from 1 to 8 (e.g., 1, 2, 3, 4, 5, 6, 7, or 8); t is any number from 0 to 1; q is any number from 0 to 6 (e.g., 0, 1, 2, 3, 4, 5, or 6); p is any number from 1 to 7 (e.g., 1, 2, 3, 4, 5, 6, or 7); y is any number from 1 to 20; L includes at least one metal ion selected from the group consisting of transition metal ions and post-transition metal ions; D includes at least one element selected from the group consisting of the elements in Groups IIIA (e.g., B, Al, Ga, In, or Tl) and IVA (e.g., C, Si, Ge, Sn, or Pb) in the Periodic Table; B includes at least one first alkali metal ion; B' includes at least one first ion selected from the group consisting of alkaline earth metal ions and rare earth metal ions; Z includes at least one second alkali metal ion; Z' includes at least one second ion selected from the group consisting of alkaline earth metal ions and rare earth metal ions; M includes at least one transition metal ion; and A includes at least one anion. The compound of formula (I) is a crystalline compound. In some embodiments, the compound of formula (I) is a single phase compound. In some embodiments, the compound of formula (I) is a single crystal compound.

In general, n, m, x, r, t, q, p, and y can be either an integer or a non-integer.

In some embodiments, the first alkali metal ion is different from the second alkali metal ion. In some embodiments, the first alkali metal ion is the same as the second alkali metal ion. In some embodiments, the first ion assigned to B' is different from the second ion assigned to Z'. In some embodiments, the first ion assigned to B' is the same as the second ion assigned to Z'.

In some embodiments, the element assigned to D is different from the metal ion assigned to L. In some embodiment, the element assigned to D is the same as the metal ion assigned to L.

The term "alkali metal ion", as used herein, refers to an ion containing an element selected from group IA of the periodic table, i.e., Li, Na, K, Rb, Cs, and Fr or any combination thereof. In general, the alkali metal ion can have a valence number of +1. In some embodiments, the alkali metal ion can form a molecular cluster having effective electric charge of between +1 and zero. In such embodiments, the molecular cluster can include one or more negative ions in the proximity of an alkali metal ion such that the positive charge on the alkali metal ion is compensated by the negative charge on the negative ion.

The term "alkaline earth metal ion", as used herein, refers to a metal ion having a valence number of +2 and containing an element selected from group IIA of the periodic table, i.e., Be, Mg, Ca, Sr, Ba, Ra or any combination thereof.

The term "transition metal ion", as used herein, refers to a metal ion containing an element selected from Groups IIIB, IVB, VB, VIB, VIIB, VIIIB, IB and IIB of the Periodic Table. In some embodiments, the transition metal mentioned herein can be Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg, or any combination thereof. In some embodiments, the transition metal is Cu. In other embodiments, the transition metal is Fe or Zn.

The term "post-transition metal ion", as used herein, refers to a metal ion containing an element selected from Group IIIA, IVA and VA of the Periodic Table. In some embodiments, the post-transition metal mentioned herein can be Al, Ga, In, Tl, Sn, Pb, Bi, Hg or any combination thereof.

The term "rare earth metal ion", as used herein, refers to a metal ion containing an element selected from scandium (Sc), yttrium (Y), the lanthanide series of metals (having atomic numbers from 57-71) and the actinide series of metals (having atomic numbers from 89-103) in the Periodic Table. Examples of the rare earth metals in the lanthanide series include La, Ce, Pr, Sm, Gd, Eu, Tb, Dy, Er, Tm, Nd, Yb, or any combination thereof. Examples of the rare earth metals in the actinide series include Ac, Th, Pa, U, Np, Pu, Am, Cm, Bk, Cf, Es, Fm, Md, No, Lr, or any combination thereof.

The term "anion", as used herein, can include a simple anion, a halide anion, a chalcogenide anion, an organic anion, an oxoanion, a pnictide anion, or any combination thereof. Examples of simple anions include those containing O, S, Se, Te, N, P, As, or Sb as a single atom. Examples of halide anions include those containing F, Cl, Br, I, At or any combination thereof (such as $IBr^{-3}$, $Cl_2I^{-3}$, $Br_2I^{-3}$ and $I_2Cl^{-3}$). Examples of chalcogenide anions include those containing S, Se, Te or any combination thereof. Examples of organic anions include acetate ($CH_3COO^-$), formate ($HCOO^-$), oxalate ($C_2O_4^{-2}$), cyanide ($CN^-$) or any combination thereof. Examples of oxoanion include $AsO_4^{-3}$, $AsO_3^{-3}$, $CO_3^{-2}$, $HCO_3^-$, $OH^-$, $NO_3^-$, $NO_2^-$, $PO_4^{-3}$, $HPO_4^{-2}$, $SO_4^{-2}$, $HSO_4^-$, $S_2O_3^{-2}$, $SO_3^{-2}$, $ClO_4^-$, $ClO_3^-$, $ClO_2^-$, $OCl^-$, $IO_3^-$, $BrO_3^-$, $OBr^-$, $CrO_4^{-2}$, $Cr_2O_7^{-2}$ or any combination thereof. Examples of pnictide anions include those containing N, P, As, Sb, or any combination thereof. In some embodiments, the anion mentioned herein can be an anion containing any combination of O, S, Se, Te, N, P, As, and Sb.

In some embodiments, the anion mentioned herein can be $NCS^-$, $CN^-$, or $NCO^-$.

In some embodiments, L in formula (I) can include Bi, Tl, Cu, La, or Hg.

In some embodiments, D in formula (I) can include C, Si, Ge, Sn, Pb, or Al.

In some embodiments, B in formula (I) can include Li, Na, K, Rb, or Cs.

In some embodiments, B' in formula (I) can include La, Mg, Ca, Sr, or Ba.

In some embodiments, Z in formula (I) can include Li, Na, K, Rb, or Cs.

In some embodiments, Z' in formula (I) can include Ca or Y.

In some embodiments, M in formula (I) can include Cu or Fe.

In some embodiments, A in formula (I) can include O, S, Se, P, or As.

In some embodiments, the compound presented herein can include crystal structures of multiple compounds of formula (I). In that case, the compound is called a superstructure or an intergrowth.

In some embodiments, the superconducting compounds of formula (I) can be compounds of formula (II):

$$L_nD_m(B_xB'_{1-x})_r(Z_tZ'_{1-t})_q\mathrm{Cu}_p\mathrm{O}_y, \quad \text{(II)}$$

in which n, m, x, r, t, p, q, y, L, D, B, B', Z, and Z' are defined above. In such embodiments, p can be any number from 1 to 3.

In some embodiments, the superconducting compounds of formula (I) can be compounds of formula (III):

$$L_nD_m(B_xB'_{1-x})_r(Z_tZ'_{1-t})_q\mathrm{Cu}_2\mathrm{O}_y, \quad \text{(III)}$$

in which n, m, x, r, t, q, y, L, D, B, B', Z, and Z' are defined above. In such embodiments, q can be any number from 1 to 2 and r can be any number from 2 to 4.

Referring to formula (II), a subset of superconducting compounds are those in which q is 0 or 1 and r is any number between 2 and 6. In such embodiments, L can include Bi, Tl, Cu, Pb, or Hg; n can be between 0 and 4; D can be carbon; m can be any number from 0 to 4; B can include K, Rb, or Cs; B' can include Sr, Ba, Ca and Y; x can be a number from 0.1 to 1; and p can be 1, 2, or 3. Examples of such compound include $Bi_2(K_xSr_{1-x})_2CuO_y$, $Bi_2(Rb_xSr_{1-x})_2CuO_y$, $Bi_2(Cs_xSr_{1-x})_2CuO_y$, $Bi_2C_m(K_xSr_{1-x})_4Cu_2O_y$, $Bi_2C_m(Rb_xSr_{1-x})_4CaCu_2O_y$, $Bi_2C_m(Cs_xSr_{1-x})_4Cu_2O_y$, $Bi_3C_m(K_xSr_{1-x})_4Cu_2O_y$, $Bi_3C_m(Rb_xSr_{1-x})_4Cu_2O_y$, $Bi_3C_m(Cs_xSr_{1-x})_4Cu_2O_y$, $Bi_4C_m(K_xSr_{1-x})_4Cu_2O_y$, $Bi_4C_m(Rb_xSr_{1-x})_4CaCu_2O_y$, $Bi_4C_m(Cs_xSr_{1-x})_4Cu_2O_y$, $Bi_2C_m(K_xSr_{1-x})_6Cu_3O_y$, $Bi_2C_m(Rb_xSr_{1-x})_6Cu_3O_y$, $Bi_2C_m(Cs_xSr_{1-x})_6Cu_3O_y$, $Bi_3C_m(K_xSr_{1-x})_6Cu_3O_y$, $Bi_3C_m(Rb_xSr_{1-x})_6Cu_3O_y$, $Bi_3C_m(Cs_xSr_{1-x})_6Cu_3O_y$, $Bi_2(K_xSr_{1-x})_4(Sr_xCa_{1-x})Cu_3O_y$, $Bi_2(Rb_xSr_{1-x})_4(Sr_xCa_{1-x})Cu_3O_y$, and $Bi_2(Cs_xSr_{1-x})_4(Sr_xCa_{1-x})Cu_3O_y$.

Referring to formula (III), a subset of superconducting compounds are those in which q is 1 and r is 2. In such embodiments, L can include Bi, Tl, Cu, Pb, or Hg; n can be 0, 1, or 2; D can be carbon; m can be any number from 0 to 4; B can include K, Rb, or Cs; B' can include Sr; x can be a number from 0.1 to 1; t can be 0; and Z' can include Ca. Examples of such compound include $Bi_2(K_xSr_{1-x})_2CaCu_2O_y$, $Bi_2(Rb_xSr_{1-x})_2CaCu_2O_y$, $Bi_2(Cs_xSr_{1-x})_2CaCu_2O_y$, $Bi_2C_m(K_xSr_{1-x})_2CaCu_2O_y$, $Bi_2C_m(Rb_xSr_{1-x})_2CaCu_2O_y$, and $Bi_2C_m(Cs_xSr_{1-x})_2CaCu_2O_y$.

Referring to formula (III), another subset of superconducting compounds are those in which q is 1, r is 2, and t is a number greater than 0. In such embodiments, L can include Bi, T1, or Hg; n can be 0, 1, or 2; D can be carbon; m can be any number from 0 to 4; B can include K, Rb, or Cs; B' can include Sr; x can be a number from 0.1 to 1; and Z' can include Ca. Examples of such compounds include $Bi_2(K_xSr_{1-x})_2(K_tCa_{1-t})Cu_2O_y$, $Bi_2(Rb_xSr_{1-x})_2(Rb_tCa_{1-t})Cu_2O_y$, or $Bi_2(Cs_xSr_{1-x})_2(Cs_tCa_{1-t})Cu_2O_y$, $Bi_2C_m(K_xSr_{1-x})_2(K_tCa_{1-t})Cu_2O_y$, $Bi_2C_m(Rb_xSr_{1-x})_2(Rb_tCa_{1-t})Cu_2O_y$, and $Bi_2C_m(Cs_xSr_{1-x})_2(Cs_tCa_{1-t})Cu_2O_y$.

Referring to formula (II), a subset of superconducting compounds are those in which n is 2, m is a number from 0 to 4, r is a number from 2 to 8, q is a number from 0 to 3, p is 4, L is Bi, B is K, Rb, or Cs, B's is Sr, Z is K, Rb, or Cs, and Z' is Ca. Examples of such compounds include $Bi_2(K_xSr_{1-x})_2(K_tCa_{1-t})_3Cu_4O_y$, $Bi_2(Rb_xSr_{1-x})_2(Rb_tCa_{1-t})_3Cu_4O_y$, $Bi_2(Cs_xSr_{1-x})_2(Cs_tCa_{1-t})_3Cu_4O_y$, $BiC_m(K_xSr_{1-x})_8Cu_4O_y$, $BiC_m(Rb_xSr_{1-x})_8Cu_4O_y$, $BiC_m(Cs_xSr_{1-x})_8Cu_4O_y$, $Bi_2C_m(K_xSr_{1-x})_8Cu_4O_y$, $Bi_2C_m(Rb_xSr_{1-x})_8Cu_4O_y$, $Bi_2C_m(Cs_xSr_{1-x})_8Cu_4O_y$, $Bi_3C_m(K_xSr_{1-x})_8Cu_4O_y$, $Bi_3C_m(Rb_xSr_{1-x})_8Cu_4O_y$, $Bi_3C_m(Cs_xSr_{1-x})_8Cu_4O_y$, $Bi_4(K_xSr_{1-x})_4(Sr_tCa_{1-t})_2Cu_4O_y$, $Bi_2(Rb_xSr_{1-x})_4(Sr_tCa_{1-t})_2Cu_4O_y$, and $Bi_2(Cs_xSr_{1-x})_4(Sr_tCa_{1-t})_2Cu_4O_y$.

Referring to formula (II), a subset of superconducting compounds are those in which n is 0, m is a number from 0 to 4, x is 1, t is 1, r is 4, q is 2, p is 4 or 7, B is K, Rb, or Cs, Z is Na. Examples of such compounds include $Na_2K_4Cu_7O_y$, $Na_2Rb_4Cu_7O_y$, $Na_2Cs_4Cu_7O_y$, $Na_2C_mK_4Cu_7O_y$, $Na_2C_mRb_4Cu_7O_y$, $Na_2C_mCs_4Cu_7O_y$, $Na_2C_mK_4Cu_4O_y$, $Na_2C_mRb_4Cu_4O_y$, and $Na_2C_mCs_4Cu_4O_y$.

Referring to formula (II), another subset of superconducting compounds are those in which n is 1, m is a number from 0 to 4, x is 1, t is 0 or 1, r is 2, 4, or 6, q is 0, 1, or 2, p is 1, 2, or 3, L is Hg, B is K, Rb, or Cs, Z is Na, and Z' is Ba. Examples of such compounds include $HgK_2Na_2Cu_3O_y$, $HgK_2CuO_y$, $HgC_mK_4Cu_2O_y$, $HgC_mKbCu_3O_y$, $Hg_2K_2Ba_2Cu_2O_y$, and $Hg_3K_2Rb_2Cs_2Cu_3O_y$.

Referring to formula (II), another subset of superconducting compounds are those in which n is 1, 2, or 3, m is a number from 0 to 4, x is 1, t is 0 or 1, r is 2, 4, or 6, q is 0, 1, 2, 3, or 4, p is 1, 2, 3, 4, or 5, L is Tl, B is K, Rb, or Cs, Z is Na, and Z' is Ba. Examples of such compounds include $TlK_2Na_2Cu_3O_y$, $TlK_2CuO_y$, $TlK_2NaCu_2O_y$, $Tl_2K_2Na_4CusO_y$, $TlC_mK_4Cu_2O_y$, $TlC_mKbCu_3O_y$, $Tl_2K_2Ba_2Cu_2O_y$, and $Tl_3K_2Rb_2Cs_2Cu_3O_y$.

Referring to formula (II), another subset of superconducting compounds are those in which n is 2, m is a number from 0 to 4, x is 1, t is 1, r is 2, 4, or 6, q is 0 or 2, p is 1 or 3, L is Bi, B is K, and Z is Na. Examples of such compounds include $Bi_2K_2Na_2Cu_3O_y$, $Bi_2K_2CuO_y$, $Bi_2C_mKbCu_3O_y$, and $Bi_2C_mK_4CuO_y$.

Referring to formula (II), another subset of superconducting compounds are those in which n is a number from 0 to 1, m is a number from 0 to 1, x is a number from 0.1 to 1, r is 2 or 4, t is a number from 0 to 1, q is 0, 1, or 2, p is 2, 3, or 6, Lis Y, B is K, Rb, or Cs, B' is Sr or Ba, Z is Na, K, Rb, or Cs, and Z' is Y. Examples of such compounds include $Y(K_xBa_{1-x})_2Cu_3O_y$, $Y(Rb_xBa_{1-x})_2Cu_3O_y$, $Y(Cs_xBa_{1-x})_2Cu_3O_y$, $(Y_{1-t}Na_t)(Cs_{1-x}Ba_x)_2Cu_3O_y$, $(Y_{1-t}Na)(Cs_xBa_{1-x})_2Cu_4O_y$, $(Y_{1-t}Na_t)_2(Cs_xBa_{1-x})_4Cu_7O_y$, $Y((CsK)_xBa_{1-x})_2Cu_3O_y$, $(Y_nSr_{1-n})(Cu_{1-m}C_m)(K_xSr_{1-x})_2Cu_2O_y$, $(Y_nSr_{1-n})_xCu_{1-m}C_m)(Rb_xSr_{1-x})_2Cu_2O_y$, $(Y_nSr_{1-n})(Cu_{1-m}C_m)(Cs_xSr_{1-x})_2Cu_2O_y$, and $(Y_nSr_{1-n})(Cu_{1-m}C_m)(Rb_xCs_{1-x})_2Cu_2O_y$.

Referring to formula (II), another subset of superconducting compounds are those in which n is 0 or 1, m is a number from 0 to 1, x is a number from 0 to 1, r is 2 or 4, t is a number from 0 to 1, q is 1, p is 2, 3, 4, 5, or 6, L is Cu, B is K, Rb, or Cs, B' is Ba, and Z is Na. Examples of such compounds include $Na(K_xBa_{1-x})_2Cu_3O_y$, $Na(Rb_xBa_{1-x})_2Cu_3O_y$, $Na(Cs_xBa_{1-x})_2Cu_3O_y$, $Na((CsK)_xBa_{1-x})_2Cu_3O_y$, $NaBa_2Cu_3O_y$, $Na_2Ba_4Cu_7O_y$, $NaBa_2Cu_4O_y$, $(Cu_{1-m}C_m)(K_xSr_{1-x})_2(Na_tSr_{1-t})Cu_2O_y$, $(Cu_{1-m}C_m)(Rb_xSr_{1-x})_2(Na_tSr_{1-t})Cu_2O_y$, $(Cu_{1-m}C_m)(Cs_xSr_{1-x})_2(Na_tSr_{1-t})Cu_2O_y$, $(Cu_{1-m}C_m)(Rb_xCs_{1-x})_2(Na_tSr_{1-t})Cu_2O_y$, $CuC_m(K_xBa_{1-x})_2Cu_pO_y$, $CuC_m(Rb_xBa_{1-x})_2Cu_pO_y$, and $CuC_m(Cs_xBa_{1-x})_2Cu_pO_y$.

In some embodiments, B' is a metal ion having a first atomic number, Z' is a metal ion having a second atomic number, and the second atomic number is smaller than the first atomic number. For example, B' can be a metal ion containing Sr or Ba and Z' can be a metal ion containing Ca.

In some embodiments, x in formula (I) ranges from 0.1 to 1 (e.g., from 0.2 to 1, from 0.3 to 1, from 0.4 to 1, from 0.5 to 1, from 0.55 to 1, from 0.6 to 1, from 0.65 to 1, from 0.7 to 1, from 0.75 to 1, from 0.8 to 1, from 0.85 to 1, from 0.9 to 1, from 0.95 to 1, from 0.97 to 1, from 0.98 to 1, or from 0.99 to 1). In some embodiments, x in formula (I) is 1. Without wishing to be bound by theory, it is believed that increasing the value of x can increase the critical temperature (Tc) of a superconducting compound of formula (I) as an increasing amount of the B' ion (i.e., alkaline earth metal ions or rare earth metal ions) in the crystal structure in the compound of formula (I) is replaced by the B ion (i.e., an alkali metal ion).

In some embodiments, t in formula (I) ranges from 0.1 to 1 (e.g., from 0.2 to 1, from 0.3 to 1, from 0.4 to 1, from 0.5 to 1, from 0.6 to 1, from 0.7 to 1, from 0.8 to 1, from 0.9 to 1, from 0.95 to 1, from 0.98 to 1, or from 0.99 to 1). In some embodiments, t in formula (I) is 1. Without wishing to be bound by theory, it is believed that increasing the value of t (e.g., when t is above 0.5) can increase Tc of a superconducting compound of formula (I) as an increasing amount of the Z' ion (i.e., alkaline earth metal ions or rare earth metal ions) in the crystal structure in the compound of formula (I) is replaced by the Z ion (i.e., an alkali metal ion).

In some embodiments, n in formula (I) can be any number (e.g., an integer or a non-integer) from 0 to 3. For example, n can be any number from 0.1 to 2.9 (e.g., from 0.2 to 2.8, from 0.3 to 2.7, from 0.4 to 2.6, from 0.5 to 2.5, from 0.6 to 2.4, from 0.7 to 2.3, from 0.8 to 2.2, from 0.9 to 2.1, from 1 to 2, from 1.1 to 1.9, from 1.2 to 1.8, from 1.3 to 1.7, from 1.4 to 1.6, or 1.5).

In some embodiments, m in formula (I) can be any number (e.g., an integer or a non-integer) from 0 to 6. For example, n can be any number from 0.1 to 5.9 (e.g., from 0.2 to 5.8, from 0.3 to 5.7, from 0.4 to 5.6, from 0.5 to 5.5, from 0.6 to 5.4, from 0.7 to 5.3, from 0.8 to 5.2, from 0.9 to 5.1, from 1 to 5, from 1.1 to 4.9, from 1.2 to 4.8, from 1.3 to 4.7, from 1.4 to 4.6, from 1.5 to 4.5, from 1.6 to 4.4, from 1.7 to 4.3, from 1.8 to 4.2, from 1.9 to 4.1, from 2 to 4, from 2.1 to 3.9, from 2.2 to 3.8, from 2.3 to 3.7, from 2.4 to 3.6, from 2.5 to 3.5, from 2.6 to 3.4, from 2.7 to 3.3, from 2.8 to 3.2, from 2.9 to 3.1, or 3). In some embodiments, the sum of n and m is an integer.

In some embodiments, r in formula (I) can be any number (e.g., an integer or a non-integer) from 1 to 8. For example, r can be any number from 1.1 to 7.9 (e.g., from 1.2 to 7.8, from 1.3 to 7.7, from 1.4 to 7.6, from 1.5 to 7.5, from 1.6 to 7.4, from 1.7 to 7.3, from 1.8 to 7.2, from 1.9 to 7.1, from 2 to 7, from 2.1 to 6.9, from 2.2 to 6.8, from 2.3 to 6.7, from 2.4 to 6.6, from 2.5 to 6.5, from 2.6 to 6.4, from 2.7 to 6.3, from 2.8 to 6.2, from 2.9 to 6.1, from 3 to 6, from 3.1 to 5.9, from 3.2 to 5.8, from 3.3 to 5.7, from 3.4 to 5.6, from 3.5 to 5.5, from 3.6 to 5.4, from 3.7 to 5.3, from 3.8 to 5.2, from 3.9 to 5.1, from 4 to 5, from 4.1 to 4.9, from 4.2 to 4.8, from 4.3 to 4.7, from 4.4 to 4.6, or 4.5).

In some embodiments, q in formula (I) can be any number (e.g., an integer or a non-integer) from 0 to 6. For example, q can be any number from 0.1 to 5.9 (e.g., from 0.2 to 5.8, from 0.4 to 5.6, from 0.6 to 5.4, from 0.8 to 5.2, from 1 to 5, from 1.2 to 4.8, from 1.4 to 4.6, from 1.6 to 4.4, from 1.8 to 4.2, from 2 to 4, from 2.2 to 3.8, from 2.4 to 3.6, from 2.6 to 3.4, or from 2.8 to 3.2).

In some embodiments, p in formula (I) can be any number (e.g., an integer or a non-integer) from 0 to 7. For example, p can be any number from 0.1 to 6.9 (e.g., from 0.2 to 6.8, from 0.4 to 6.6, from 0.6 to 6.4, from 0.8 to 6.2, from 1 to 6, from 1.2 to 5.8, from 1.4 to 5.6, from 1.6 to 5.4, from 1.8 to 5.2, from 2 to 5, from 2.2 to 4.8, from 2.4 to 4.6, from 2.6 to 4.4, from 2.8 to 4.2, from 3 to 4, from 3.2 to 3.8, from 3.4 to 3.6, or 3.5).

In some embodiments, a superconducting compound described herein is a crystalline metal oxide containing at least one transition metal ion (e.g., a Cu ion) and at least one alkaline earth metal ion (e.g., a Sr or Ba ion) or at least one rare earth metal ion, in which from 10% to 100% of the at least one alkaline earth metal ion or at least one rare earth metal ion (i.e., in the crystal structure) is replaced by an alkali metal ion (e.g., an ion of Li, Na, K, Rb, or Cs). Examples of the crystalline metal oxides before modification include $Bi_2Sr_2CaCu_2O_y$ (Bi2212) and $YBa_2Cu_3O_7$ (YBCO). In some embodiments, the superconducting compound is a crystalline metal oxide described above in which from 20% to 100% (e.g., from 30% to 100%, from 40% to 100%, from 50% to 100%, from 60% to 100%, from 70% to 100%, from 80% to 100%, from 90% to 100%, from 95% to 100%, from 99% to 100%, or 100%) of the at least one alkaline earth metal ion or at least one rare earth metal ion in the crystal structure is replaced by an alkali metal ion. Without wishing to be bound by theory, it is believed that a superconducting metal oxide in which a higher amount (e.g., more than 50%) of an alkaline earth metal ion in its crystal structure is replaced by an alkali metal ion would exhibit a higher Tc based on the model described below.

In some embodiments, the crystalline metal oxide described above can further include a post-transition metal ion (e.g., an ion of Bi or Tl) or a transition metal ion (e.g., a Hg ion), such as those described above. In some embodiments, the crystalline metal oxide described above can include a rare earth metal ion, such as those described above.

In some embodiments, the crystalline metal oxide described above can include two or more (e.g., three or four) alkaline earth metal ions (e.g., Sr, Ba, and/or Ca ions). In such embodiments, only one of the alkaline earth metal ions can be replaced by an alkali metal ion or two or more of the alkaline earth metal ions can be replaced by alkali metal ions.

In some embodiments, when two or more alkaline earth metal ions in a crystalline metal oxide are replaced by two or more alkali metal ions, each of alkaline earth metal ion can be replaced by any one of the two or more alkali metal ions.

In some embodiments, a superconducting compound described herein (e.g., a compound of formula (I)) is a compound having a crystal structure, where the crystal structure includes a plurality of cell units, at least 10% of the cell units include a cluster (e.g., a sub cell unit); the cluster includes a plurality of anions (e.g., O anions), a plurality of transition metal ions (e.g., Cu ions), and at least one alkali metal ion (e.g., ions of Li, Na, K, Rb, and Cs); each transition metal ion forms a covalent bond with at least one anion; the plurality of anions define a plane; the at least one alkali metal ion is located approximate to the plane; the distance between the at least one alkali metal ion and the plane is less than twice of the radius of the at least one alkali metal ion; and at least two of the plurality of anions have a distance of from 3.8 Å to 4.2 Å. In some embodiments, the at least two of the plurality of anions can have a distance of at least 3.8 Å (e.g., at least 3.85 Å, or at least 3.9 Å) and/or at most 4.2 Å (e.g., at most 4.15 Å, at most 4.1 Å, at most 4.05 Å, or at most 4 Å). In some embodiments, at least 20% (e.g., at least 30%, at least 40%, at least 50%, at least 60%, at least 70%, at least 80%, at least 90%, at least 95%, or at least 99%) of the cell units in the crystal structure include the cluster described above (which contains at least one alkali metal ion). In some embodiments, other anions and metal ions described above can be used in addition to the cluster to form a superconducting compound. For example, a charge reservoir layer or a doping mechanism (e.g., interstitial ions) can be included in addition to the cluster to form a superconducting compound.

FIG. 1 illustrates a crystal structure that includes an exemplary cluster (i.e., an octahedral cluster) described above that includes four in-plane ions and two buffer ions (e.g., an alkali metal ion and an alkaline earth metal ion or a transition metal ion). As shown in FIG. 1, the cluster includes anions 21, 22, 23, and 24 (e.g., O anions), transition metal ions 11, 12, 13, and 14 (e.g., Cu ions), and two buffer ions 31 and 32, at least one of which is an alkaline metal ion (e.g., ions of Li, Na, K, Rb, and Cs).

Figure 26:
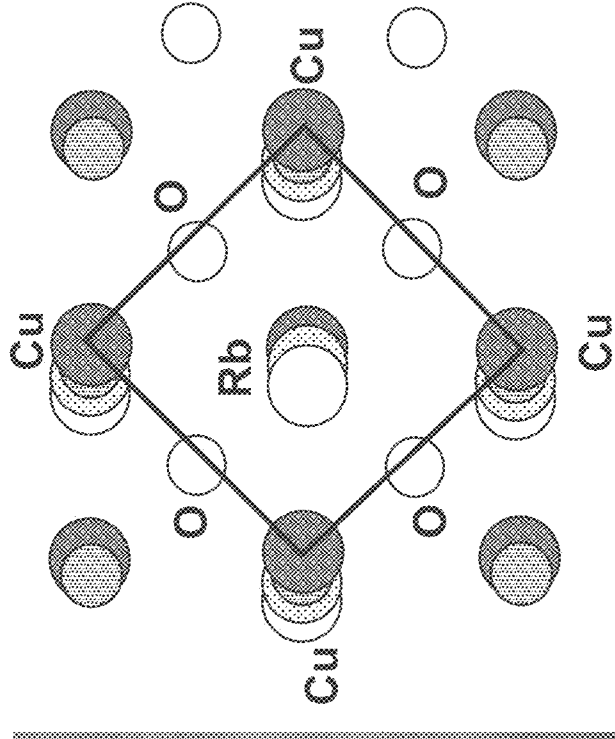
FIG. 26 shows the results of small crystal X-Ray diffraction such as the crystal of FIG. 22A. Left panel: raw data, one of the frames, right panel: atom locations in the crystal.
Figure 26:
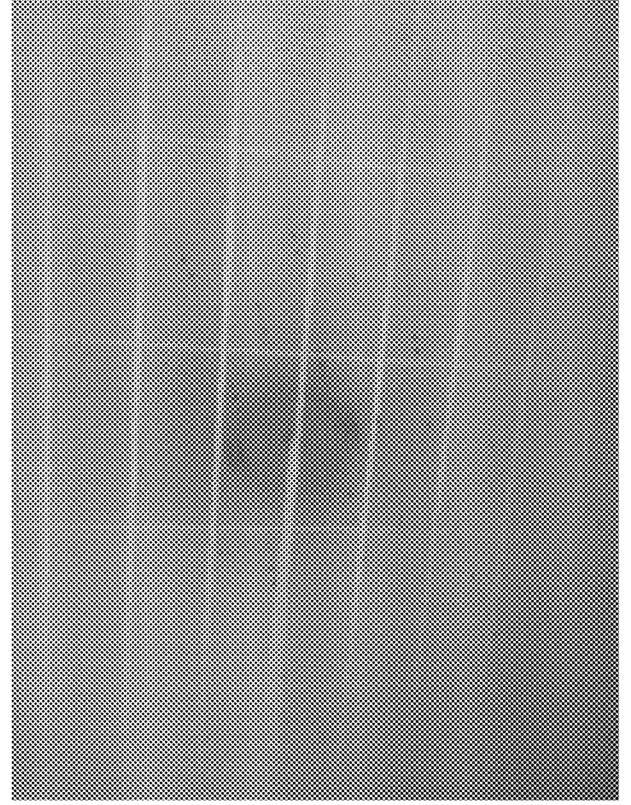

Each of transition metal ions 11, 12, 13, and 14 forms a covalent bond with a neighboring anion. Transition metal ions 11, 12, 13, and 14 and anions 21, 22, 23, and 24 form a plane in which metal ions 11, 12, 13, and 14 are located at the vertices of the plane, and anions 21, 22, 23 and 24 are located at the edges of the plane. The distance 34 or 35 between the buffer ion 31 or 32 and the plane is less than twice of the radius of the buffer ion. In some embodiment, when alkali metal ion 31 is the same as the alkali metal ion 32, the distance 34 is substantially similar to the distance 35. The distance between two anions facing each other (i.e., the distance between anions 21 and 23 or the distance between anions 22 and 24) in the plane is from 3.8 Å to 4.2 Å. In some embodiment, ion 31 is an alkali metal ion and ion 32 is a different ion (e.g., an alkaline earth metal ion or a transition metal ion). An example of such a cluster, containing an alkali metal ion Rb, is identified in the x-ray crystallography as shown in FIG. 26.

In some embodiments, a superconducting compound of formula (I) can include a cluster (e.g., a sub cell unit in the crystal structure of the compound) having a formula of $BZMA_2$ or $BZ'MA_2$, in which B, Z, Z', M, and A are defined above.

Without wishing to be bound by theory, it is believed that the cluster described herein (e.g., a cluster having a structure of $BZMA_2$ or $BZ'MA_2$) is primarily responsible for the high Tc and superconducting activities/properties at a high temperature (e.g., at least about 150K). Thus, without wishing to be bound by theory, it is believed that all crystalline compounds (e.g., metal oxide crystalline compounds) having such a cluster would exhibit high Tc and superconducting activities/properties at a high temperature.

In some embodiments, a superconducting compound described herein includes at least 15% (e.g., at least 20%, at least 25%, at least 30%, at least 35%, at least 40%, at least 45%, at least 50%, at least 55%, at least 60%, at least 65%, at least 70%, at least 75%, at least 80%, at least 85%, at least 90%, at least 95%, at least 98%, at least 99%, or 100%) of cell units that have the cluster described above (e.g., such as that shown in FIG. 1) in its crystal structure. Without wishing to be bound by theory, it is believed that a superconducting compound containing a higher amount (e.g., more than 50%) of the cluster described above would exhibit a higher Tc based on the model described below. In some embodiments, a superconducting compound described herein further contains one or more clusters similar to that shown in FIG. 1 except that the alkali metal ion is replaced by an alkaline earth metal ion (e.g., Ca, Sr, or Ba) or a rare earth metal ion (e.g., La).

In some embodiments, a superconducting compound containing the cluster described above can further include a transition metal ion or a post-transition metal ion, such as the L ion in formula (I). Without wishing to be bound by theory, it is believed that additional anions attached to the L ion can be considered as doping ions for the cluster described above so as to render the plane formed by anions 21, 22, 23, and 24 conducting. Further, without wishing to be bound by theory, it is believed that such a doping effect can facilitate the formation of the superconductivity of the compound.

In some embodiments, the cluster described above can include only two anions, which have a distance of from 3.8 Å to 4.2 Å. In such embodiments, the other metal ions in the cluster can be located at any locations in space so as to keep the two anions at the above distance. Any reference to the plane formed by anions 21, 22, 23, and 24 defined above can now be replaced by the line connecting these two anions. In some embodiments, a superconducting compound having such a cluster (e.g., a sub cell unit in the crystal structure of the compound) can have a formula of $BMA_2$, in which B, M, and A are defined above.

In some embodiments, the superconducting compounds described herein can include (1) from 0 at % to 30 at % of a first metal ion selected from the group consisting of transition metal ions and post-transition metal ions; (2) from 1 at % to 20 at % of a second metal ion, the second metal ion being an alkali metal ion; (3) from 0 at % to 30 at % of a third metal ion selected from the group consisting of alkaline earth metal ions and rare earth metal ions; (4) from 0 at % to 30 at % of a fourth metal ion selected from the group consisting of alkaline earth metal ions and rare earth metal ions, the fourth metal ion being different from the third metal ion; (5) from 10 at % to 30 at % of a fifth metal ion, the fifth metal ion being a transition metal ion and being different from the first metal ion; (6) from 0 at % to 30 at % of a Group IIIA or IVA element; and (7) from 10 at % to 60 at % of an anion. As used herein, the unit "at %" refers to atomic percentage. The transition metal ions, post-transition metal ions, alkali metal ions, alkaline earth metal ions, rare earth metal ions, and anions can be the same as those described above.

In some embodiments, the first metal ion can be at least 1 at % (e.g., at least 2 at %, at least 3 at %, at least 4 at %, at least 5 at %, at least 6 at %, at least 7 at %, at least 8 at %, at least 9 at %, at least 10 at %, at least 11 at %, at least 12 at %, at least 13 at %, at least 14 at %, or at least 15 at %) and/or at most 30 at % (e.g., at most 29 at %, at most 28 at %, at most 27 at %, at most 26 at %, at most 25 at %, at most 24 at %, at most 23 at %, at most 22 at %, at most 21 at %, at most 20 at %, at most 19 at %, at most 18 at %, at most 17 at %, at most 16 at %, or at most 15 at %) of a superconducting compound described herein.

In some embodiments, the second metal ion can be at least 1 at % (e.g., at least 2 at %, at 3 at %, at least 4 at %, at least 5 at %, at least 6 at %, at least 7 at %, at least 8 at %, at least 9 at %, or at least 10 at %) and/or at most 20 at % (e.g., at most 19 at %, at most 18 at %, at most 17 at %, at most 16 at %, at most 15 at %, at most 14 at %, at most 13 at %, at most 12 at %, at most 11 at %, or at most 10 at %) of a superconducting compound described herein.

In some embodiments, each of the third and four metal ions, independently, can be at least 0 at % (e.g., at least 1 at %, at least 2 at %, at least 3 at %, at least 4 at %, at least 5 at %, at least 6 at %, at least 7 at %, at least 8 at %, at least 9 at %, at least 10 at %, at least 11 at %, at least 12 at %, at least 13 at %, at least 14 at %, or at least 15 at %) and/or at most 30 at % (e.g., at most 29 at %, at most 28 at %, at most 27 at %, at most 26 at %, at most 25 at %, at most 24 at %, at most 23 at %, at most 22 at %, at most 21 at %, at most 20 at %, at most 19 at %, at most 18 at %, at most 17 at %, at most 16 at %, or at most 15 at %) of a superconducting compound described herein.

In some embodiments, the fifth metal ion can be at least 10 at % (e.g., at least 11 at %, at least 12 at %, at least 13 at %, at least 14 at %, at least 15 at %, at least 16 at %, at least 17 at %, at least 18 at %, at least 19 at %, or at least 20 at %) and/or at most 30 at % (e.g., at most 29 at %, at most 28 at %, at most 27 at %, at most 26 at %, at most 25 at %, at most 24 at %, at most 23 at %, at most 22 at %, at most 21 at %, or at most 20%) of a superconducting compound described herein.

In some embodiments, the Group IIIA or IVA element can be at least 0 at % (e.g., at least 1 at %, at least 2 at %, at least 3 at %, at least 4 at %, at least 5 at %, at least 6 at %, at least 7 at %, at least 8 at %, at least 9 at %, or at least 10 at %) and/or at most 30 at % (e.g., at most 29 at %, at most 28 at %, at most 27 at %, at most 26 at %, or at most 25 at %, at most 24 at %, at most 23 at %, at most 22 at %, at most 21 at %, or at most 20 at %, at most 19 at %, at most 18 at %, at most 17 at %, at most 16 at %, or at most 15 at %) of a superconducting compound described herein.

In some embodiments, the anion can be at least 10 at % (e.g., at least 11 at %, at least 12 at %, at least 13 at %, at least 14 at %, at least 15 at %, at least 16 at %, at least 17 at %, at least 18 at %, at least 19 at %, at least 20 at %, at least 21 at %, at least 22 at %, at least 23 at %, at least 24 at %, at least 25 at %, at least 26 at %, at least 27 at %, at least 28 at %, at least 29 at %, at least 30 at %, at least 31 at %, at least 32 at %, at least 33 at %, at least 34 at %, or at least 35 at %) and/or at most 60 at % (e.g., at most 59 at %, at most 58 at %, at most 57 at %, at most 56 at %, at most 55 at %, at most 54 at %, at most 53 at %, at most 52 at %, at most 51 at %, at most 50 at %, at most 49 at %, at most 48 at %, at most 47 at %, at most 46 at %, at most 45 at %, at most 44 at %, at most 43 at %, at most 42 at %, at most 41 at %, at most 40 at %, at most 39 at %, at most 38 at %, at most 37 at %, at most 36 at %, or at most 35 at %) of a superconducting compound described herein.

In some embodiments, the superconducting compounds described herein are substantially pure. For example, the superconducting compounds can have a purity of at least 50% (e.g., at least 60%, at least 70%, at least 80%, at least 90%, at least 95%, at least 98%, at least 99%, or 100%).

In general, the compounds described herein can be superconductors (e.g., capable of carrying superconductive current) at a relatively high temperature. In some embodiments, the superconducting compounds described herein can be a superconductor at the temperature of at least 150K (e.g., at least 160K, at least 170K, at least 180K, at least 190K, at least 200K, at least 210K, at least 220K, at least 230K, at least 240K, at least 250K, at least 260K, at least 270K, at least 273K, at least 283K, at least 293K, at least 300K, at least 320K, at least 340K, at least 360K, at least 380K, or at least 400K) and/or at most about 500K (e.g., at most about 480K, at most about 460K, at most about 450K, at most about 440K, at most about 420K, or at most about 400K). In some embodiments, the superconducting compounds described herein can have Tc of at least 150K (e.g., at least 160K, at least 170K, at least 180K, at least 190K, at least 200K, at least 210K, at least 220K, at least 230K, at least 240K, at least 250K, at least 260K, at least 270K, at least 273K, at least 283K, at least 293K, at least 300K, at least 320K, at least 340K, at least 360K, at least 380K, or at least 400K) and/or at most 500K (e.g., at most 480K, at most 460K, at most 450K, at most 440K, at most 420K, or at most 400K). Without wishing to be bound by theory, it is believed that crystalline compounds having the cluster structure described above can exhibit a high Tc based on the model described below.

In some embodiments, this disclosure features a composition containing a superconducting compound described herein. In such embodiments, the composition can contain at least 1% (e.g., at least 2%, at least 3%, at least 5%, at least 10%, at least 20%, at least 30%, at least 40%, or at least 50%) and/or at most about 99.9% (e.g., at most 99%, at most 98%, at most 95%, at most 90%, at most 80%, at most 70%, at most 60%, or at most 50%) of the superconducting compound.

In some embodiments, this disclosure features a method of forming a superconducting compound. The method can include (1) mixing a crystalline metal oxide with an alkali metal salt containing an alkali metal ion (e.g., an ion of Li, Na, K, Rb, or Cs) to form a mixture, in which the metal oxide contains at least one transition metal ion (e.g., a Cu ion) and at least one alkaline earth metal ion (e.g., a Ca, Sr, or Ba ion) and the atomic ratio between the alkali metal ion and the at least one alkaline earth metal ion is higher than 1:1; and (2) sintering the mixture at an elevated temperature to form a crystalline compound containing the alkali metal ion. Suitable crystalline metal oxides that can be used as starting materials to prepare the superconducting compounds described herein include for example Bi2212, YBCO, Bi2223, Tl2212, Tl2223, Hg1201, Hg1212, and Hg1223. Thus, in some embodiments, the superconducting compounds of formula (I) can be prepared by the above manufacturing method using a corresponding metal oxide and a suitable alkali metal salt as starting materials.

In some embodiments, when the superconducting compounds of formula (I) contain an element D, the element D can be introduced into the superconducting compounds by adding a salt (e.g., an alkali metal salt) containing element D in the mixture described in step (1) above. Suitable salts containing element D that can be used to prepare the superconducting compounds described herein include for example $K_2CO_3$, $K_2SiO_3$, $K_2B_4O_7$, $Rb_2CO_3$, $Rb_2SiO_3$, $Cs_2CO_3$, $Cs_2SiO_3$, $KHCO_3$, $RbHCO_3$ or $CsHCO_3$. For example, to prepare the superconducting compounds of formula (I) containing an element D where D is carbon, an alkali metal salt containing carbon (e.g., $K_2CO_3$, $Rb_2CO_3$, or $Cs_2CO_3$) can be used in step (1) described above. In addition the superconducting compounds described herein in which D is carbon can be prepared by sintering a crystalline metal oxide and an alkali metal salt under a flow of $CO_2$ to induce incorporation of carbon in the structure. It is believed that carbon atoms, if imbedded in the crystal structure, can facilitate the incorporation of alkali metal ions in the crystal.

In some embodiments, the atomic ratio (i.e., the molar ratio) between the alkali metal ion in the alkali metal salt and the at least one alkaline earth metal ion in the metal oxide is at least 1.3:1 (e.g., at least 1.5:1, at least 1.7:1, at least 2:1, at least 2.3:1, at least 2.5:1, at least 2.7:1, at least 3:1, at least 4:1, at least 5:1, at least 6:1, at least 7:1, at least 8:1, at least 9:1, at least 10:1, at least 11:1, at least 12:1, at least 13:1, at least 14:1, at least 15:1, or at least 16:1). In some embodiments, when the metal oxide starting material contains two or more alkaline earth metal ions, the atomic ratio described above can be between the alkali metal ion in the alkali metal salt and one of the two or more alkaline earth metal ions in the metal oxide. Without wishing to be bound by theory, it is believed that using an excess amount (e.g., more than 1:1 atomic ratio) of an alkali metal salt in the method described above can facilitate replacement of the alkaline earth metal ion in the crystal structure of the metal oxide compound by the alkali metal ion. Further, without wishing to be bound by theory, it is believed that a superconducting metal oxide containing a higher amount of an alkali metal ion in its crystal structure would exhibit a higher Tc based on the model described below.

In general, the sintering temperature used in the method described can depend on various factors such as the structure of the compound to be synthesized and their melting temperatures. In some embodiments, the sintering temperature is at least 300° C. (e.g., at least 400° C., at least 500° C., at least 600° C., at least 700° C., at least 750° C., or at least 800° C.) and/or at most 1200° C. (e.g., at most 1100° C., at most 1000° C., at most 900° C., at most 850° C., at most 820° C., or at most 800° C.). The sintering time (or the dwelling time) can be at least 20 hours (e.g., at least 30 hours, at least 40 hours, at least 50 hours, at least 100 hours, or at least 150 hours) and/or at most 300 hours (e.g., at most 280 hours, at most 250 hours, at most 220 hours, at most 200 hours, or at most 150 hours).

In some embodiments, the mixture of a crystalline metal oxide and an alkali metal salt can be sintered at a first temperature for a first period of time and then sintered at a second temperature different from the first temperature for a second period time. In some embodiments, the second temperature can be higher than the first temperature. The first or second temperature can be at least 750° C. (e.g., at least 760° C., at least 770° C., at least 780° C., at least 790° C., at least 800° C., or at least 810° C.) and/or at most 850° C. (e.g., at most 840° C., at most 830° C., at most 820° C., at most 810° C., at most 800° C.).

In some embodiments, the disclosure features a method of preparing a superconducting article by using atomic layer deposition. Atomic layer deposition (ALD) is a thin-film deposition method in which a film is grown on a substrate by exposing its surface to alternate gaseous species (typically referred to as precursors). In some embodiments, the method includes forming a layer that includes a crystalline compound containing the alkali metal ion described herein on a substrate (e.g., a semiconductor substrate) by ALD. The ALD can be performed by methods known in the art.

In a typical ALD process, a substrate is exposed to two reactants A and B in a sequential, non-overlapping way. Each reactant reacts with the surface in a self-limited way: the reactant molecules can react only with a finite number of reactive sites on the surface. Once all those sites have been consumed in the reactor, the growth stops. The remaining reactant molecules are flushed away and only then reactant B is inserted into the reactor. By alternating exposures of A and B, a thin film is deposited. Consequently, when describing an ALD process one refers to both dose times (the time a surface is being exposed to a precursor) and purge times (the time left in between doses for the precursor to evacuate the chamber) for each precursor. The dose-purge-dose-purge sequence of a binary ALD process constitutes an ALD cycle. Also, rather than using the concept of growth rate, ALD processes are described in terms of their growth per cycle (GPC).

Layers of a crystalline compound containing the alkali metal ion fabricated by ALD can exhibit room temperature superconductivity, e.g., a critical temperature of greater than 300 K. For instance, such layers can have a critical temperature (a temperature at which the onset of superconducting behavior occurs) of greater than 50 K, e.g., between 50 K and 350 K, e.g., between 70 K and 300 K, between 100 K and 300 K, between 150 K and 300 K, between 200 K and 300 K, between 250 K and 300 K, or greater than 300 K. Superconductivity of a material can be identified by measuring the temperature dependence of the resistivity material. The critical temperature of the onset of superconductivity in a material is the point at which a significant drop in the resistivity occurs (e.g., a transition in a slope of a current-voltage characteristic of the material), followed by a sharp drop in the resistivity as function of temperature. At temperatures below the onset of superconductivity, the material exhibits zero resistivity. Superconductivity of a material can also be identified by measuring the effect of an applied magnetic field on the relationship between resistivity and temperature. Application of a magnetic field to a material degrades superconductivity of the material, causing a decrease in the temperature at which zero resistivity is achieved.

Layers containing a crystalline compound containing alkali metal ions fabricated by ALD can exhibit a significant increase in their critical temperature as compared to layers of equivalent composition but without alkali metal ions. For instance, ALD-deposited layers containing a crystalline compound containing alkali metal ions can exhibit an increase of between 20% and several hundred percent, e.g., up to 200%, in the critical temperature, e.g., at least 20%, at least 30%, at least 40%, at least 50%, at least 60%, at least 70%, at least 80%, at least 90%, at least 100%, at least $1^{25}$%, at least 150%, at least 175%, or at least 200%. As an example, a layer containing a crystalline metal oxide compound including ions of La, Rb, and Cu can have a critical temperature at least 50% greater or at least 100% greater than a layer containing a crystalline metal oxide compound including ions of La and Cu.

In general, the precursors, precursor temperature, deposition chamber temperature, pulsing regime, and other process parameters can be determined empirically.

In some embodiments, ALD can be used to form a layer containing crystalline compound containing the alkali metal ion, in which the alkali metal ion is Rb and the crystalline compound includes La, Rb, Cu, and O. For instance, ALD can be used to form a layer having a target composition of $(La,Rb)_2CuO_x$, e.g., $(Rb_xLa_{1-x})_2CuO_4$ (referred to as LRCO). This composition can be formed by a sequence of pulses of $La(thd)_3$, $Cu(acac)_2$, RbO-t-Bu, $H_2O$, and $O_3$. For instance, the sequence can include between 5 and 25 $La(thd)_3$ pulses, such as 5, 6, 7, 8, 9, 10, 11, 12, 13, 14, 15, 16, 17, 18, 19, or 20 $La(thd)_3$ pulses, of pulse length between about 2 seconds and about 5 seconds, e.g., 2 seconds, 3 seconds, 4 seconds, or 5 seconds. The $La(thd)_3$ can have a temperature of between about 175° C. and about 200° C., e.g., about 175° C., about 180° C., about 185° C., about 190° C., about 195° C., or about 200° C. The sequence can include between 1 and 10 $Cu(acac)_2$ pulses, such as 1, 2, 3, 4, 5, 6, 7, 8, 9, or 10 $Cu(acac)_2$ pulses, of pulse length between about 2 seconds and about 5 seconds, e.g., 2 seconds, 3 seconds, 4 seconds, or 5 seconds. The $Cu(acac)_2$ can have a temperature of between about 125° C. and about 150° C., e.g., about 125° C., about 130° C., about 135° C., about 140° C., about 145° C., or about 150° C. The sequence can include between 1 and 5 RbO-t-Bu pulses, such as 1, 2, 3, 4, or 5 pulses, of pulse length between about 1 second and about 15 seconds, e.g., 1 second, 2 seconds, 3 seconds, 4 seconds, 5 seconds, 6 seconds, 7 seconds, 8 seconds, 9 seconds, 10 seconds, 11 seconds, 12 seconds, 13 seconds, 14 seconds, or 15 seconds. The RbO-t-Bu can have a temperature of between about 150° C. and about 200° C., e.g., about 150° C., about 155° C., about 160° C., about 165° C., about 170° C., about 175° C., about 180° C., about 185° C., about 190° C., about 195° C., or about 200° C. The $H_2O$ and $O_3$ can each have a pulse length of between about 1 second and about 5 seconds, e.g., 1 second, 2 seconds, 3 seconds, 4 seconds, or 5 seconds. Each pulse can be followed by a purge, e.g., a purge of up to 10 seconds, e.g., 1 second, 2 seconds, 3 seconds, 4 seconds, 5 seconds, 6 seconds, 7 seconds, 8 seconds, 9 seconds, or 10 seconds.

The deposition temperature for an ALD process to produce a layer containing crystalline compound containing the alkali metal ion can be between about 200° C. and about 300° C., e.g., about 200° C., about 210° C., about 220° C., about 230° C., about 240° C., about 250° C., about 260° C., about 270° C., about 280° C., about 290° C., or about 300° C. The reactor pressure in the ALD reactor can be between about 1 mbar and about 5 mbar, e.g., about 1 mbar, about 1.5 mbar, about 2 mbar, about 2.5 mbar, about 3 mbar, about 3.5 mbar, about 4 mbar, about 4.5 mbar, or about 5 mbar.

The growth rate of a layer containing crystalline compound containing the alkali metal ion produced by ALD can be between about 0.2 Å/cycle and about 3 Å/cycle. A layer containing crystalline compound containing the alkali metal ion produced by ALD can have a thickness of between about 30 nm and about 1 μm. The refractive index of the layer can be between about 1.5 and about 2.

In some embodiments, the substrate can include a silicon substrate (e.g., a silicon wafer), a copper substrate (e.g., a copper tape or a copper wire), or a stainless steel substrate (e.g., a stainless steel tape or wire). In some embodiments, the substrate is a $LaAlO_3$ (LAO) substrate.

In some embodiments, the method can optionally include forming one or more additional layers between the semiconductor substrate and the layer containing crystalline compound containing the alkali metal ion described herein. For example, the method can include forming one or more buffer layers, such as a layer containing $SrTiO_3$ (STO), a layer containing $LaSrAlO_4$ (LSAO), and/or a layer containing $La_{2-x}Sr_xCuO_4$ (LSCO). The buffer layer can contribute to epitaxial growth of the layer containing the crystalline compound, e.g., promoting crystallinity in the deposited layer. In some embodiments, the method can include forming one or more diffusion barriers and/or buffer layers between the above-mentioned layers or between a layer and the semiconductor substrate. For example, the method can include forming a buffer layer between a LRCO layer and a silicon wafer substrate. Each of these additional buffer or diffusion barriers can be formed by using a Molecular Beam Epitaxy (MBE) method, an Ion Beam Assisted Deposition method, or other methods known in the art. These additional buffer layers and/or diffusion barriers can facilitate the growth the layer containing a crystalline compound containing the alkali metal ion described herein by using atomic layer deposition.

In some embodiments, the method can optionally include a step of forming a layer that has a relatively large thickness and contains a crystalline compound containing the alkali metal ion described herein above the layer formed by the atomic deposition method. For example, the thickness of such a layer can be at least about 1 micron (e.g., at least about 5 microns, at least about 10 microns, or at least about 100 microns) and/or at most about 1 mm (e.g., at most about 1 mm, at most about 500 microns, or at most about 200 microns). Such a layer can be formed by using chemical vapor deposition (CVD), pulsed laser deposition (PLD), or other suitable methods known in the art.

In some embodiments, the ALD deposition can be followed by an anneal. The anneal can be carried out at a temperature of between about 600° C. and about 700° C., e.g., about 600° C., about 625° C., about 650° C., about 675° C., or about 700° C., for a duration of between 10 minutes and several hours, such as 10 hours, e.g., 10 minutes, 15 minutes, 30 minutes, 1 hour, 1.5 hours, 2 hours, 3 hours, 4 hours, 5 hours, 6 hours, 8 hours, 10 hours, or more than 10 hours. The anneal can be carried out in an atmosphere of air or in an inert atmosphere such as nitrogen or argon. The anneal can be carried out at atmospheric pressure or at reduced pressure. In some embodiments, the anneal can be of high energy for a very short time, such as flash lamp annealing or laser assisted annealing.

The anneal can be carried out at a high thermal ramp rate, such as a ramp rate of between 1° C./second and 5° C./second, e.g., a ramp rate of at least 1° C./second, at least 2° C./second, at least 3° C./second, at least 4° C./second, or at least 5° C./second. The anneal can be carried out in a furnace, such as a rapid thermal processing (RTP) furnace, tube furnace, or muffle furnace. The anneal can be carried out on a hot plate, e.g., to heat from the substrate side of the fabricated thin film sample. The anneal following ALD deposition provides thermal energy for the material deposited by ALD to crystallize.

In some embodiments, the disclosure features a method of using molecular beam epitaxy (MBE) to form, on a substrate, such as a ceramic substrate or a semiconductor substrate, a layer containing a crystalline compound containing the alkali metal ion described here. For instance, such a layer containing a crystalline compound containing the alkali metal ion can be a superconducting material. MBE is a method for the epitaxial deposition of thin films, such as single crystalline thin films. A typical MBE process takes place under ultra high vacuum, e.g., a pressure of less than about $10^{-9}$ mbar. Sources of elements to be incorporated into the epitaxial film are heated until the elements sublime into a gas, which condenses onto the surface of a substrate to form an epitaxial film on the substrate.

MBE process parameters, such as the temperature of the sources and the substrate, the pressure, and the process time, can affect outcomes such as the growth rate of the film, the quality (e.g., crystallinity, compositional uniformity, or concentration of impurities) of the film, and the composition of the film. For instance, MBE process parameters can be selected to provide films with a high degree of uniformity and crystallinity and a low concentration of impurities. In general, MBE process parameters can be determined empirically.

In some examples, MBE can be used to form a crystalline metal oxide film containing at least one transition metal ion (e.g., Cu ion) and at least one alkaline earth metal ion (e.g., Sr or Ca) or at least one rare earth metal ion (e.g., La) in which from 10% to 100% of the at least one alkaline earth metal ion or at least one rare earth metal ion is replaced by an alkali metal ion (e.g., Li, Na, K, Rb, Cs, and Fr, or any combination thereof). To form such a film, MBE growth can be carried out using elemental sources for the transition metal along with the alkaline earth metal, the rare earth metal, or both. The flow rate of the transition metal can be adjusted relative to the flow rate of the alkaline earth metal or the rare earth metal, e.g., to control the ratio of the transition metal to the alkaline earth metal or the rare earth metal in the resulting MBE-grown film. For instance, to grow a film having a target composition $(La,Rb)_2CuO_4$, in which the alkali metal (Rb) is incorporated into the crystal structure in sites that would otherwise be occupied by La, the La flow is decreased relative to the Rb flow by varying the respective source temperature, and the substrate temperature (e.g., as measured by thermocouple) can be reduced to between about 580° C. and about 850° C. to enable the Rb to stay on the surface of the substrate. The flow of each element is calibrated by a Quartz Crystal Monitor (QCM). The high temperature MBE processes provide an environment in which the alkali metal is able to diffuse in the forming epitaxial layer and settle into its crystallization sites.

Layers of a crystalline compound containing the alkali metal ion fabricated by MBE can exhibit superconducting behavior, e.g., at high temperatures, such as at least at room temperature. For instance, the crystalline compound containing the alkali metal can have a critical temperature of between about 40 K and 350 K, e.g., between about 50 K and 300 K, between about 60 K and 300 K, between about 70 K and 300 K, between about 80 K and 300 K, between about 90 K and 300 K, between about 100 K and 300 K, between about 125 K and 300 K, between about 150 K and 300 K, between about 175 K and 300 K, between about 200 K and 300 K, between about 225 K and 300 K, between about 250 K and 300 K, between about 275 K, or greater than 300 K.

In some embodiments, layers containing a crystalline compound containing alkali metal ions and fabricated by MBE can exhibit a significant increase in their critical temperature as compared to layers of equivalent composition but without alkali metal ions. For instance, MBE-grown layers containing a crystalline compound containing alkali metal ions can exhibit an increase of between 20% and 50% in the critical temperature, e.g., at least 20%, at least 30%, at least 40%, or at least 50%. As an example, an MBE-grown layer containing a crystalline compound including ions of La, Rb, and Cu can have a critical temperature at least 20% greater than a layer containing a crystalline compound of La, Cu, and O. An MBE-grown layer containing a crystalline compound including ions of Bi, Rb, Sr, and Cu can have a critical temperature at least 50% greater, 70% greater, 80% greater, or 100% greater than a layer containing a crystalline compound of Bi, Sr, and Cu.

The temperature of the substrate in an MBE process can be measured by a thermocouple positioned in the vicinity of the substrate, e.g., behind the substrate; or by a pyrometer positioned in the vicinity of the substrate, e.g., in front of the substrate. The temperature of the substrate as measured by thermocouple can be, e.g., between about 580° C. and about 850° C., e.g., about 580° C., about 590° C., about 600° C., about 610° C., about 620° C., about 630° C., about 640° C., about 650° C., about 660° C., about 670° C., about 680° C., about 690° C., about 700° C., about 710° C., about 720° C., about 730° C., about 740° C., about 750° C., about 760° C., about 770° C., about 780° C., about 790° C., about 800° C., about 810° C., about 820° C., about 830° C., about. 840° C., or about 850° C. The temperature of the substrate as measured by pyrometer can be, e.g., between about 520° C. and about 680° C., e.g., about 520° C., about 530° C., about 540° C., about 550° C., about 560° C., about 570° C., about 580° C., about 590° C., about 600° C., about 610° C., about 620° C., about 630° C., about 640° C., about 650° C., about 660° C., about 670° C., or about 680° C.

The temperature of the source can vary depending on the identity of the source, and can vary by position on the source (e.g., the tip of the source can have a different temperature than the base of the source). For instance, an La source can have a temperature at its base of between about 1450° C. and about 1500° C., e.g., about 1450° C., about 1460° C., about 1470° C., about 1480° C., about 1490° C., or about 1500° C. A Cu source can have a temperature at its tip of between about 1025° C. and about 1035° C., e.g., about 1025° C., about 1026° C., about 1027° C., about 1028° C., about 1029° C., about 1030° C., about 1031° C., about 1032° C., about 1033° C., about 1034° C., or about 1035° C.; and a temperature of between about 1005° C. and about 1015° C. at its base, e.g., about 1005° C., about 1006° C., about 1007° C., about 1008° C., about 1009° C., about 1010° C., about 1011° C., about 1012° C., about 1013° C., 1014° C., or about 1015° C. A Rb source can have a temperature at its tip of between about 280° C. and about 350° C., e.g., about 280° C., about 290° C., about 300° C., about 310° C., about 320° C., about 330° C., about 340° C., or about 350° C.; and a temperature at its base of between about 250° C. and about 320° C., e.g., about 250° C., about 260° C., about 270° C., about 280° C., about 290° C., about 300° C., about 310° C., or about 320° C. A Sr source can have a temperature at its tip of between about 450° C. and about 550° C., e.g., about 450° C., about 460° C., about 470° C., about 480° C., about 490° C., about 500° C., about 510° C., about 520° C., about 530° C., about 540° C., or about 550° C.; and a temperature at its base of between about 400° C. and about 470° C., e.g., about 400° C., about 410° C., about 420° C., about 430° C., about 440° C., about 450° C., about 460° C., or about 470° C. A Bi source can have a temperature at its tip of between about 640° C. and about 660° C., e.g., about 640° C., about 645° C., about 650° C., about 655° C., or about 660° C.; and a temperature at its base of between about 610° C. and about 640° C., e.g., about 610° C., about 620° C., about 630° C., or about 640° C.

The MBE process can be carried out in an atmosphere containing oxygen, e.g., an ozone atmosphere, such that the film grown by MBE can incorporate oxygen. For instance, the MBE process can be carried out in an atmosphere having an ozone pressure on the order of $10^{-6}$ Torr, e.g., 1E-6 Torr, 2E-6 Torr, 3E-6 Torr, 4E-6 Torr, 5E-6 Torr, 6E-6 Torr, 7E-6 Torr, 8E-6 Torr, 9E-6 Torr, or 10E-6 Torr.

In some examples, a buffer layer, a diffusion barrier, or both can be formed between the substrate and the layer containing crystalline compound containing the alkali metal ion. The buffer layer, the diffusion layer, or both can be formed by MBE, e.g., in the same process in which the layer containing crystalline compound containing the alkali metal ion is formed. In some examples, a capping layer can be formed on the layer containing crystalline compound containing the alkali metal ion, e.g., to prevent degradation of or damage to the layer containing crystalline compound containing the alkali metal ion. For instance, the capping layer can be, e.g., LaCuO or LaAlO.

In a specific example, the substrate can be (100) LAO, the buffer layer can be $La_2CuO_4$ deposited by MBE and the layer containing crystalline compound containing the alkali metal ion can have a target composition of $(La,Rb)_2CuO_4$ deposited by MBE. For instance, the $(La,Rb)_2CuO_4$ can be a superconducting layer at certain temperatures. In another specific example, the substrate can be (100) $SrTiO_3$ (STO), and the layer containing crystalline compound containing the alkali metal ion can have a target composition of $(La,Rb)_2CuO_4$ deposited by MBE. In another specific example, the substrate can be (100) STO and the layer containing crystalline compound containing the alkali metal ion can have a target composition of $Bi_2(Rb,Sr)_2CuO_{6+\delta}$.

In some embodiments, the substrate can be pre-treated prior to MBE deposition. For instance, the substrate can be preheated, e.g., to a temperature of between 1000° C. and 1500° C., e.g., by heating with quartz lamps. In some embodiments, a film, such as a conductive film, e.g., a metal film, e.g., a platinum film, can be deposited on a back side of the substrate prior to MBE film growth.

In some embodiments, the superconducting article can be treated following MBE deposition, e.g., in an anneal in oxygen, ozone, or an inert gas atmosphere; or a vacuum treatment.

FIG. 28 illustrates an example of a multi-layer superconducting article based on a silicon wafer. Such superconducting articles based on a silicon wafer can be used as a superconducting magnet or as a wafer for the electronics industry.

FIG. 29 illustrates an example of a multi-layer superconducting article based on a copper substrate. The MBE layers are optional. The buffer layer can be deposited by Ion Beam Assisted Deposition or any other suitable methods. Such superconducting articles based on a copper substrate can be used as a superconducting cable or magnet.

In some embodiments, the superconducting articles formed the above methods can be used as cables or components in electrical transmission lines, MRI magnets, SMES for solar fields, electric motors (such as elevator motors or ship motors), and electric cars. In some embodiments, the superconducting articles formed the above methods can be used as magnets in magnetic levitation applications such as maglev trains and cars.

In some embodiments, a layer containing crystalline compound containing the alkali metal ion can include Josephson junctions that exhibit room temperature superconductivity. A Josephson junction is a junction at a boundary between adjacent grains of the superconducting crystalline compound. The layer containing the crystalline compound can be incorporated into an electronic device, such as an integrated circuit, to form an electronic device including Josephson junctions that exhibit room temperature superconductivity. In some examples, the layer containing the crystalline compound can be deposited or grown on a substrate, e.g., by ALD or MBE, and patterned using photolithographic processing to form superconducting lines of an integrated circuit. In some examples, the layer containing the crystalline compound can be deposited or grown on a tape, such as a copper tape, to form a room temperature superconducting coating of a cable.

Figure 30A:
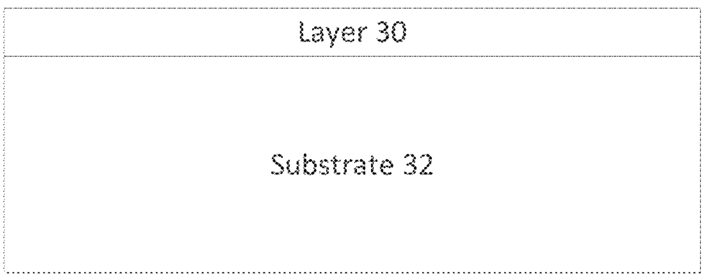
FIGS. 30A and 30B show an example of an integrated circuit having superconducting lines.
Figure 30B:
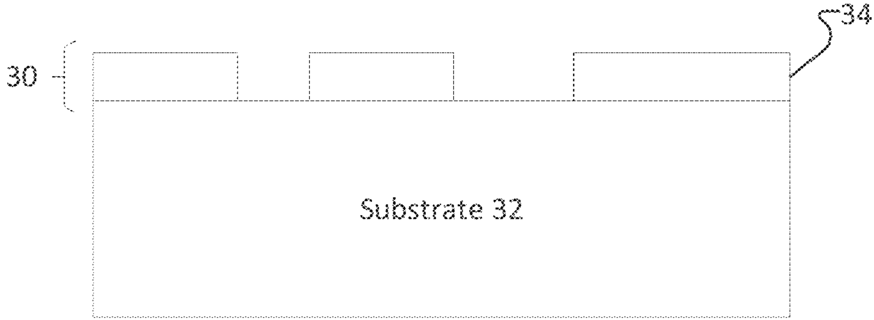

FIGS. 30A and 30B depict an example process for forming an integrated circuit having superconducting lines. Referring to FIG. 30A, a layer 30 containing a crystalline compound containing alkali metal ions is deposited or grown onto a substrate 32, such as a semiconductor substrate, e.g., a silicon wafer, a germanium wafer, a gallium arsenide wafer. The layer 30 includes Josephson junctions and exhibits room temperature superconductivity. Referring to FIG. 30B, the layer 30 is patterned to form superconducting lines 34. For instance, the layer 30 can be patterned by defining a pattern using photolithography and forming the pattern by etching.

Figure 31:
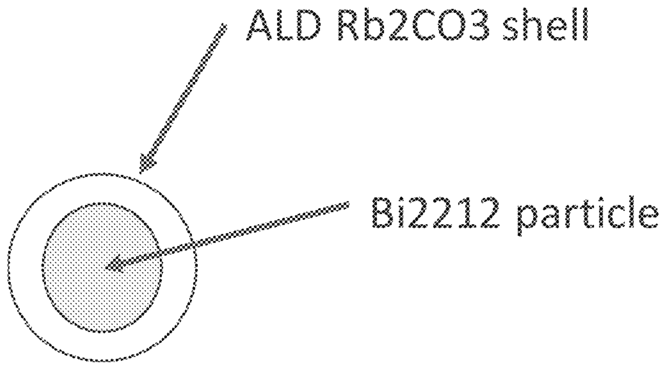
FIG. 31 is a powder particle coated by a $Rb_2CO_3$ shell using atomic layer deposition.

In some embodiments, this disclosure features a method of forming a superconducting powder. The method can include (1) forming a layer comprising an alkali metal salt or an alkali metal oxide on a particle comprising a crystalline metal oxide (e.g., $Bi_2Sr_2CaCu_2O_y$) by using atomic layer deposition; and (2) sintering the particles at an elevated temperature (such as those described above) to form a powder comprising a crystalline compound containing the alkali metal ion. In some embodiments, the layer can include an alkali metal carbonate, an alkali metal nitrate, or an alkali metal oxide. For example, the layer can include a salt of rubidium (e.g., $Rb_2CO_3$). FIG. 31 illustrates an exemplary powder particle coated by an $Rb_2CO_3$ shell using atomic layer deposition.

One problem that is facing with solid state synthesis is the high proximity needed (at the nanometer level) between the reaction ingredients. Using the atomic layer deposition method, an alkali metal-containing shell can be deposited on top of micron-size precursor powder particles or precursor nanoparticles. This process can then be followed by solid state processes, such as sintering and/or pressing as explained above.

In some embodiments, this disclosure features a device that is superconductive (e.g., exhibiting superconductive properties such as capable of carrying a superconductive current) at a temperature of at least 150K (e.g., at least 180K, at least 200K, at least 230 K, at least 250K, at least 273K, at least 278K, at least 283K, at least 288K, at least 293K, at least 298K, at least 300K, at least 305K, or at least 310K). Exemplary devices include cables, magnets, levitation devices, superconducting quantum interference devices (SQUIDs), bolometers, thin film devices, motors, generators, current limiters, superconducting magnetic energy storage (SMES) devices, quantum computers, communication devices, rapid single flux quantum devices, magnetic confinement fusion reactors, beam steering and confinement magnets (such as those used in particle accelerators), RF and microwave filters, and particle detectors.

Without wishing to be bound by theory, the inventor believes that the high temperature superconducting compounds and methods of making such compounds are based on the principles and model described in more detail below.

It is believed that superconductive behavior of charge carriers arises as a result of nearly degenerate dispersion relation $\varepsilon(k)$ of a material, at proximity to the Fermi level thereof. Accordingly, the complete many-body Hamiltonian is simplified to a residual Hamiltonian, formally similar to the reduced Hamiltonian postulated by the well-known BCS model [Bardeen, et. al., *Phys. Rev.* 108, 1175 (1957)], while maintaining a connection between prediction of superconducting behavior and electronic and chemical structure of a corresponding material composition through the Schrodinger equation. More specifically, the nearly degenerate dispersion relation may be a result of little overlap between electronic states. This allows prediction of superconducting behavior as a result of calculation of electronic states in small atomic clusters providing reasonable accuracy of meV (mili electron Volt).

Thus, it is believed that materials suspected as providing superconducting behavior may be identified by the use of energy state computation for energies of at least two electronic states associated with a corresponding atomic cluster. Such an atomic cluster generally includes a plurality of atoms of at least one candidate element/species being neutral atoms, cations and anions. The calculation utilizes geometrical characterization of the atomic structure including distances between the elements of the cluster. It should be noted that the computation may generally include variation of one or more distances and which may imply that certain atoms of the cluster are to be replaced with others. The frontier molecular orbitals of the cluster should be identified by the appropriate calculation and such frontier molecular orbitals having relatively low overlap may be detected. The frontier molecular orbitals generally relate to Highest Occupied Molecular Orbital (HOMO) and the Lowest Unoccupied Molecular Orbital (LUMO).

Additionally, the band structure of a similar superconducting compound can be calculated to provide an estimation of the corresponding Fermi level. The atomic cluster may be varied to provide that the Fermi level lays in proximity with the energetic level of the identified low overlap frontier molecular orbitals.

The compound described by the calculated atomic cluster may be determined as having high probability to exhibit superconducting behavior if the selected low overlap frontier molecular orbital show that bonding and anti-bonding energies are different by less than about 150 meV (e.g., less than 100 meV, or preferably less than 50 meV) and/or more than 1 meV (e.g., more than 5 meV or more than 10 meV). Usually such atomic clusters have high separation between adjacent energy levels. It is believed that one should look for such cases where the highest levels of the cluster, preferably the ground state and the first excited state are intrinsically nearly degenerate.

In some embodiments, the inventor believes that the following analysis provides a basis for identifying a superconducting material and a method of making such a superconducting material.

Starting with a full Hamiltonian expression including the kinetic energy, the phonon part, the electron-phonon interaction and the electron-electron interaction:

$$H = \varepsilon_0 \sum_k c_k^\dagger c_k + \sum_k (\varepsilon_k - \varepsilon_0) c_k^\dagger c_k + \sum_q \omega_q \left( a_q^\dagger a_q + \frac{1}{2} \right) + \sum_{q,k} M_q c_{k+q}^\dagger c_k \left( a_q^\dagger + a_{-q} \right) + \sum_{q,k,k'} v(q) c_{k+q}^\dagger c_{k'+q}^\dagger c_{k'} c_k \tag{1}$$

where $\varepsilon_0=\mu$ is the chemical potential (to be determined); $\varepsilon_k$ is the normal quasiparticle energy;

$$c_k^\dagger$$

and $c_k$ are electronic creation and destruction operators respectively;

$$a_q^\dagger$$

and $a_q$ are phononic creation and destruction operators respectively; $\omega_q$ is the phonon frequency, $M_q$ is an electron-phonon matrix element and v(q) is a screened Coulombic potential. The Hamiltonian of equation (1) is simplified utilizing the standing wave assumption:

$$\nabla_k \varepsilon = 0 \tag{2}$$

This assumption states that all of the electronic k states are degenerate, i.e. having similar energy. Additionally, based on the assumption that the second term in equation (1) is a small perturbation, the following transformation introduces renormalized phonon operators:

$$A_q = a_q + \frac{M_q^*}{\omega_q} \sum_k c_{k-q}^+ c_k \tag{3}$$

Using the standing wave assumption for electronic density operator provides:

$$\rho_1(q,t) = \sum_k c_{k-q}^+(t) c_k(t) = \sum_k c_{k-q}^+ e^{\frac{i}{\hbar}\varepsilon_0 t} c_k e^{-\frac{i}{\hbar}\varepsilon_0 t} = \rho_1(q) \tag{4}$$

and similarly the square density operator:

$$\rho_2(q,t) = \sum_{k,k'} c_{k-q}^+(t) c_{k'+q}^+(t) c_{k'}(t) c_k(t) = \rho_2(q) \tag{5}$$

indicating that the electronic density $\rho_1(q)$ is a constant of the motion and that $A_q$ retains the canonical relations (boson commutation relations):

$$\left[A_q, A_q^+\right] = \delta_{q,q'}, \left[A_q^+, A_{q'}^+\right] = 0 = \left[A_q, A_{q'}\right] \tag{6}$$

The renormalized phonon density expression provides:

$$\sum_q \omega_q A_q^+ A_q = \sum_q \omega_q a_q^+ a_q + \sum_q M_q \left(a_q + a_{-q}^+\right) \sum_k c_{k+q}^+ c_k + + \frac{|M_q|^2}{\omega_q} \left( \sum_k c_{k-q}^+ c_k \right) \left( \sum_{k'} c_{k'+q}^+ c_{k'} \right) \tag{7}$$

using $M_{-q}^*=M_q$ and rearranged the summation order.

Using the renormalized phonon operator in the Hamiltonian of equation (1), the Hamiltonian can be diagonalized under the standing wave condition of equation (2) while neglecting the kinetic energy term as a perturbation:

$$H_0 = \varepsilon_0 N + \sum_q \omega_q\left(A_q^+ A_q + \frac{1}{2}\right) + \sum_q \left(v(q) - \frac{|M_q|^2}{\omega_q}\right)\rho_2(q) \tag{8}$$

This provides pairing correlation $\rho_2(q)$ as a result of the standing wave assumption (2) and canonical transformation (3).

The kinetic energy term can be treated as a perturbation $$H_1 = \sum_k (\varepsilon_k - \varepsilon_0) c_k^+ c_k \tag{9}$$

i.e. $H = H_0 + H_1$. After diagonalizing the standing waves Hamiltonian $H_0$, the electronic residue remains in the equation:

$$H_e = \sum_k (\varepsilon_k - \varepsilon_0) c_k^+ c_k + \sum_q \left(v(q) - \frac{|M_q|^2}{\omega_q}\right)\rho_2(q) \tag{10}$$

in resemblance to the well known reduced BCS Hamiltonian [Bardeen, et al., *Phys. Rev.* 108, 1175 (1957)]. The anticipated quasi-particle interactions with the phonons and among themselves are neglected in the low quasi-particle density (low temperature) limit. Following BCS, these interactions can be considered to be similar as in the normal state. It should be noted that no pairing is assumed. It arises from the assumption of standing wave behavior.

Based on the BCS theory, $$\left\langle \Psi \middle| H_e - \mu N - \sum\nolimits_q \lambda_q \rho_2(q) \middle| \Psi \right\rangle = \sum\nolimits_k 2\varepsilon_k |v_k|^2 + \sum\nolimits_q \left(v(q) - \frac{|M_q|^2}{\omega_q} - \lambda_q\right)\rho_2(q) \tag{11}$$

where $\lambda_q$ is a Lagrange multiplier relating to the constraint of constant square density:

$$\frac{\partial}{\partial t}\rho_2(q) = 0 \tag{12}$$

Equation (11) derives an energy gap, which is formally similar to that predicted by BCS:

$$\Delta_k = \frac{1}{2}\sum_{k'} (V_{kk'} - \lambda_q)\frac{\Delta_{k'}}{E_{k'}} \quad E_k = \sqrt{\xi_k^2 + \Delta_k^2} \tag{13}$$

The BCS theory is therefore found to be embedded in the standing wave theory. The ground state is found to be a condensate of non-dispersing standing electronic wave functions. The excited states are dispersive quasi-particle electronic states (bogolons). It also should be noted that the electronic operators $c^+$ and $c$ in equation (9) are understood as perturbed standing wave states.

Additionally, the electrodynamics of superconducting materials can be derived from the London equations. According to the present disclosure, the London equations may provide microscopic relation between standing wave electrons and the vector potential, without requiring the rigidity of the many-body wave function.

One can start with the single standing wave electron function:

$$\phi_\alpha(r, t) = \frac{1}{\sqrt{2}}\varphi(r)\left(e^{i\alpha(r)} + e^{-i\alpha(r)}\right)e^{\frac{i}{\hbar}\varepsilon t} \tag{14}$$

and utilize the calculation below, while not requiring pairing, to derive the London equations. Since electron pairs are generally favored energetically, as appears from the diagonalized Hamiltonian $H_0$, a single pair wave function can be obtained. This can preserve the 2e charge observed experimentally. The superconducting standing wave states at T=0, provided by an electron pair thus provides:

$$\psi(r_1, r_2, t) = C\phi(r_1, t)\phi(r_2, t)|\uparrow\downarrow\rangle \tag{15}$$

where C is any complex constant, $|\uparrow\downarrow\rangle$ denotes a singlet state, and $\phi(r,t)$ is a standing wave function given by equation (14). The spatial part of $\phi(r,t)$ is a real function with respect to a vector potential in the London Gauge, i.e., assuming $\nabla \cdot A = 0$, $A\perp = 0$ at the surface of an isolated body. The corresponding probability current is:

$$J(r, t) = \mathrm{Re}\left[\psi^*\left(\frac{\hbar}{im}\nabla - \frac{q}{mc}A\right)\psi\right] \tag{16}$$

where J(r,t) is the current density as a function of location (r) and time (t), Re states that the real part of the formula is considered, $\Psi$ and $\Psi^*$ are the electron pair wave function and its conjugate, m is the electron mass, q is the electron charge, $\hbar$ is Planck's constant divided by $2\pi$, and i=square root of (−1). Equation (16) can be expanded to provide:

$$\psi^*\frac{\hbar}{im}\nabla\psi = CC^*\frac{\hbar}{im}\phi(r_1, t)\phi(r_2, t)[\nabla_1\phi(r_1, t)\phi(r_2, t) + \phi(r_1, t)\nabla_2\phi(r_2, t)] \tag{17}$$

such that $$\mathrm{Re}\left[\psi^*\frac{\hbar}{im}\nabla\psi\right] = 0 \tag{18}$$

and $$J(r, t) = -\frac{q}{mc}A|\psi|^2 \tag{19}$$

The above provides that London equations appear as a single particle microscopic property. It is a linear relation between the probability current of each superconducting pair and the vector potential. Thus, all electron pairs obey the London equations individually. The total current is given by a summation over these states. Therefore, the relation between the total electric current and the vector potential is given by the well-known non-local Pippard integral, giving the macroscopic London equations. Additionally, it should be noted that derivation of the London equations requires no assumption on macroscopic coherence of any kind. It should also be noted that the same derivation applies to a single standing wave electron. The pairing is not required to derive the London relation, it is a result (by means of ρ2) of the same standing wave assumption.

The Pippard integral now appears as a summation over standing wave states. A summation carried over the single electron probability currents to get the total current Therefore, the coherence length is the reciprocal of the k-state summation appearing in ρ2 giving the non-local length scale over which the relation between the current and the vector potential is maintained. Due to Pippard, the coherence length gives an estimation of the critical temperature. Therefore, the k-space extension of the flat band region at the Fermi level gives an estimate of the critical temperature. A more accurate estimation of the critical temperature will be given by estimating the low dispersive volume in k-space at the proximity of the Fermi level. This will determine the parameter ρ2 and therefore A and therefore Tc.

As additional potentials should be related to the London potential by a gauge transformation: A•=A+∇χ, where χ(r) may be any scalar function. The corresponding transformation of the wave function is then:

$$\psi' = \psi e^{i\frac{q}{\hbar c}\chi(r)} \tag{20}$$

and the current density is $$J(r,t) = \mathrm{Re}\left[\psi'^{*}(r,t)\left(\frac{\hbar}{im}\nabla - \frac{q}{mc}A'(r,t)\right)\psi'(r,t)\right] = \frac{q}{mc}\nabla\chi(r)|\psi'|^2 - \frac{q}{mc}\nabla\chi(r)|\chi'|^2 - \frac{q}{mc}A(r,t)|\psi'|^2 \tag{21}$$

providing again:

$$J(r,t) = -\frac{q}{mc}A(r,t)|\psi|^2 \tag{22}$$

Thus, the present disclosure provides that the rigidity of the many-body wave function, which is maintained by the energy gap according to the BCS treatment, is replaced by a single-body relation that is the property of any real wave function in the London gauge. Thus, the long range coherence, explained as the phase rigidity of the order parameter, can now be understood as merely reflecting this single-electron behavior.

Without wishing to be bound by theory, it is believed that the standing waves theory provides a simple understanding of the gauge symmetry breaking observed in superconductors. This broken symmetry may arise from breaking of the periodic boundary conditions for the electronic wave function in the normal state, allowing for arbitrary phase of the wave function. The standing wave boundary condition is generally driven from the bulk, by the relaxation of the phonon cloud (or other boson for that matter) against a standing electronic wave function (eq. 3-8). This is the proposed physical understanding of gauge symmetry breaking in the case of superconductivity. Grain boundaries and other defects may only assist superconductivity by supporting these standing wave states.

The single electronic current in the standing waves treatment is not divergence free and can be described as:

$$\nabla \cdot J(r,t) = -\frac{q}{mc}A(r,t)\cdot\nabla|\psi(r,t)|^2 \tag{23}$$

being in accordance with a BCS-like ground state where standing wave pair states are constantly created and destroyed. Again, J(r,t) here is the probability current of a single pair, while the total current is assumed to provide:

$$\nabla \cdot J_{total} + \frac{d\rho}{dt} = 0 \tag{24}$$

Utilizing again the assumption of zero dispersion:

$$\frac{d\rho}{dt} = \frac{d}{dt}\sum_{q}\rho_q = \frac{d}{dt}\sum_{k,q}c^{+}_{k+q}(t)c_k(t) = \frac{d}{dt}\sum_{k,q}c^{+}_{k+q}e^{\frac{-i}{\hbar}\varepsilon_0 t}c_k e^{\frac{i}{\hbar}\varepsilon_0 t} = 0 \tag{25}$$

provides that the total current in an isolated body is divergence-free.

From equation (23), it is shown that in a superconductor, the surface current should be divergence free, requiring that the wave function ∇||ψ(r,t)|=0 is null at the surface of the superconductor (in the London gauge).

The understanding of the present disclosure may also be derived from the quasi-classical point of view. In the quasi-classical picture, a standing wave is a wave-packet with group velocity $v_g$=0. The magnetic force acting on such wave-packet is F=$v_g$×B=0. Therefore, the semi-classical standing wave state is not affected by magnetic fields. However, it is known that vector potential acting of the wave-packet affects the phase of the single electron wave function as shown by the Aharonov-Bohm effect. A super-current phenomenon is therefore a current of all the super-electrons as appropriate wave-packets, acting not as a collective effect due to coherence of the many-body wave function, but simply as a phase current. Such super-current, therefore, does not interfere with the electron-phonon relaxation, being a uniform current for all super-electrons.

The Pippard integral comes from the relation between the vector potential and the macroscopic current. In order to get the macroscopic current, one needs to integrate over all the standing wave k-states. This is affecting real space integration over a region on the order of the coherence length.

As a result of the above understanding, the present disclosure provides a general rule which can identify new and improved superconducting materials. This is generally similar to the Wilson's rule for metals and insulators. According to Wilson, a simple rule differentiates between insulating and conducting material by locating the Fermi level with respect to the energetic band structure of the material. If the Fermi level cuts the energy band, the material is a metal; if it falls in the gap, the material is an insulator. Additionally, if the gap is on the order of the thermal energy, the material is a semiconductor.

Figure 2A:
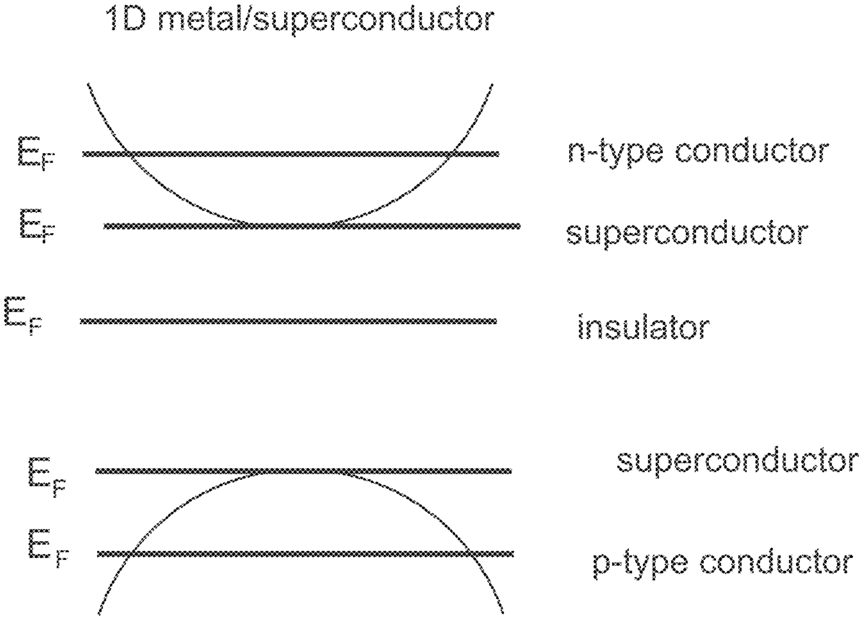
FIG. 2A is a scheme illustrating the relationship among the energy band of a material, its Fermi level and its corresponding conductance according to the Wilson rule and the present disclosure.
Figure 2B:
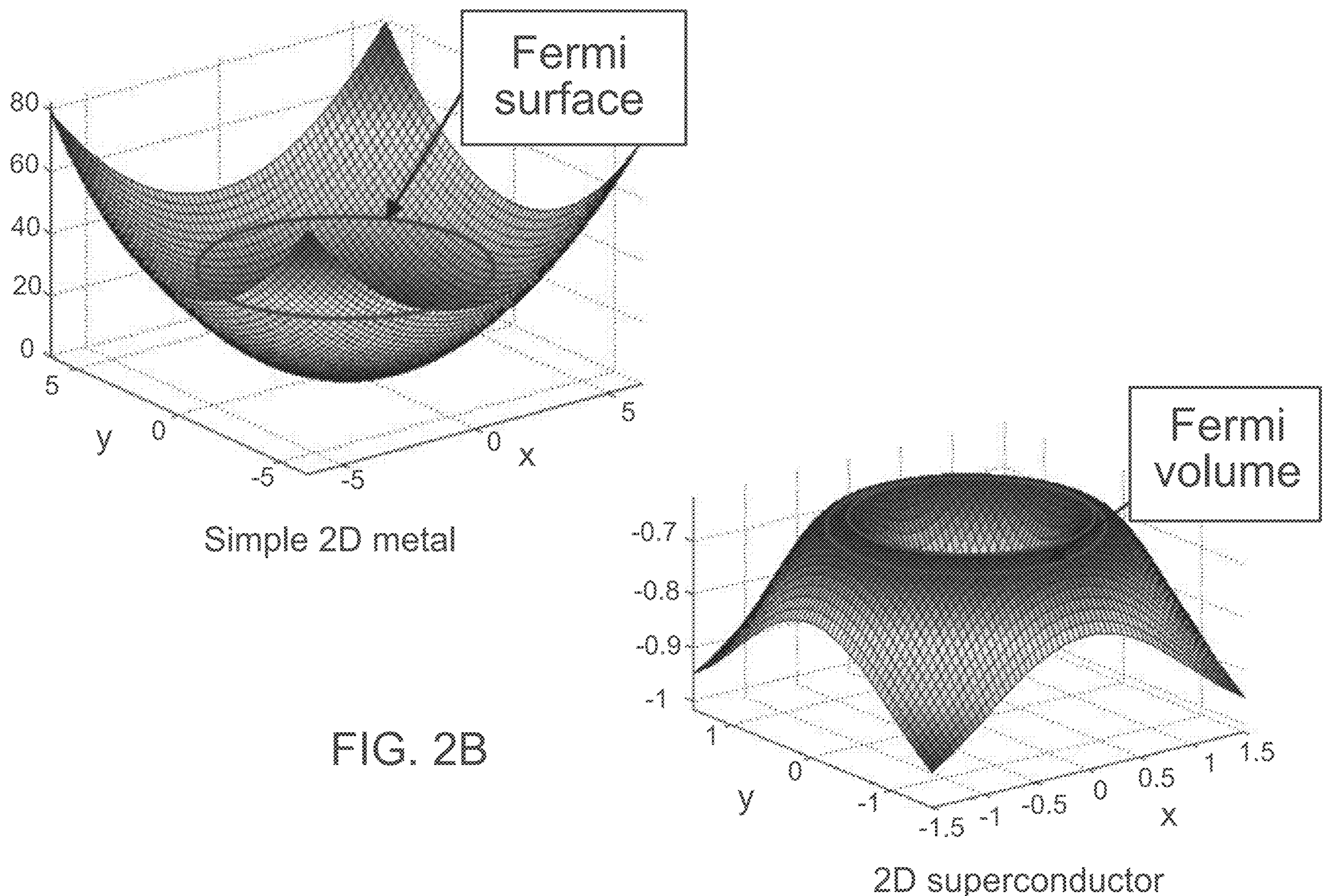
FIG. 2B presents the Fermi landscape of a simple metal and a superconductor. Left panel: a simple isotropic 2D metal. The Fermi surface appears as a 1D circle. Right panel: The Fermi landscape of an isotropic 2D superconductor according to the present disclosure. The Fermi volume appears as a 2D ring.
Figure 2C:
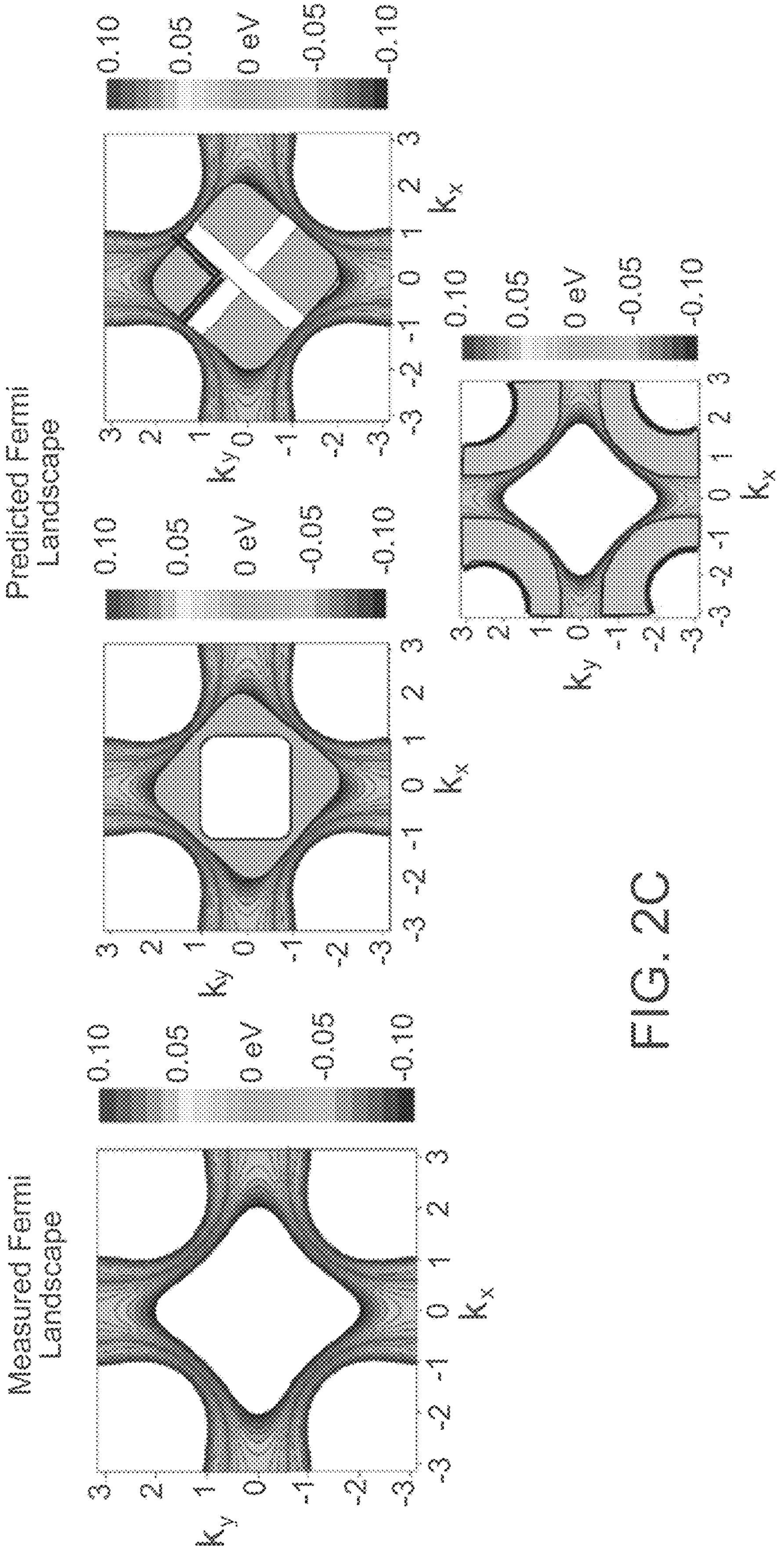
FIG. 2C presents realistic anisotropic Fermi landscape. Left panel: a scheme illustrating measured Fermi landscape of Bi2212 [Norman et. al., Phys. Rev. B, 52, 615 (1995)]. Center panel: a scheme illustrating the Fermi landscape of a possible higher temperature superconductor predicted by the inventor. Right panel: a scheme illustrating the Fermi landscape of a possible even higher temperature superconductor predicted by the inventor.

Based on the above understanding, the present disclosure provides the general principle that a superconductor behaves as a metal where the Fermi level is in the proximity (e.g., at most 50 meV) of a very shallow region of the energy levels $\varepsilon(k)$. This condition complies with the above treatment of the kinetic energy term in equation (9) as a perturbation. Additionally, this allows for the above diagonalization of the Hamiltonian $H_0$. FIG. 2 illustrates schematically the relationship among the energy band of a material, its Fermi level and its corresponding conductance according to the Wilson rule and the present disclosure.

Figure 3B:
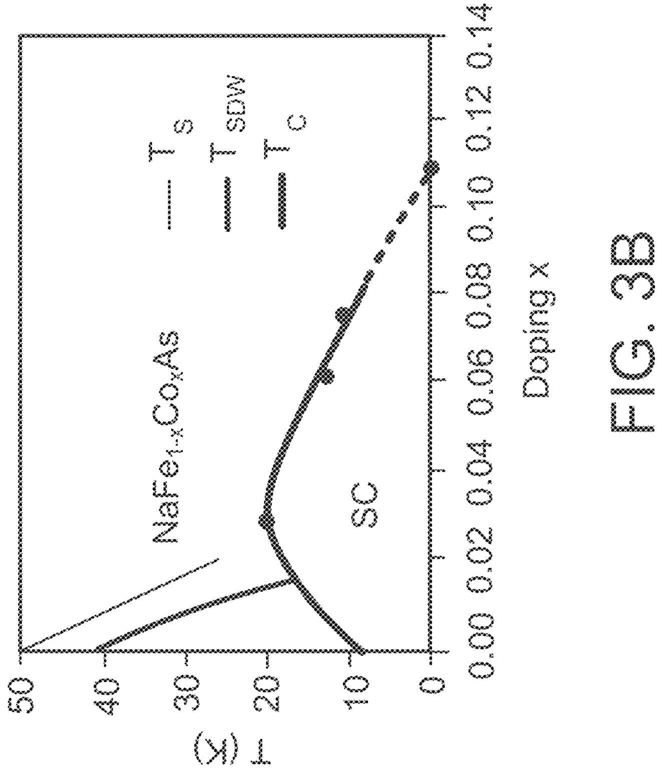
FIGS. 3A, 3B, and 3C show known electronic structure results measured by ARPES.
Figure 3A:
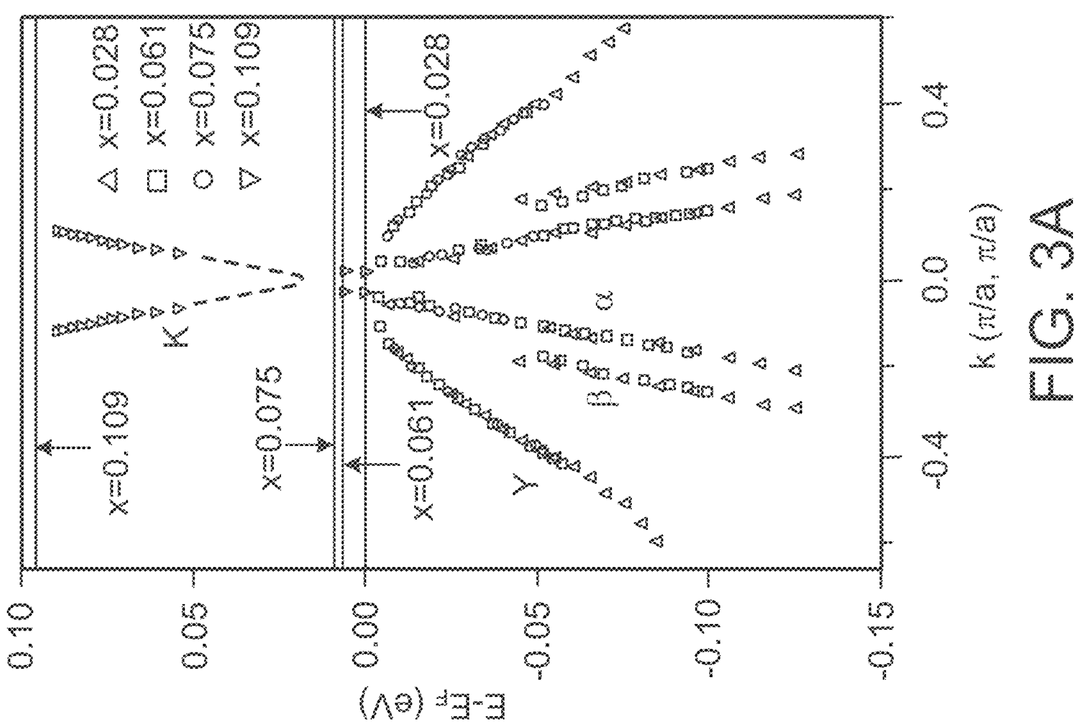
Figure 3C:
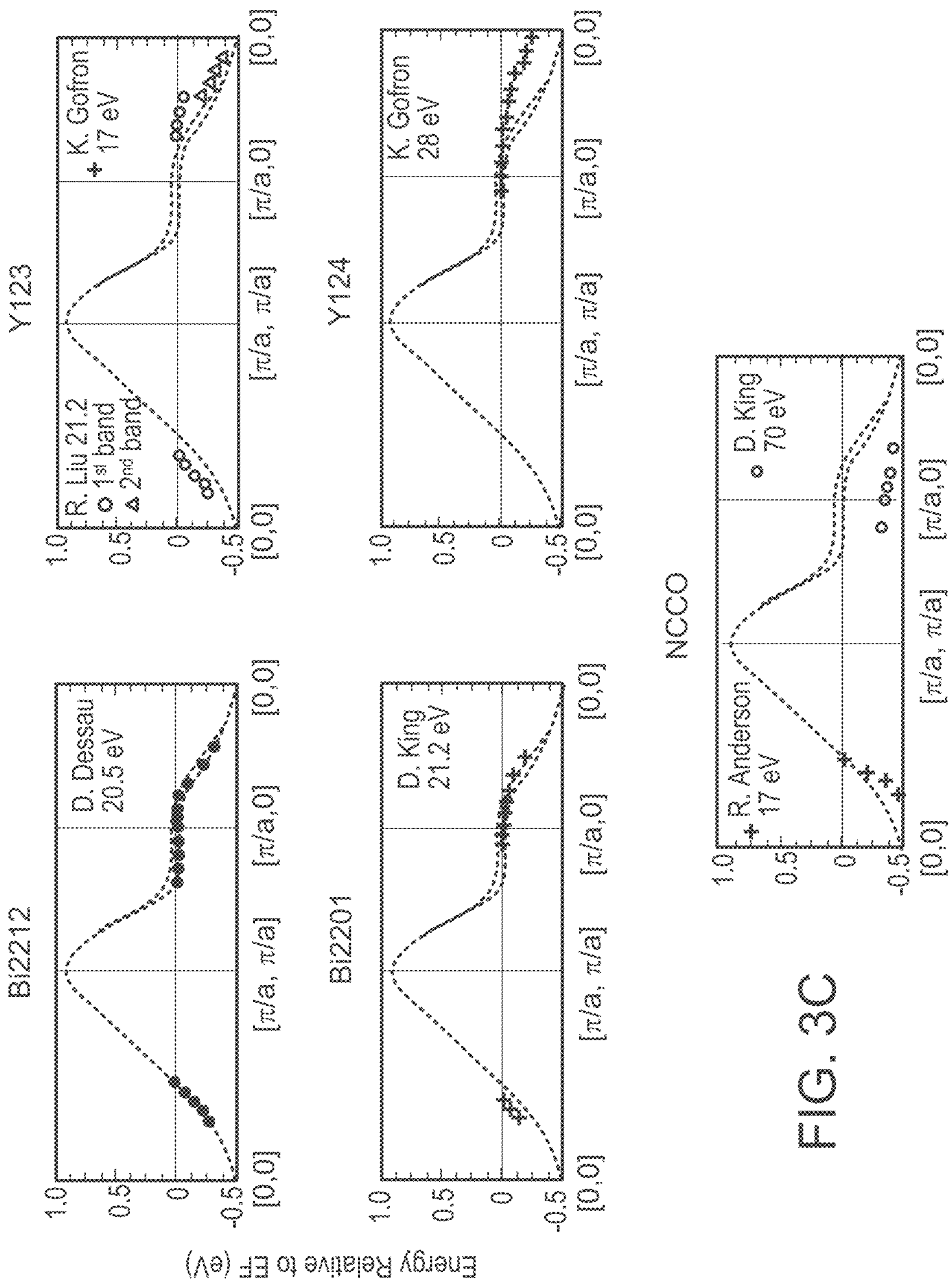

According to the above understanding, the critical temperature for superconducting effects (Tc) is believed to be determined by the size of the component $\rho_2(q)$ and therefore by the extension in k-space of the low dispersion region $\varepsilon(k)$. Equation (5) determines $\rho_2(q)$ as a three dimensional sum in k-space over states that are relevant to the treatment of equations (1) to (13). These are the k states that can be described in the normal state as perturbed standing wave states. These states constitute the low dispersion region $\varepsilon(k)$. This is consistent with measurements performed on known superconductors by ARPES showing extended low dispersion region at the proximity of the Fermi level, as can be seen in FIGS. 3A and 3B, which show known measured electronic structure results.

Thus, the general principle above can identify new materials that can act as superconductors in wide range of temperature, which can be higher than the currently available superconducting materials.

Additionally, the general principle of the present disclosure provides certain superconducting materials capable of exhibiting superconductive behavior with critical temperature higher than the currently known materials. For example, certain superconducting materials described herein may provide Tc higher than 150K, higher than 200K, higher than 250K, higher than 273K, and at about room temperature (about 300K).

As shown in equation (8) and (10) above, the energy gain in the superconducting state may be determined by the third term in the right hand side of equation (8). The critical temperature is determined by that energy gain. With all other terms varying slowly among materials of the same chemical family, the energy gain depends highly on the square density term $\rho_2$ (q) as defined in equation (5). The magnitude of $\rho_2(q)$ is determined by the extension in k-space of the nearly flat band. As an example, FIG. 3*b* shows the results of angular resolved photoemission measurements on several members of the cuprate family. As seen in the figure, the nearly flat region covers about one third of the Brillouin zone. This region can be increased. Thus, according to the present disclosure, the critical temperature may be increased by replacing buffer ions within the cuprate structure (e.g., Bi2212 or YBCO) with alkali metal ions. These buffer ions control the dispersion $\varepsilon(k)$ as can be seen below.

More specifically, the technique of the present disclosure utilizes cluster calculations for design of superconducting materials as shown in FIG. 1. In all superconductors synthesized to date with critical temperatures above the boiling point of liquid nitrogen (77K), at least one of the metal ions 11, 12, 13, and 14 in FIG. 1 is copper, and anions 21, 22, 23, and 24 in FIG. 1 are all oxygen. It should be noted that the present invention includes other ionic species in the plane defined by metal ions 11, 12, 13, and 14 and anions 21, 22, 23, and 24. In some embodiments, one or more of anions 21, 22, 23, and 24 can be other group VI elements (e.g., sulfur S, selenium Se, or tellurium Te) or group V elements (pnictogens) (e.g., nitrogen N, phosphor P, or arsenide As). It is believed that the reason to include such elements is the ability to use their p-orbitals to create a nearly bonding MO (Molecular Orbital) as explained below. It is believed that one can use these nearly bonding MOs to create the nearly flat electronic band necessary for superconductivity as explained above.

According to the present disclosure, accurate electronic state energy calculations can be performed for the octahedral structure shown in FIG. 1, which is representative of the material to be synthesized. These calculations are repeated at several representative values of the distances 34 and 35 between metal ions 31 and 32 and the plane. These values are chosen to fall in the range expected for the actual layered material, and in any case are between half the ionic radius of metal ion 31 and twice the ionic radius of metal ion 31 for distance 34, and between half the ionic radius of metal ion 32 and twice the ionic radius of metal ion 32 for distance 35. If metal ions 31 and 32 are identical, distances 34 and 35 typically are equal in each electronic state calculation. One criterion for superconductivity is that at least two of the electronic states of the octahedral structure, typically the ground state and the first excited state, are close enough in energy at some of the values of distances 34 and 35, to produce nearly flat dispersion as explained above. It should also be noted that considering the structure of the highest occupied molecular orbitals is of no less importance, as explained above.

Figure 4A:
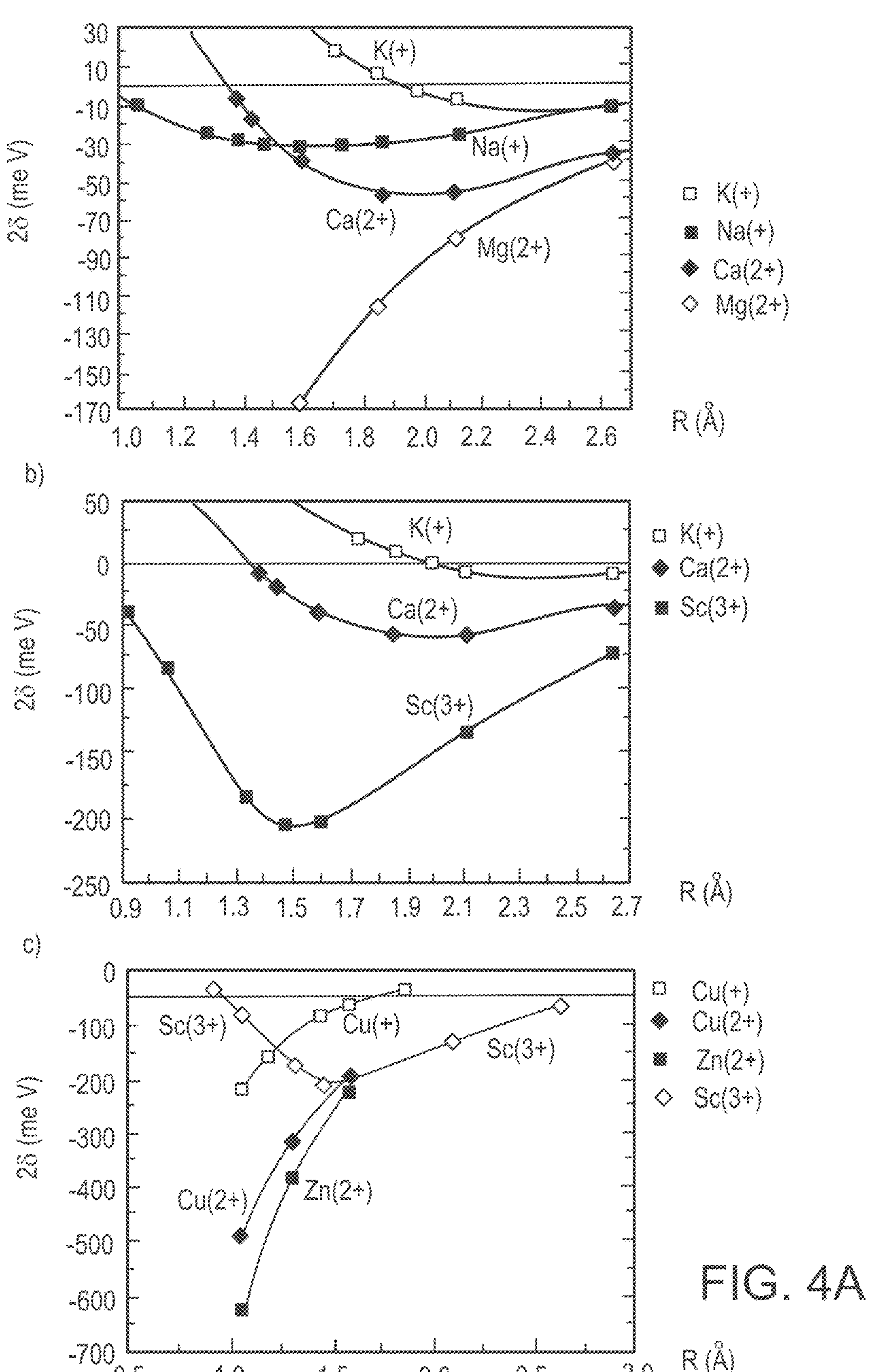
FIG. 4A shows known cluster calculations. The energy difference 2δ is displayed as function of the distance between the buffer ion and the plane. a) The effect of the buffer ion radius on 2δ. b) The effect of the buffer ion charge on 2δ. c) The effect of the buffer ion softness on 2δ.

If the octahedral structure satisfies the superconductivity criterion of near degeneracy (e.g., at most 50 meV between the ground state of the cluster and the first excited state) and the proximity (e.g., at most 50 meV) between the Fermi level and the corresponding energy band, the corresponding material is to be synthesized (e.g., by using the methods described herein). Without wishing to be bound by theory, the inventor believes that the results of these calculations show several clear trends for the cuprates as seen in FIG. 4*a*. The data shown in FIG. 4*a* are collected from Panas et al., Chem. Phys. Lett, 259, 247. The most important of which is the effect of the ionic charge of the buffer ion. The lower the charge, the lower the overlap and therefore the dispersion of the narrow band. Another trend, of lower influence is the ionic radius of the buffer ion. The higher the ionic radius, the lower the overlap. The results of the quantum chemistry calculations are reproduced in FIG. 4*a*. These results, where pertaining to the component $\rho_2(q)$, provide clear synthesis routes. For example, as described above, using a precursor with an excess amount of alkali metal ions and performing ion exchange proved to be efficient for inducing room temperature superconductivity. In some embodiments, oxides and nitrates can be used as precursors. In some embodiments, when using precursors containing group VI anions other than oxygen, the corresponding chalcogenides can be used. In some embodiments, an additional step of heating the sintered mixture in an oxygen atmosphere is needed to provide interstitial oxygen for hole doping. In some embodiments, when the high temperature superconductors contain mercury or thallium, they may require special treatment to be synthesized as known in the art. Superconductors can be synthesized by laser beam ablation, sputtering, molecular beam epitaxy or other methods known in the art including thin film methods. In some embodiments, artificial structures (superlattices) containing the above cluster and required charge reservoir layer or doping source can be obtained by the synthesis methods described herein.

Based on the above principle and model, the present disclosure provides the general requirements for identifying high temperature superconductors as follows: (1) the dispersion region of $\varepsilon(k)$ at the proximity of the Fermi level is to be low (e.g., less than 50 meV), i.e. the energy differences between states in the cluster, should be as small as possible; (2) the states of this low dispersion regions should preferably be coupled to phonons (or other bosons); and (3) these electronic states should be itinerant. It should be noted that surface states or localized states can produce similar effects and appear non-dispersive in ARPES spectra while having no, or limited, contribution to superconductivity. In addition, a dispersive band, such as the Cu—O sigma band in the cuprates, supplies the screening of the coulombic potential v(q) in equation (1). [Deutscher et al., Chinese Journal of Physics, 31, 805, (1993)].

Thus, the present disclosure provides methods for identifying novel superconducting materials based on the following steps: (1) locating the frontier molecular orbitals which are almost non-bonding, which may be achieved by separating the anion atom centers by a proper distance (e.g. 3.8-4.2 Å in cuprate compounds) and the molecular orbital composed of p-orbitals which generally extend in space in the plane; and (2) locating the frontier orbitals coupled to the vibrations of a close-by metal ion approximate to the plane. At this point, the ionic charge of the metal ion approximate to the plane is preferably selected such that the energy difference between the bonding and anti-bonding levels of the frontier orbitals is minimized. It is believed that this energy difference determines the dispersion of the very narrow band. Based on appropriate cluster calculations, the ionic charge of the metal ions approximate to the plane is preferably as small as possible. For example, in cuprate compounds (i.e., copper oxides), the preferred ionic charge for the metal ions approximate to the plane is +1 or lower. In addition to the ionic charge, it is believed that the radius of the metal ion approximate to the plane in cuprate-based materials is preferably to be the high (such as the radius of K, Rb, or Cs). This can reduce the bonding-anti-bonding energy level separation. This energy level separation determines the narrow band dispersion and therefore the size of the component $\rho_2(q)$. The size of the component $\rho_2(q)$ determines Tc.

Figure 4B:
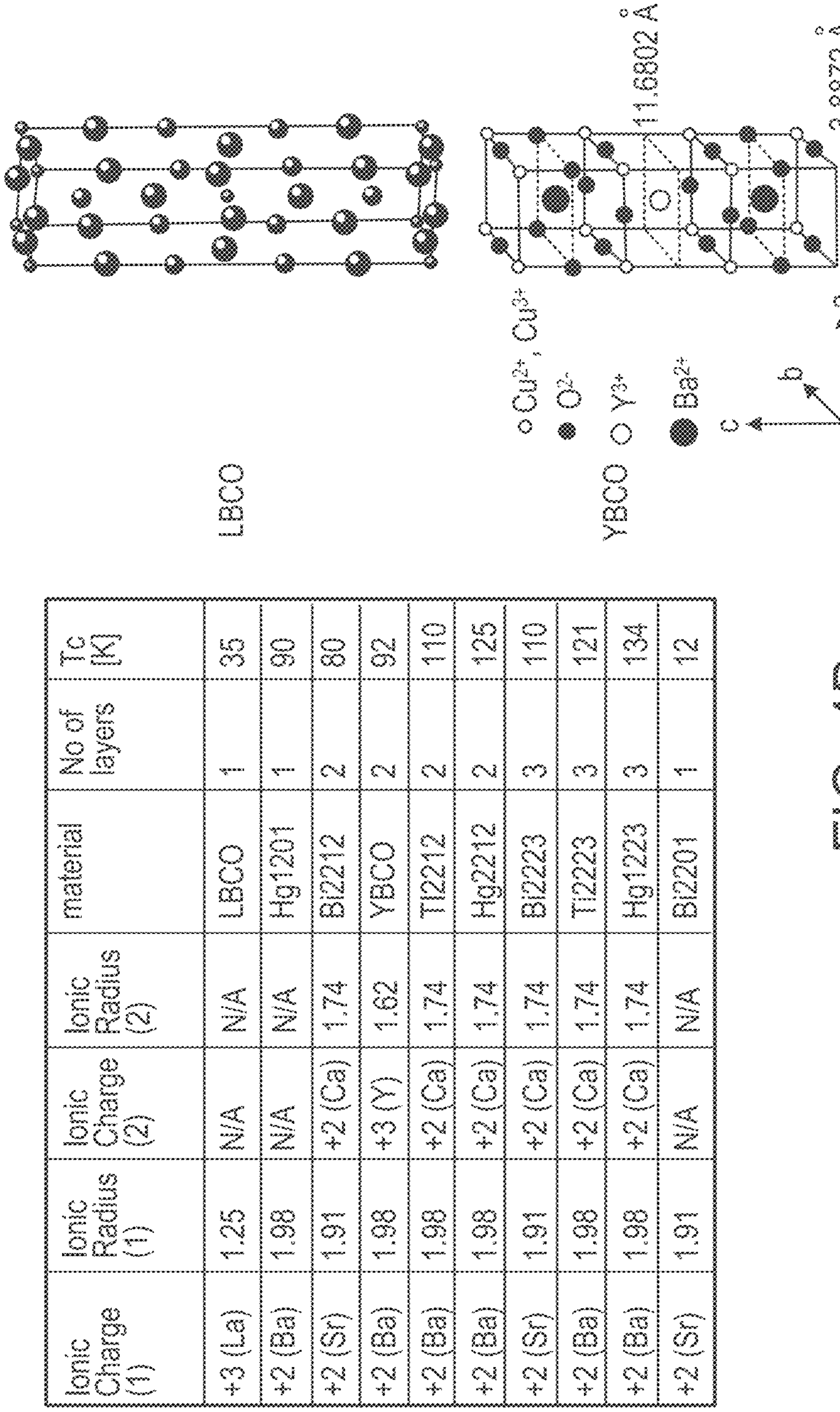
FIG. 4B presents a table listing the properties of known cuprate superconductors. The critical temperature can be explained by the model described herein. The crystal structure of LBCO and YBCO are given for clarity.

The table in FIG. 4*b* lists well known representatives of HTS materials. Column 1 lists the ionic charge of ions at the B site (i.e., the site corresponding to B in formula (I)). Column 2 lists the ionic radius of ions at the B site. Column 3 lists the ionic charge of ions at the Z site (i.e., the site corresponding to Z in formula (I)). Column 4 lists the ionic radius of ions at the Z site. Column 5 is the well-known name of the compound. Column 6 shows the number of $CuO_2$ layers in the compound. Column 7 lists the Tc of the different compounds. The model described above can explain qualitatively the variety of Tc in these compounds by means of the effect of the ionic charge and the ionic radius on $\rho_2(q)$ as follows. The last compound is an exception to the rule, to be dealt with at the end of this paragraph. The effect of the number of $CuO_2$ layers is clear. Increased number of layers increases $\rho_2$ (q) by introducing more k-states into the sum (equation 5). This works well as long as the doping mechanism is effective. Increasing the number of $CuO_2$ layers also increases the distance to the charge reservoir layers. The optimum is found for three layers. Therefore a good comparison will be for compounds of the same number of layers. The first two rows of the table compare the single layer compounds LBCO and Hg1201. The ionic charge at the B site decreases from +3 for LBCO to +2 for Hg1201. The value of 2δ, as an estimation of the oxygen band dispersion, decreases from about 130 meV (calculated for scandium) to about 40 meV (calculated for calcium). The trend is clear and, based on the model described above, Tc increases by a factor of about 3, as this is the factor of increase in $\rho_2(q)$. The next four rows compare the double layer compounds. Going from Bi2212 to YBCO, the ion at the B position increases its radius, while the ion at the Z position increases its charge. The B position is believed to be the dominant in affecting $\rho_2(q)$. Therefore there is a net increase in Tc. However, based on the model described herein, it is believed that a further increase in Tc will be obtained by replacing the +3 ion at the Z position (Y) with a +2 ion (Ca). This is what is shown in the next two rows displaying Tl2212 and Hg1212. The advantage of the Hg compounds over the Tl compounds is due to the linear coordination of Hg that relaxes structural strains. The three layers compounds are presented next. Bi2223 has 3 layers, but a smaller ion at the B position. Therefore the increase in Tc is significant with respect to Bi2212, but not with respect to the double layer Ba compounds, Tl2212 and Hg1212. The same goes for the 3-layer Tl compound. The increase in Tc is significant with respect to the double layer compound Tl2212, but not with respect to the strain relaxed Hg2212. The last 3-layer compound Hg2223, enjoys from all the benefits and seems to have exhausted all of the benefits of having +2 ions at the B and the Z positions. The last line shows the properties of the single layer Bi2201. The relatively low Tc of this compound can be explained by the details of its Fermi surface and the Fermi landscape.

Based on the model and principles established above, the next step would be to use +1 buffer ions with large ionic radius at the B site, as demonstrated in Examples 1-8 below. The 2δ value for using K+ instead of Ba++ as the buffer ion, decreases from about 40 meV to below 5 meV. Therefore, the inventor believes that such a material can have a large increase in Tc due to the large increase in $\rho_2(q)$, even larger than the 3-fold increase in Tc, observed in 1987, by going from the +3 buffer ion at the B position to the +2 buffer ion at the B position. The inventor believes that even higher Tc by going to +1 ions at the B and Z position, with a maximum Tc for a relaxed structure containing purely +1 ions with large ionic radius, such as $HgCs_2Na_2Cu_3O_{6+\delta}$ or $HgRb_2Na_2Cu_{6+\delta}$.

Thus, without wishing to be bound by theory, the understanding of superconductivity above leads to the inventor's belief that certain materials can exhibit superconductive behavior at a relatively high temperature (e.g., at room temperature). For example, such materials can have a crystal structure that includes cuprate layers (i.e., copper oxide layers) having alkali metal ions located between or proximal to the layers. In some embodiments, the fraction of alkali metal ions can be higher than 0.1 (e.g., higher than 0.2, higher than 0.3, higher than 0.4, higher than 0.5, higher than 0.6, higher than 0.7, higher than 0.8, higher than 0.9, or higher than 0.95) of the total amount of metal ions adjacent to cuprate layers in the crystal structure of the superconductor compounds described herein.

Additionally, the technique of the present disclosure provides a material containing negative ions (e.g. $F^-$ or $O^{2-}$) located between at least some of the alkali metal ions and at least some of the metal oxide layers (e.g., the planes defined by anions 21-24 in FIG. 1). The negative ions provide further screening of the alkali metal ion charge and thus provide ions having effective charge below +1 (e.g., at most 0.8, at most 0.6, at most 0.5, at most 0.4, at most 0.2, at most 0.1, or 0).

The contents of all publications cited herein (e.g., patents, patent application publications, and articles) are hereby incorporated by reference in their entirety. In the event that there is a conflict between the present disclosure and the documents (e.g., U.S. Provisional Application No. 62/069,212 filed Oct. 27, 2014) incorporated by reference, the present disclosure controls.

The following examples are illustrative and not intended to be limiting.

Example 1: Synthesis of High Temperature Superconductors

As mentioned herein, the chemical compositions of the compounds described in the Examples were measured by using Energy Dispersive Spectroscopy (EDS). The Tc of the compounds described in the Examples were measured by using the four probe method in a vacuum oven [Low Level Measurements Handbook, 6th edition, Keithley].

The following three families of compounds derived from the model outlined above were synthesized and exhibited room temperature superconductivity properties: Bi2212 modified to contain K (i.e., the K family), Bi2212 modified to contain Rb (i.e., the Rb family) and Bi2212 modified to contain Cs (i.e., the Cs family).

Variety of compounds belonging to the three families above were synthesized by the following general procedure: Bi2212 was prepared as a precursor. Specifically, stoichiometric amounts of CuO, $SrCO_3$, $Bi_2O_3$ and $CaCO_3$ were ground, pressed, and sintered at 800-820° C. for 24-60 hours to prepare Bi2212 (i.e., $Bi_2Sr_2CaCu_2O_y$). The Bi2212 precursor was then mixed with a carbonate salt of an alkali metal in a weight ratio of 1:1 and sintered at 800-820° C. for 60 hours. The molar ratio between the alkali metal carbonate salt and the Bi2212 precursor was 7:1 when K was used, 4:1 when Rb was used, and 3:1 when Cs was used. In some of the cases, commercial Bi2212 (Alfa Aesar, Ward Hill, MA) was used. Further, in some of the cases, the reaction was done in two stages of grinding, pressing and sintering. Specifically, the sintering in the first stage lasted for 24-60 hours and the sintering for the second stage lasted for 60-96 hours. The mixtures in most cases were grinded in a glove box filled with Ar, pressed in the glove box and then sintered at 800-820° C. Variations with respect to this generic procedure are detailed in the examples.

Figure 5:
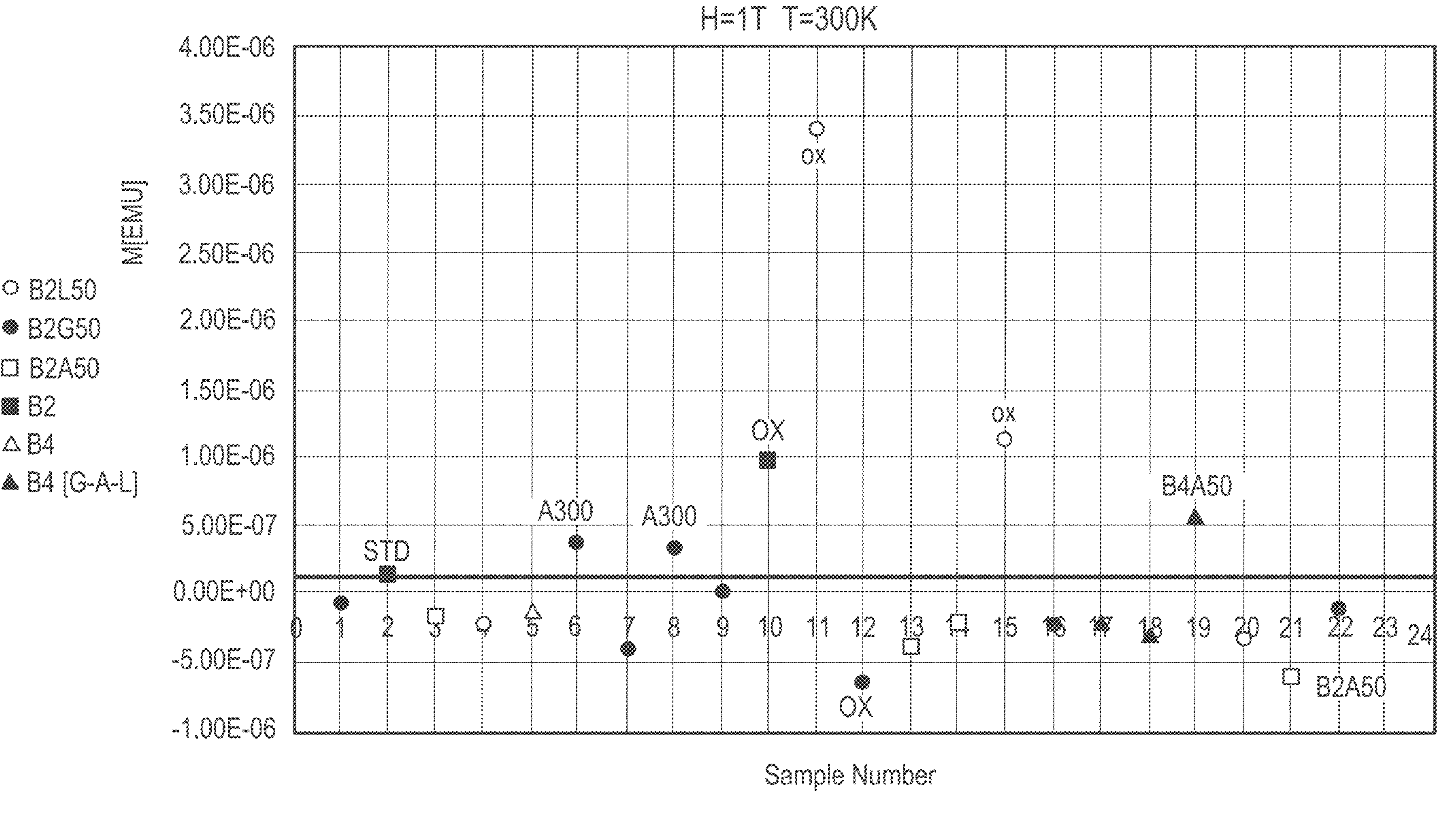
FIG. 5 is a graph including a collection of magnetic measurements of Bi2212 and three families of compounds described in Examples 1-6 at room temperature and a field of 1 Tesla.

FIG. 5 presents a collection of magnetic measurements at room temperature and a field of 1 Tesla. The continuous line represents the Bi2212 precursor paramagnetic response. All of the data points below that line show different degrees of diamagnetic response. They belong to the three families of compounds described in Examples 1-6. The data points above that line were obtained by treating the three families of compounds through special treatment (high oxygen pressure, vacuum annealing, and different composition) that caused the loss of their diamagnetic response.

Example 2: Synthesis and Properties of a First HTS Sample in the Potassium Family A sample containing $Bi_2(K_xSr_{1-x})_2(K_tCa_{1-t})Cu_2Oy$ and $Bi_3C_m(K_xSr_{1-x})_2(K_tCa_{1-t})_2Cu_2O_y$ in the potassium family of HTS was made by the following method, which was modified based on the method described in Example 1. Bi2212 precursor was made from $Bi_2O_3$, $SrCO_3$, $CaCO_3$ and CuO, which were mixed, grinded, and sintered at 800° C. The precursor was then baked in vacuum at 400° C. for 206 hours before mixing with $K_2CO_3$. The mixing at a weight ratio of 1:1 (i.e., a molar ratio between $K_2CO_3$ and Bi2212 of 7:1), grinding and pressing were done in an Ar filled glove box. The pellets were then sintered for 60 hours at 800° C. to obtain a sample containing $Bi_2(K_xSr_{1-x})_2(K_tCa_{1-t})Cu_2O_y$ and $Bi_3C_m(K_xSr_{1-x})_2(K_tCa_{1-t})_2Cu_2O_y$.

Figure 6:
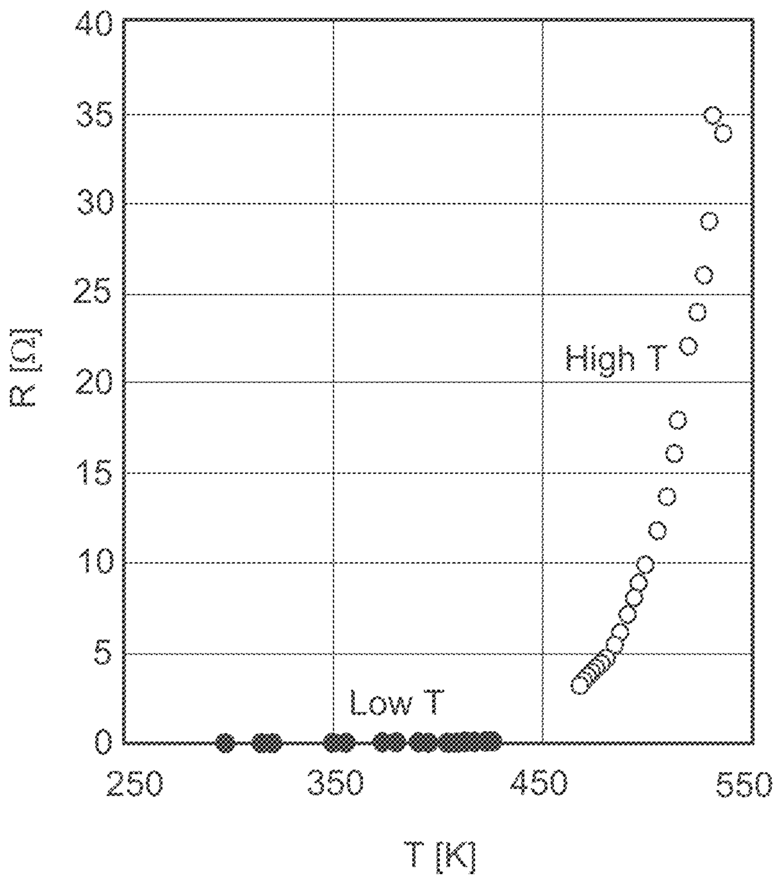
FIG. 6 is a graph showing the temperature dependence of the resistance of a first HTS sample in the potassium family.

FIG. 6 shows the temperature dependence of the resistance for this sample. The electrical measurement in FIG. 6 was done by the four probe method in a vacuum oven. The graph shows a decrease of more than three orders of magnitude with decreasing temperature, typical to a superconducting transition, with a Tc onset temperature higher than 500K. The residual resistance at room temperature was 15 mΩ.

Figure 7A:
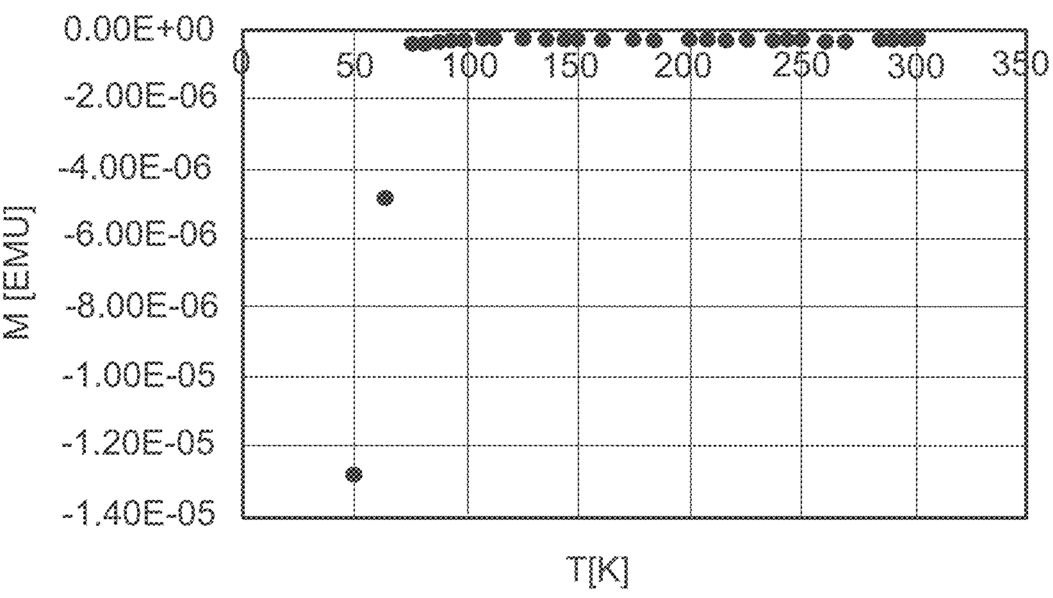
FIG. 7A is a graph showing the magnetic moment as a function of temperature from 50K to 300K for the sample used to obtain the results shown in FIG. 6.
Figure 7B:
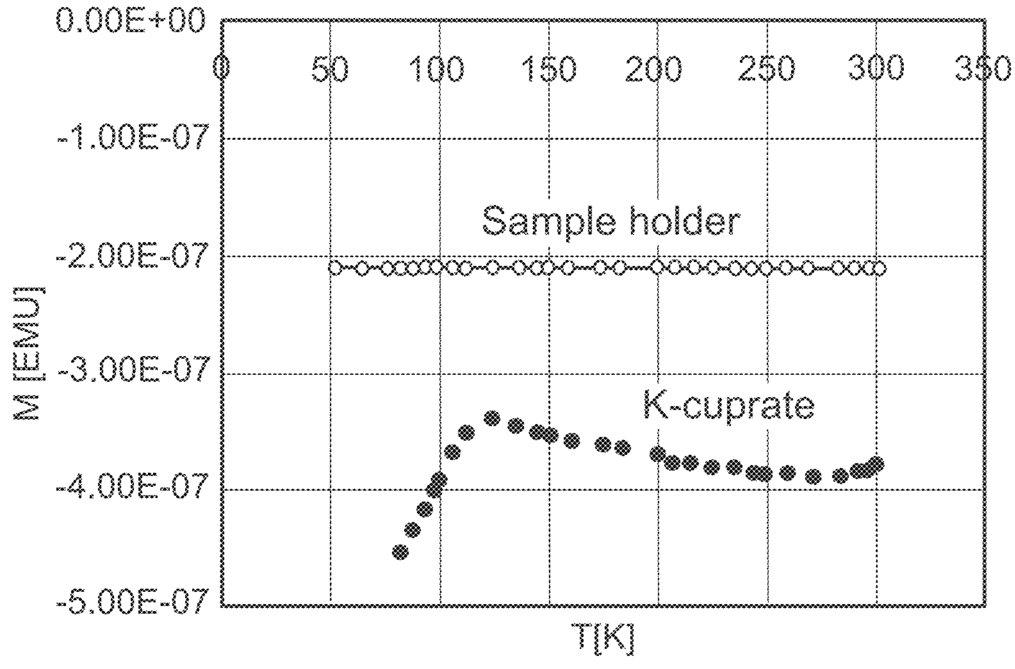
FIG. 7B is a graph showing the magnetic moment as a function of temperature from about 75K to 300K for the sample used to obtain the results shown in FIG. 6.
Figure 8:
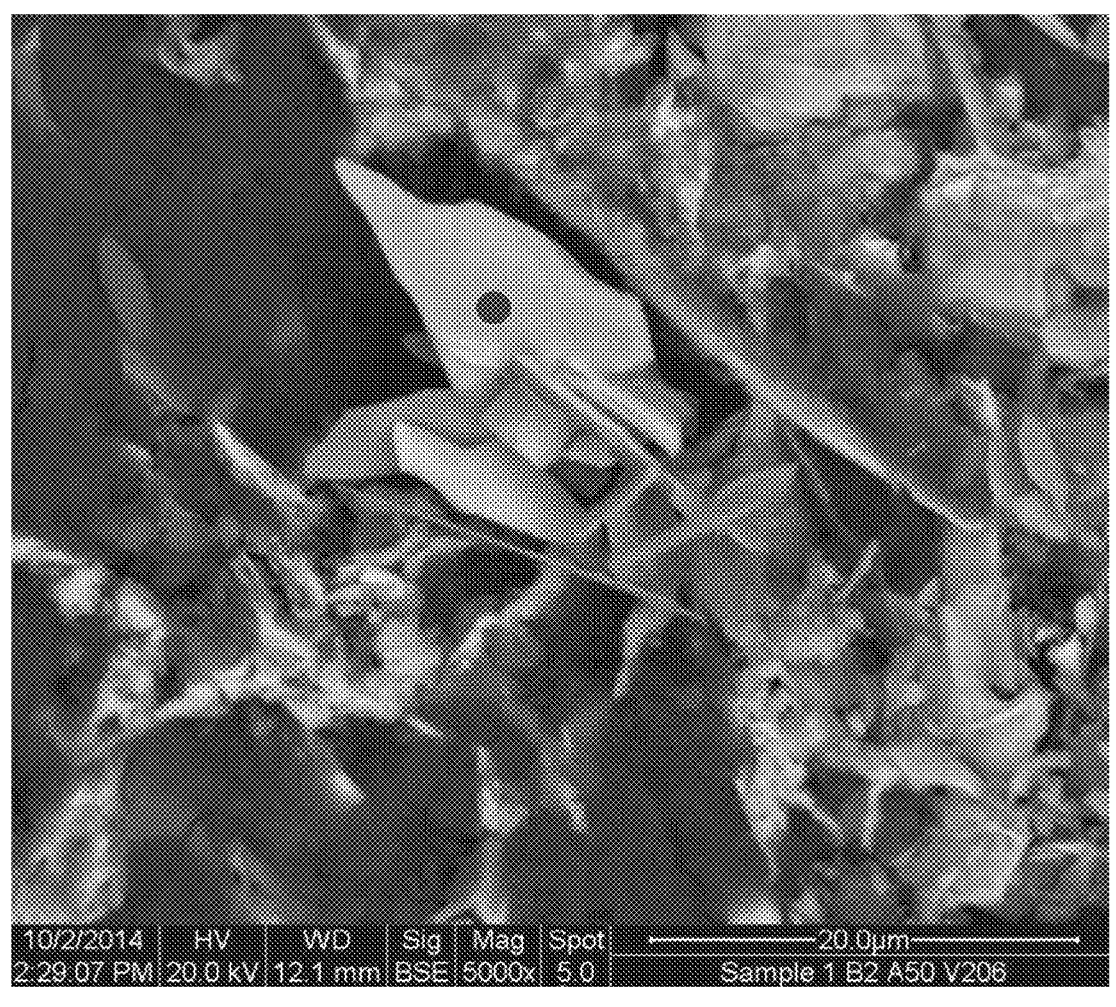
FIG. 8 shows a SEM micrograph with EDS analysis of the sample used to obtain FIG. 6.

FIG. 7*a* shows the magnetic moment as a function of temperature from 50K to 300K for a sample of the same batch. As can be seen from this figure, the phase having a relatively low temperature Tc (i.e., about 100K) had a relatively high Meissner fraction, with a magnetic moment of −1.3E-5 EMU at 50K. The phase having a Tc above room temperature had a low Meissner fraction with a magnetic moment of about −4E-7 EMU at 300K. A similar behavior was observed in the samples in the other families. This result correlates well with EDS and XRD measurements showing a small fraction of Bi2212 with highly incorporated alkali metal ions, and a large fraction of Bi2212 with lightly doped alkali metal ions. FIG. 7*b* shows the same measurement from about 75K to 300K. The continuous line shows the response from the sample holder, which was used as a reference. As shown in FIG. 7*b*, when the temperature was increased from about 75K to 125K, it was observed that the magnetic moment increased, but remained negative and below the reference line. When the temperature was raised above 125K, the magnetic moment did not become positive, as usually observed for $Bi_2Sr_2CaCu_2O_y$ (i.e., Bi2212). Instead, it remained negative, well below the reference line up to 300K. Thus, the results in FIGS. 7A and 7B suggest that a major superconducting phase having a Tc of about 100K and a minor superconducting phase having a Tc above room temperature. It is therefore believed that the major superconducting phase contained $Bi_2(K_xSr_{1-x})_2(K_tCa_{1-t})Cu_2O_y$ where each of x and t is smaller than 0.5 and the minor superconducting phase contained $Bi_3C_m(K_xSr_{1-x})_2(K_tCa_{1-t})_2Cu_2O_y$ (such as $Bi_3C_mSr_2K_{0.8}Ca_{1.2}Cu_2O_y$ as shown in FIG. 8). Other measurements showed a similar behavior of the superconducting compounds in the Rb and Cs families: a major superconducting phase at or below about 100K and a minor superconducting phase at room temperature. X-Ray Diffraction (XRD) and Energy Dispersive Spectroscopy (EDS) (see below) support this two phase picture.

FIG. 8 shows a SEM micrograph with EDS analysis of a crystallite of a new compound in the sample obtained above. This new compound belongs to the potassium family and includes a $KCaCuO_4$ cluster. Measurements were done on Environmental Scanning Electron Microscope (ESEM) Quanta 200 (FEI). The system includes an EDS system for quantitative analysis of the various elements present in the sample. The electron beam was focused at the red spot. The table in the figure shows the atomic fraction and the weight fraction of the different elements obtained from the EDS analysis. The results show that the atomic ratio of K increased from 0% to about 3.85%, indicating K was incorporated into the crystal lattice. The atomic fractions suggest the following formula: $Bi_3C_mSr_2K_{0.8}Ca_{1.2}Cu_2O_y$, which falls in the general formula: $Bi_3C_m(K_xSr_{1-x})_2(K_tCa_{1-t})_2Cu_2O_y$. This compound appears in a small fraction of this sample. It is believed that the incorporation of carbon in the crystal lattice allows for the high incorporation of potassium in the crystal lattice.

Example 3: Synthesis and Properties of a Second HTS Sample in the Potassium Family Another HTS sample in the potassium family was synthesized by a method similar to that described in Example 1. The precursor was mixed and grinded with $K_2CO_3$ in a $N_2$ filled glove box in a weight ratio of 1:1 (i.e., a molar ratio between $K_2CO_3$ and Bi2212 of 7:1). The mixture was pressed to pellets outside the glove box with intermediate evacuation in a desiccator. The pellets were then sintered for 60 hours at 800° C. to obtain the sample.

Figure 9:
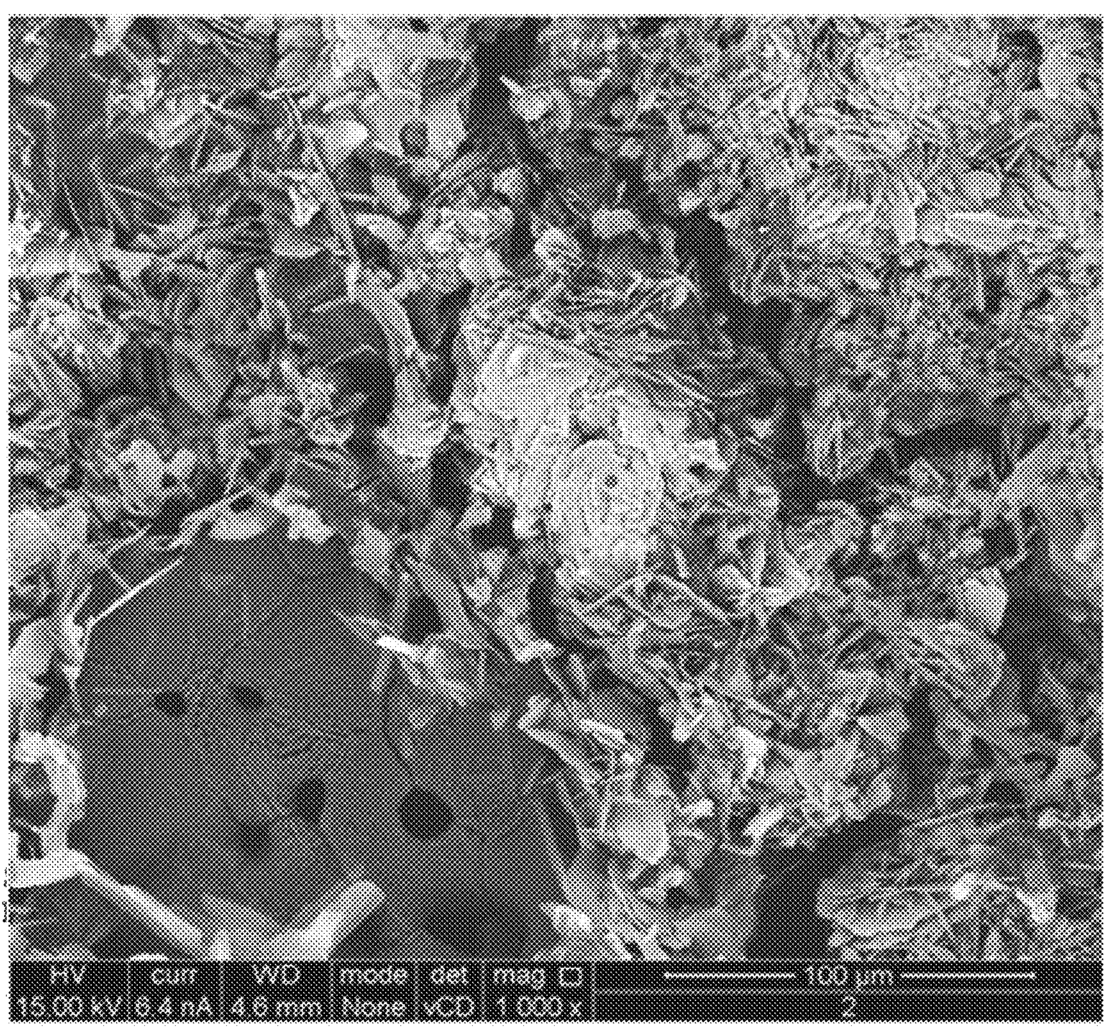
FIG. 9 shows a SEM micrograph with Energy-dispersive X-ray spectroscopy (EDS) analysis of a second HTS sample in the potassium family.

FIG. 9 shows a SEM micrograph with Energy-dispersive X-ray spectroscopy (EDS) analysis of the above sample. Measurements were done on Magellan T Extra High Resolution (XHR) SEM, equipped with a Schottky-type field emission gun. The microscope included an EDS silicon drift detector (Oxford X-Max). The electron beam was focused at the red spot. The table below the micrograph shows the atomic fraction and the weight fraction of the different elements obtained from the EDS analysis. The atomic fractions suggest a compound of the following formula: $Bi_2(K_xSr_{1-x})_4(Sr_tCa_{1-t})Cu_3O_y$, which suggests that the compound contains three copper layers. This new compound can be understood as a derivative of the superstructure Bi1212/Bi1201 with high incorporation of K. The Bi1212/Bi1201 superstructure is an intergrowth of $BiSr_2CaCu_2O_{y1}$ (Bi1212) and $BiSr_2CuO_{y2}$ (Bi1201). The results show that the atomic ratio of K increased from 0% to about 12.9%, indicating a significant K incorporation into the crystal lattice. In addition, the results show that there was a decrease in the atomic ratio of Sr from a theoretical value of about 20% (i.e., twice as Bi's atomic ratio or 4/3 of Cu's atomic ratio based on Bi1212/Bi1201) to about 7.8% and a decrease in the atomic ratio of Ca from about 5% (i.e., one third of Cu's atomic ratio or half of Bi's atomic ratio based on Bi1212/Bi1201) to about 4%, suggesting that about 65% of Sr were replaced by K (i.e., 12.9%/20%=0.65). Thus, Sr and K add up to a little above 20% atomic ratio as required to give $(K_xSr_{1-x})_4$, in which x is about 0.65. The extra Sr (0.8%) is believed to be incorporated on the Ca site, completing the atomic ratio at that site to about 5% as required. Looking closely at the superstructure, it is composed of the components: $Bi(K_xSr_{1-x})_2CaCu_2O_{y1}$ (Bi1212) and $Bi(K_xSr_{1-x})_2CuO_{y2}$ (Bi1201). Without wishing to be bound by theory, it is believed that one of these two components can include K with an incorporation rate of x~1. In addition, without wishing to be bound by theory, such a high value of x can explain the room temperature superconductivity observed in this sample.

Figure 10:
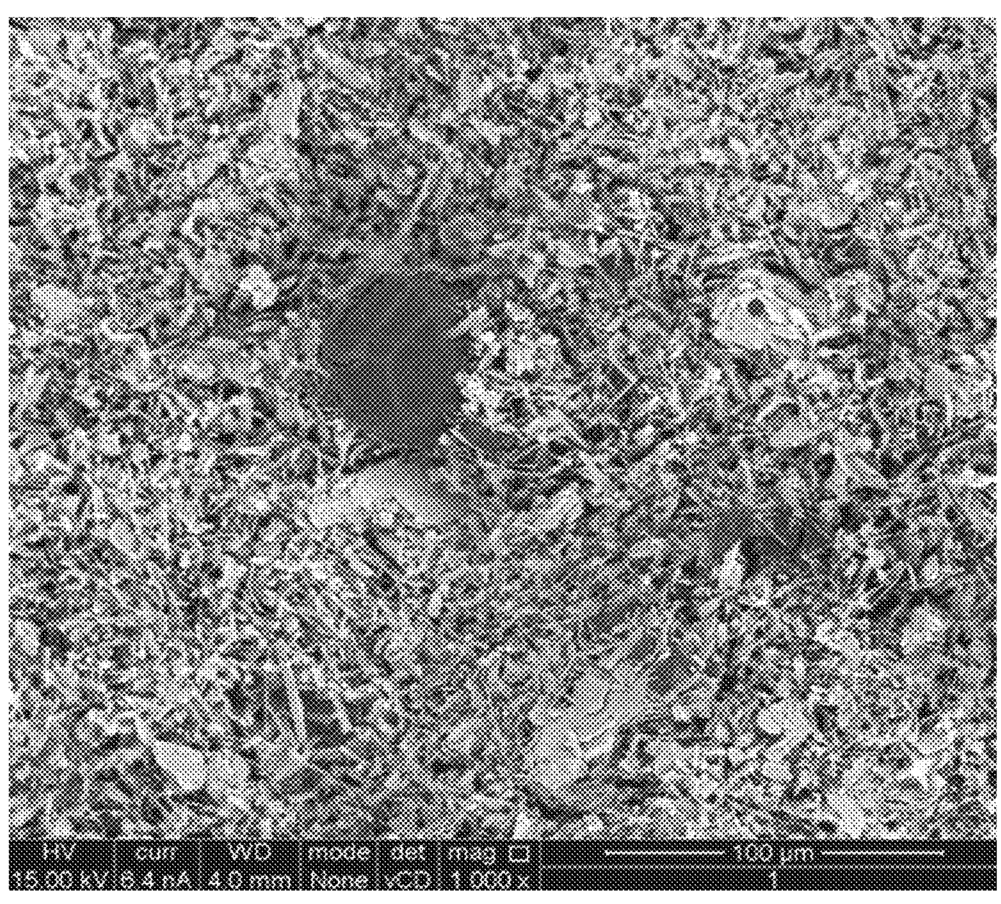
FIG. 10 is a SEM micrograph with EDS analysis obtained at another portion of the same sample used to obtain the results shown in FIG. 9.

FIG. 10 shows the EDS analysis of another phase at the same sample. The electron beam was focused at the red spot. The table below the micrograph shows the atomic fraction and the weight fraction of the different elements obtained from the EDS analysis. The results show that the atomic ratio of K increased from 0% to about 2%, indicating that K was incorporated into the crystal lattice. In addition, the results show that there was a decrease in the atomic ratio of Sr from a theoretical value of about 12.4% (i.e., the same as Cu's atomic ratio) to about 10%, suggesting that about 20% of Sr was replaced by K. The results also show that there was no decrease in the atomic ratio of Ca (i.e., half of Cu's atomic ratio) to about 6.6%, suggesting that the Sr site is the preferred incorporation site for K. The above results suggest that this phase has the formula $Bi_2(K_xSr_{1-x})_2CaCu_2O_y$. A similar behavior was observed in the other examples, that is, separation to two phases: a low alkaline incorporated phase, similar to Bi2212 with x<0.5 and a high alkaline incorporation phase with x>0.5. The high alkaline incorporation phase was believed to be a superstructure with or without carbon incorporation. It is believed that the superstructure facilitates the high level of alkaline incorporation and that the high alkaline incorporation phase is responsible for the room temperature superconductivity observed in these samples.

Figure 11:
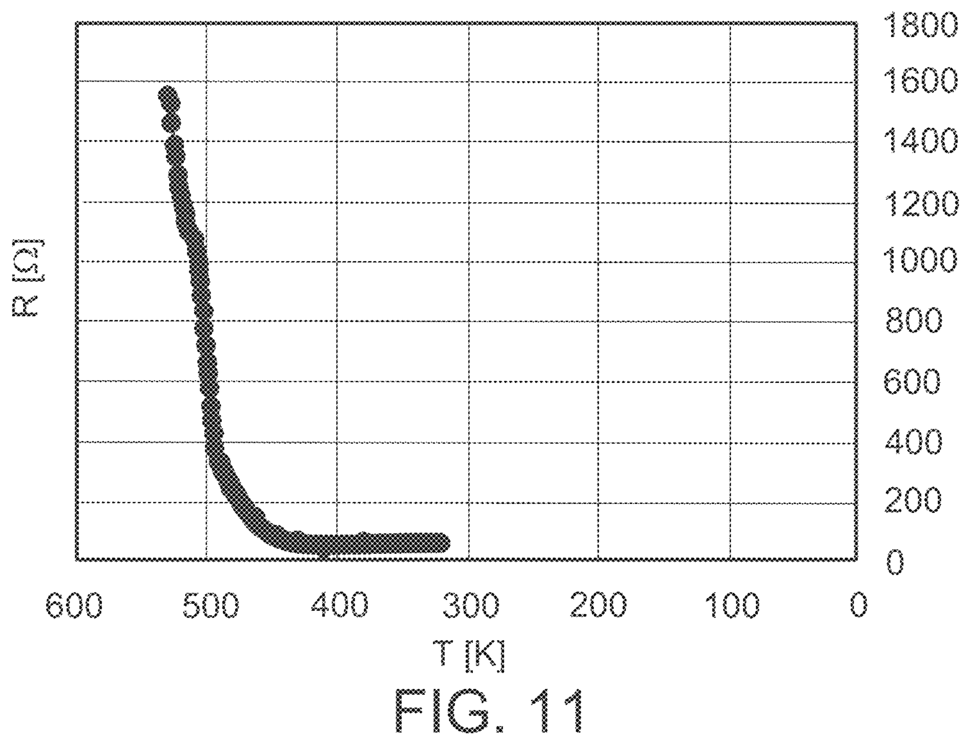
FIG. 11 shows the temperature dependent resistance of the sample used to obtain the results shown in FIGS. 9 and 10.

FIG. 11 shows the temperature dependent resistance of this sample. The measurement was done by the four probe method in a vacuum oven. The graph shows a decrease of more than three orders of magnitude in resistance with decreasing temperature, typical of a superconductor transition. As shown in FIG. 11, this sample has a Tc of higher than 500K. The relatively high residual resistivity is attributed to the synthesis process, producing weak links between the crystallites. The sample showed a negative magnetic moment of −2.3E-7 emu at 300K and a field of 1T.

Figure 12:
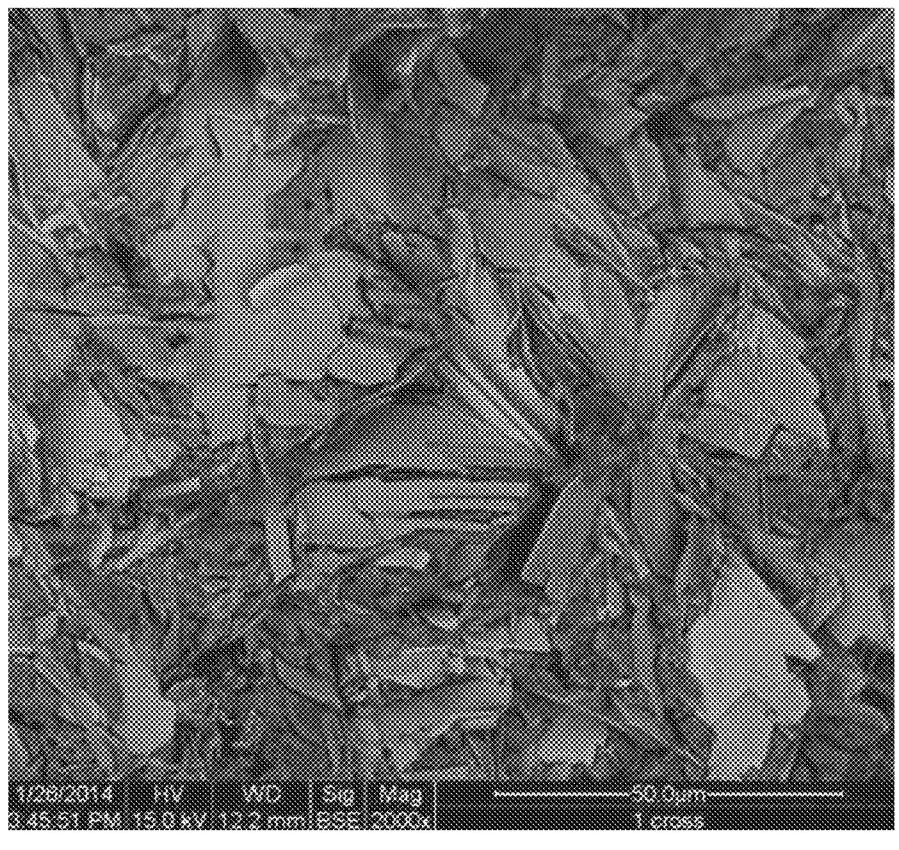
FIG. 12 is a SEM micrograph showing the microstructure of a HTS sample in the rubidium family.

Example 4: Synthesis and Properties of a First HTS Sample in the Rubidium Family FIG. 12 shows the microstructure of an HTS compound belonging to the rubidium family. The sample was synthesized by the same method described in example 3, except that $K_2CO_3$ was replaced by $Rb_2CO_3$. The picture was taken by using Environmental Scanning Electron Microscope (ESEM) Quanta 200 (FEI) in the Back Scattered (BS) mode, giving contrast based on the atomic number, with higher atomic number elements appearing brighter. As shown in FIG. 12, large regions of the sample are conducting (no charging effects) with homogeneous chemistry, as can be seen from the backscattered electron image contrast. Two point resistance measurements of this compound gave values of several ohms at room temperature. In addition, FIG. 12 shows a polycrystalline material with crystallites oriented in different directions. As a result, the material exhibited a residual resistance at room temperature corresponding to the boundaries between the crystallites. EDS showed high level of rubidium incorporation in these early samples (X>0.5) with residual $Rb_2CO_3$. The EDS results suggest a compound containing three copper layers of the following formula $Bi_2C_2Sr_2Rb_{2.5}Ca_{0.64}Cu_3O_y$. Without wishing to be bound by theory, it is believed that such high value of x can explain the room temperature superconductivity observed in this sample. The residual $Rb_2CO_3$ is well seen between the crystallites and can explain the high residual resistance observed in these early samples.

Figure 13:
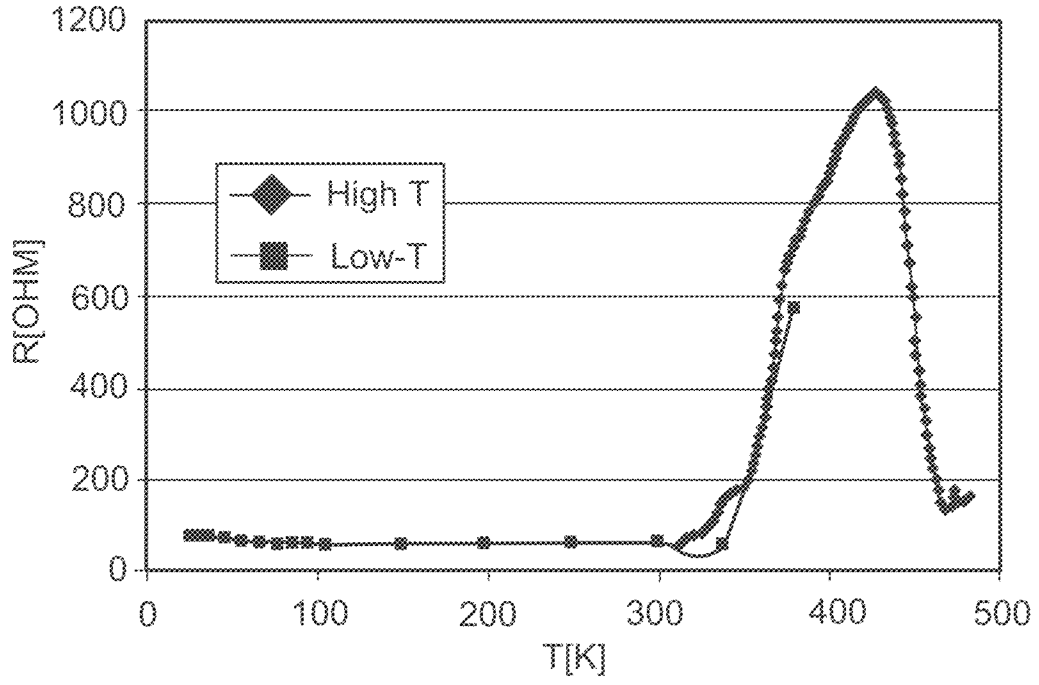
FIG. 13 is a graph showing the temperature dependence of the resistance of the same sample used to obtain the results shown in FIG. 12.

FIG. 13 shows the temperature dependence of the resistance of this sample. The resistance was measured by the four probes method. Contacts were made to the sample by using silver paste and wire bonding. The High-T curve represents high temperature measurements in a vacuum oven. The Low-T curve represents low temperature measurements in liquid helium cooled probe station. As shown in FIG. 13, this sample exhibited a superconducting transition onset at a temperature of about 400K. The resistance dropped by two orders of magnitude when the sample was cooled down to room temperature. A constant residual resistance of about 10 ohms persisted from room temperature to a temperature of 20K. This phenomenon of residual resistance is well known for polycrystalline samples as the conductivity is limited by weak links between the crystallites. According to our model, the rise in resistance when the sample was cooled from 500K to 400K is believed to be due to the opening of a semiconductor energy gap. Another example for such a rise in resistance with cooling down before the superconducting transition is in underdoped HTS Bi2201.

Figure 14:
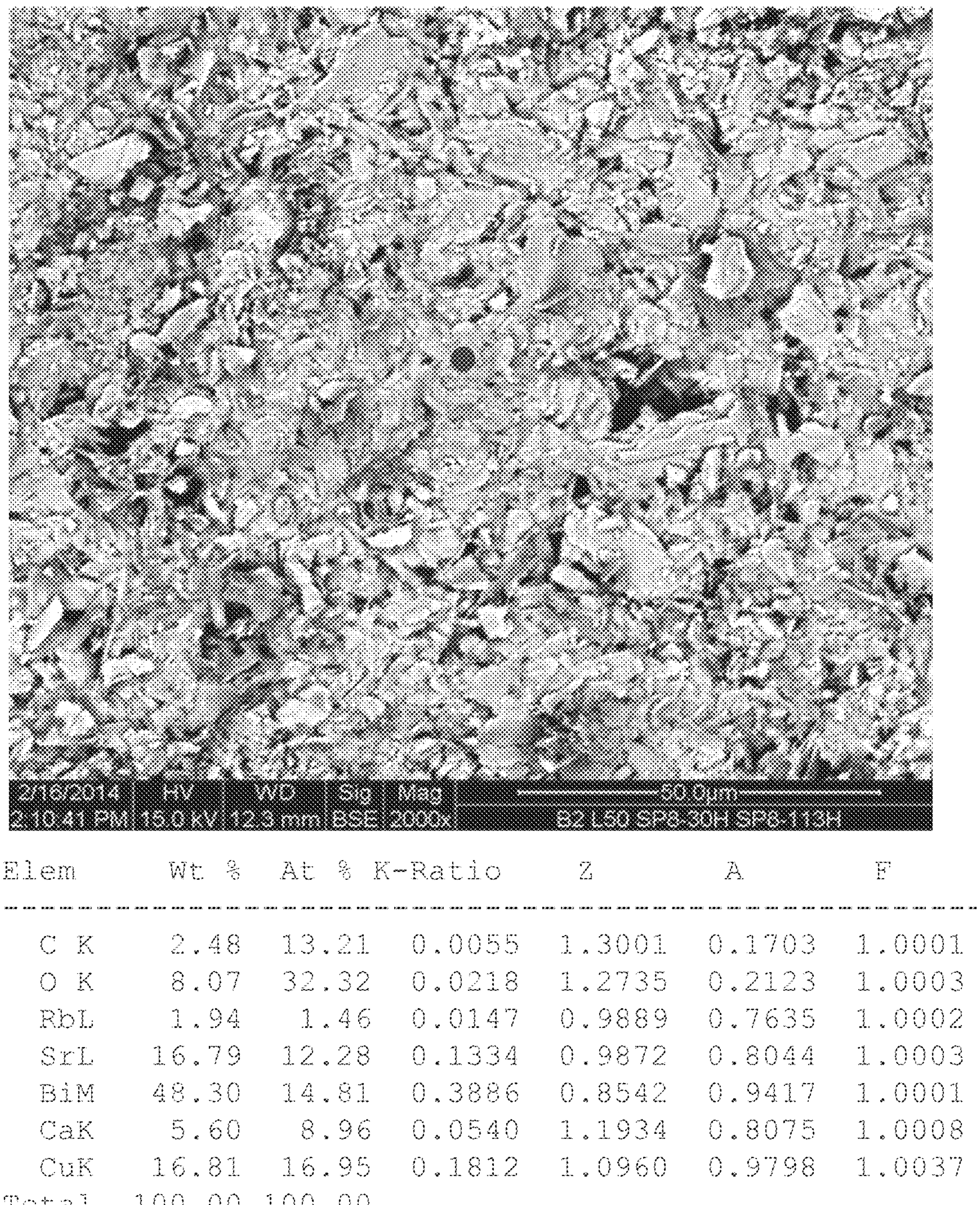
FIG. 14 is a SEM micrograph with EDS analysis of a second sample in the rubidium family.

Example 5: Synthesis and Properties of a Second HTS Sample in the Rubidium Family FIG. 14 shows a SEM micrograph with EDS analysis of another sample belonging to the rubidium family and containing a compound of $Bi_2(Rb_xSr_{1-x})_2CaCu_2O_y$. The sample was synthesized by a similar method to the one described in Example 4 except that the ingredients were sintered first for 30 hours at 800-820° C., and followed by regrinding the product and a second sintering for 113 hours at 800-820° C. Measurements were done on Environmental Scanning Electron Microscope (ESEM) Quanta 200 (FEI). The system included an EDS system for quantitative analysis of the various elements present in the sample. The electron beam was focused at the red spot. The table in the figure shows the atomic fraction and the weight fraction of the different elements obtained from the EDS analysis. The results show that the atomic ratio of Rb increased from 0% to about 1.46%, indicating Rb was incorporated into the crystal lattice. In addition, the results show that there was a decrease in the atomic ratio of Sr from a theoretical value of about 17% (i.e., the same as Cu's atomic ratio) to about 12.28% and a slight increase in the atomic ratio of Ca from about 8.5% (i.e., half of Cu's atomic ratio) to about 8.96%, which may suggest a small incorporation of Ca at the Sr site. It is believed that this example had a low incorporation percentage of the alkali ion (x>0 but t=0).

Figure 15A:
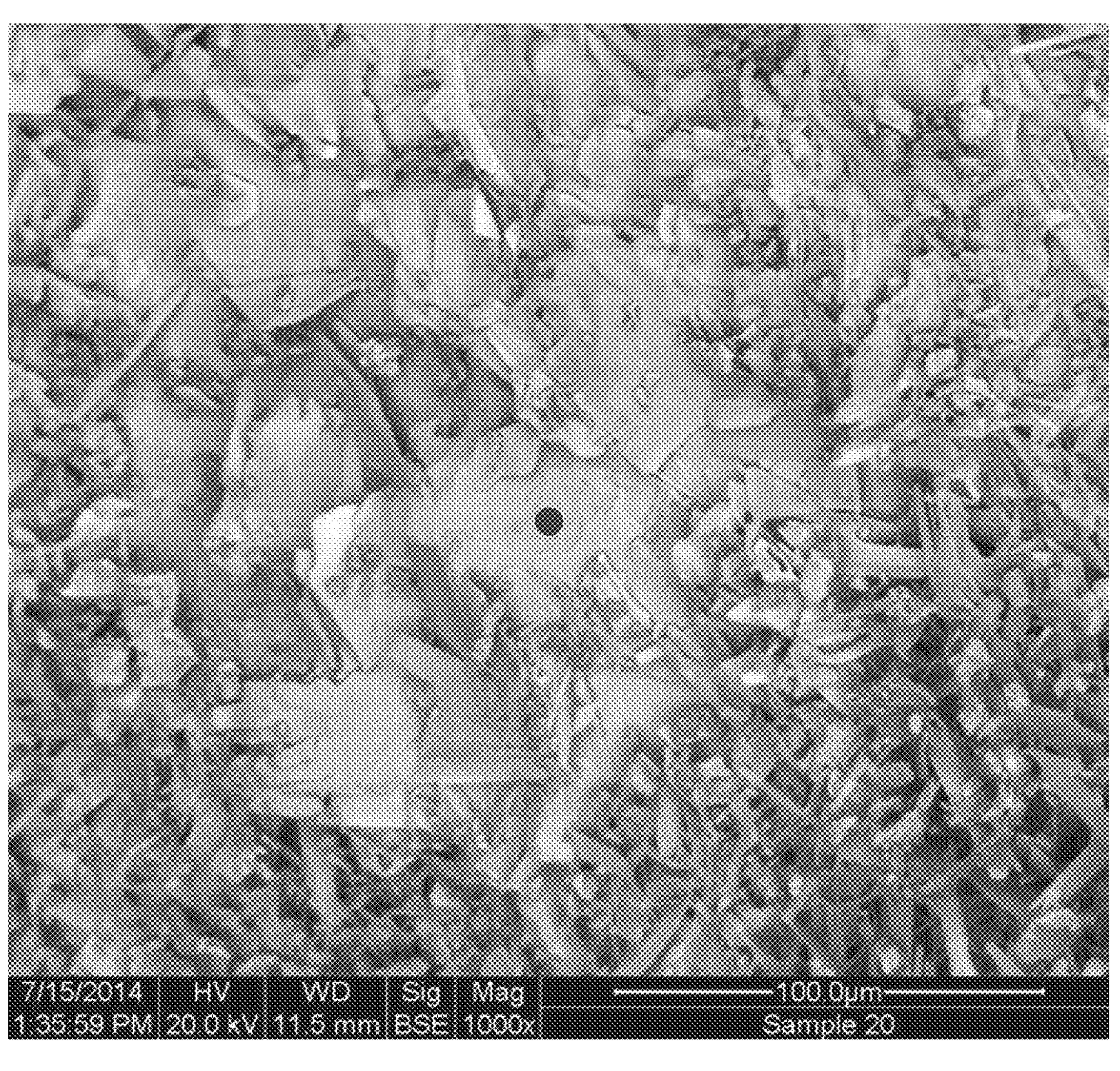
FIG. 15A shows a SEM micrograph with EDS analysis of a third sample in the rubidium family.

Example 6: Synthesis and Properties of a Third HTS Sample in the Rubidium Family FIG. 15A shows a SEM micrograph with EDS analysis of another sample of the rubidium family. The sample was synthesized by the method of example 1. The figure shows a crystallite of a new compound belonging to the rubidium family and including the $RbCaCuO_4$ cluster or the $Rb_2CuO_4$ cluster. Measurements were done on Environmental Scanning Electron Microscope (ESEM) Quanta 200 (FEI). The system includes an EDS system for quantitative analysis of the various elements present in the sample. The electron beam was focused at the red spot. The table in the figure shows the atomic fraction and the weight fraction of the different elements obtained from the EDS analysis. The results show that the atomic ratio of Rb increased from 0% to about 14.52%, indicating Rb was incorporated into the crystal lattice. The atomic fractions suggest the following formula: $Bi_4C_mSrRb_{2.2}Ca_{0.5}Cu_2O_y$. As the Bi atomic fraction corresponds to 4 Bi ions per unit cell, the crystal structure of this compound is believed to be an intergrowth of two different blocks of the family $Bi_2C_mSr_2CuO_y$ (C-Bi2201/C-Bi2201) with Sr being replaced by Rb and Ca. It is believed that the ordering of the superstructure Bi2201/Bi2201 requires some clear difference between the two Bi2201 blocks. Therefore, it is believed that the EDS result may suggest that the structure of this compound is the intergrowth of the following two structures: $Bi_2C_{m1}Rb_2CuO_y1/Bi_2C_{m2}SrRb_{0.2}Ca_{0.5}CuO_{y2}$. Without wishing to be bound by theory, such a high value of x can explain the room temperature superconductivity observed in this sample.

Figure 15B:
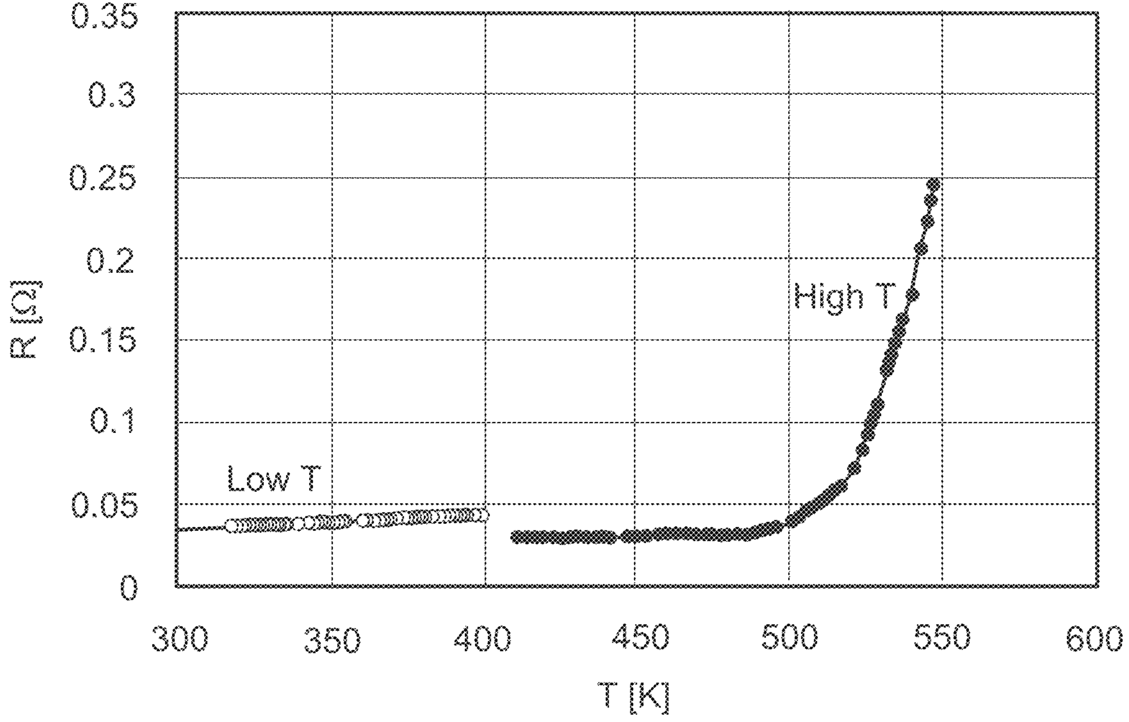
FIG. 15B shows the resistance vs. temperature graph for the sample used to obtain the results shown in FIG. 15A.

FIG. 15B shows the resistance vs. temperature graph for this sample. The measurement was done by the four probe method in a vacuum oven. This figure shows that this sample has a Tc above 550K and a residual resistance of 30 mΩ.

Figure 15C:
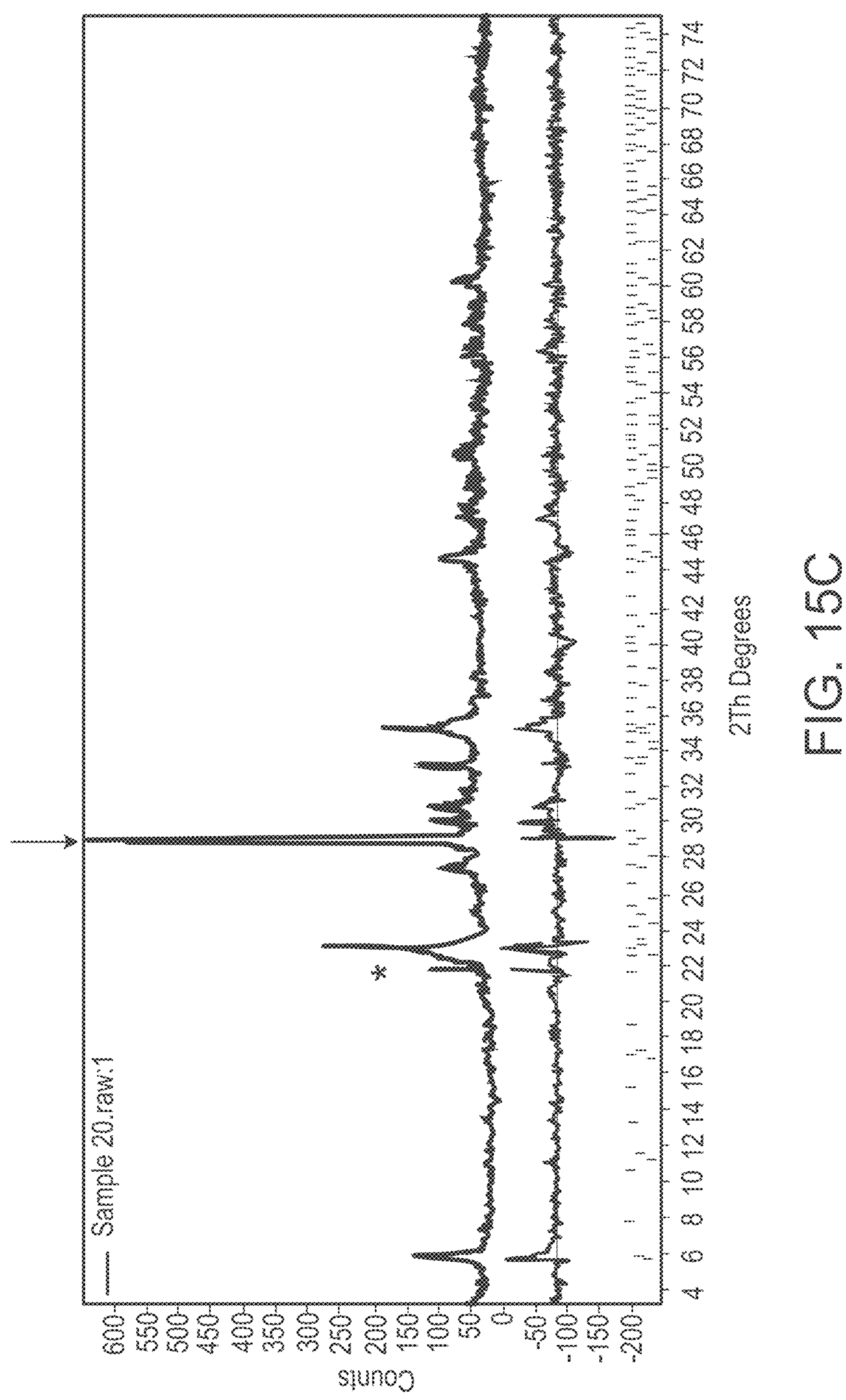
FIG. 15C is a graph showing XRD data of the sample used to obtain the results shown in FIG. 15A.

FIG. 15C shows XRD data for the rubidium HTS sample of FIG. 15A. The coarse line at the top is the raw data. The fine line at the top is the calculated curve obtained by Rietveld analysis. The coarse line at the bottom is the residual difference between the raw data and the calculated curve. The arrow shows the main peak affected by Rb incorporation. The analysis used the data obtained from the magnetic measurements and EDS that shows the existence of two different superconducting phases: a relatively low temperature superconductor phase assigned to the phase with little or no incorporation of Rb and a high temperature superconductor phase (with a Tc above room temperature) assigned to the phase with a high degree of Rb incorporation. The asterisk designates an unknown impurity.

Example 7: Synthesis and Properties of a HTS Sample in the Cesium Family

Figure 16:
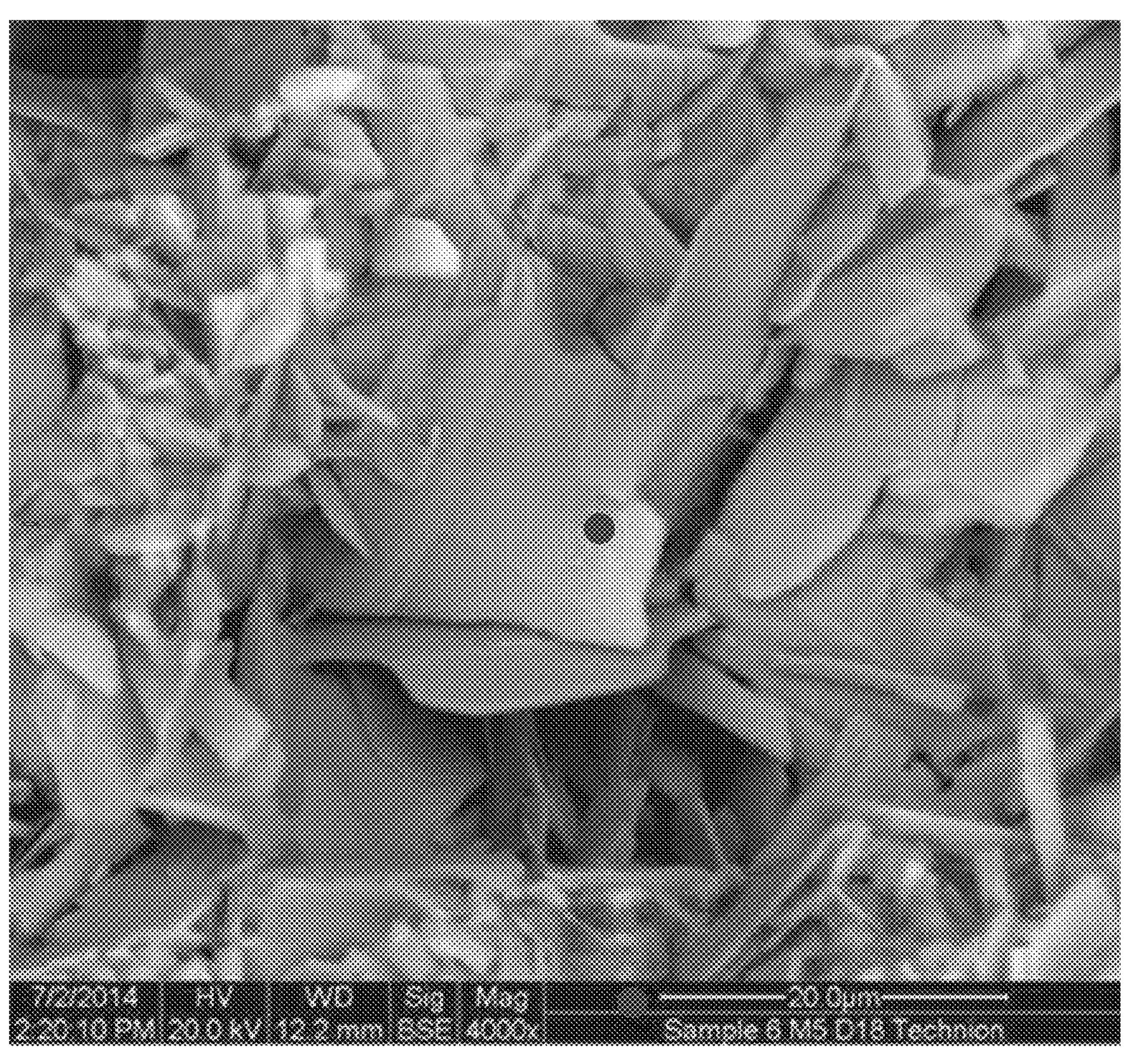
FIG. 16 is a SEM micrograph with EDS analysis of a portion of a sample in the cesium family.

A HTS sample in the cesium family was synthesized by the method described in Example 1. Specifically, the same Bi2212 precursor was used. The precursor was mixed and grinded with $Cs_2CO_3$ at a weight ratio of 1:1 (i.e., a molar ratio between $Cs_2CO_3$ and Bi2212 of 3:1) in an Ar filled glove box. The pressing was done in the glove box. FIG. 16 shows a SEM micrograph with EDS analysis of a crystallite of a new compound including the CsCaCuO4 cluster. Measurements were done on Environmental Scanning Electron Microscope (ESEM) Quanta 200 (FEI). The system includes an EDS system for quantitative analysis of the various elements present in the sample. The electron beam was focused at the red spot. The table in the figure shows the atomic fraction and the weight fraction of the different elements obtained from the EDS analysis. The results show that the atomic ratio of Cs increased from 0% to about 4.3%, indicating that Cs was incorporated into the crystal lattice. The atomic fractions suggest the following formula $Bi_3C_2Sr_4Cs_{0.7}CaCu_2O_y$.

Figure 17:
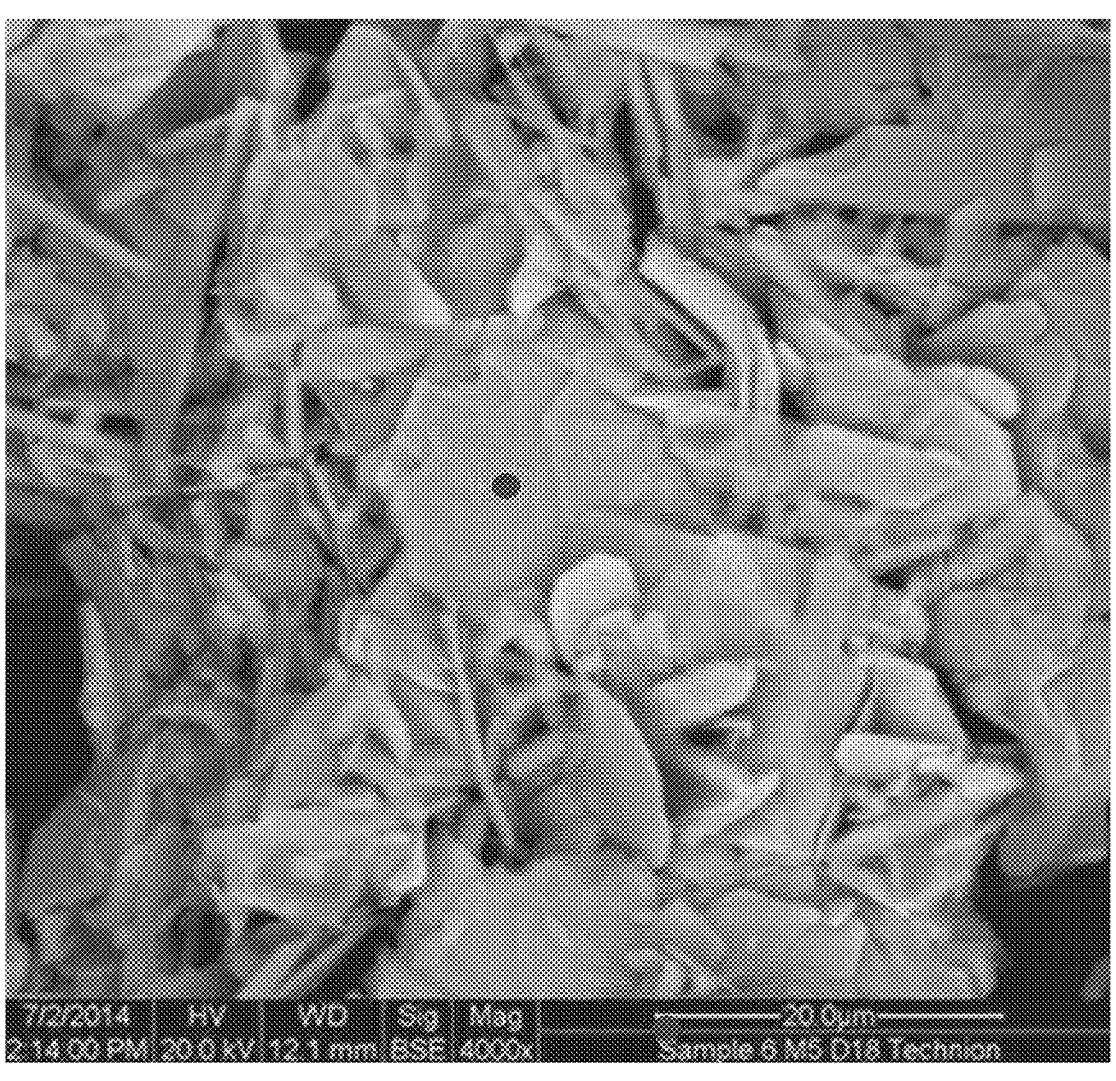
FIG. 17 is a SEM micrograph with EDS analysis at another portion of the same sample used to obtain FIG. 16.

FIG. 17 shows a SEM micrograph with EDS analysis of another crystallite of the same sample. The electron beam was focused a the red spot. The table shows the atomic fraction and the weight fraction of the different elements obtained from the EDS analysis. The results show that the atomic ratio of Cs increased from 0% to about 1.5%, indicating some Cs incorporation into the crystal lattice. The atomic fractions suggest the following formula: $Bi_3C_3Sr_4Cs_{0.3}Ca_{1.1}Cu_2O_y$. In this compound, x is smaller than 0.5.

Figure 18:
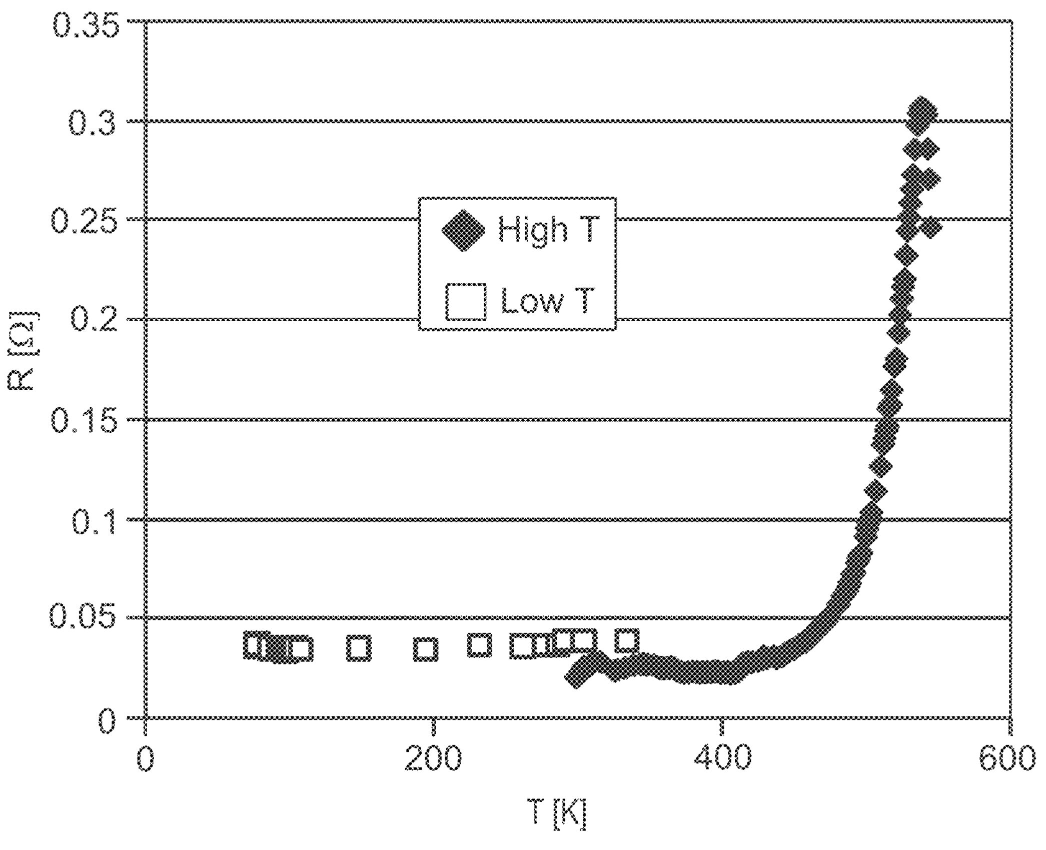
FIG. 18 is a graph showing the temperature dependence of the resistance of the same sample used to obtain FIGS. 16 and 17.

FIG. 18 shows the temperature dependence of the resistance of this sample. The high temperature measurements were done in a vacuum oven and the low temperature measurements were done in a liquid nitrogen cooled probe station. The residual resistance from room temperature to 80K was 30 mΩ. Low residual resistance samples belonging to the three alkali metal families were obtained and their temperature dependence of the resistance was measured. Their average residual resistance from room temperature to 100K was 30-50 milli-ohms, with the lowest residual resistance being 10 milli-ohms. These values are comparable to the residual resistance measured at 20K from standard YBCO produced by the inventor.

Figure 19:
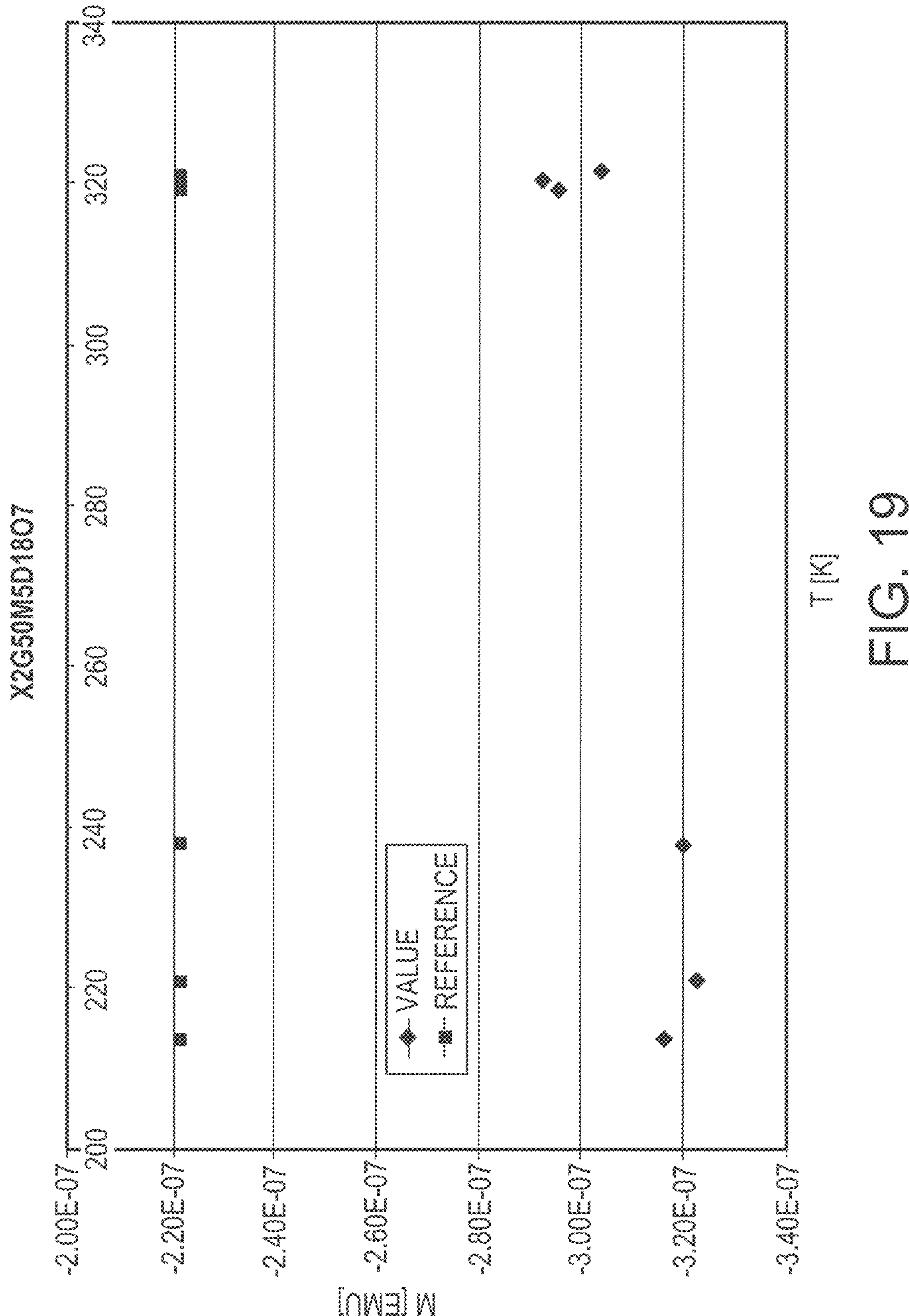
FIG. 19 is a graph showing the magnetic moment as a function of temperature for the same sample used to obtain FIGS. 16 and 17.

FIG. 19 shows the magnetic moment as a function of temperature for the cesium HTS sample above. The measurement was made on a commercial Cryogenic SQUID system. The sample was held in a gelatin capsule in a plastic straw. The magnetic field in this measurement was kept at 1T. As shown in FIG. 19, the magnetic moment of this compound was negative, indicating diamagnetic response. The square dots represent a reference response measured from the sample holder. As shown in the figure, the diamagnetic response of the cesium HTS sample was well below the reference response, indicating a true diamagnetic response.

As shown in FIG. 19, the diamagnetic response of the cesium HTS sample persisted up to a temperature of 320K, the maximum allowed temperature of the measurement system. As discussed above, the superconducting transition occurred at about 400K and therefore is not observed in FIG. 19. However, diamagnetic response of the cesium HTS sample at room temperature is apparent.

Figure 20:
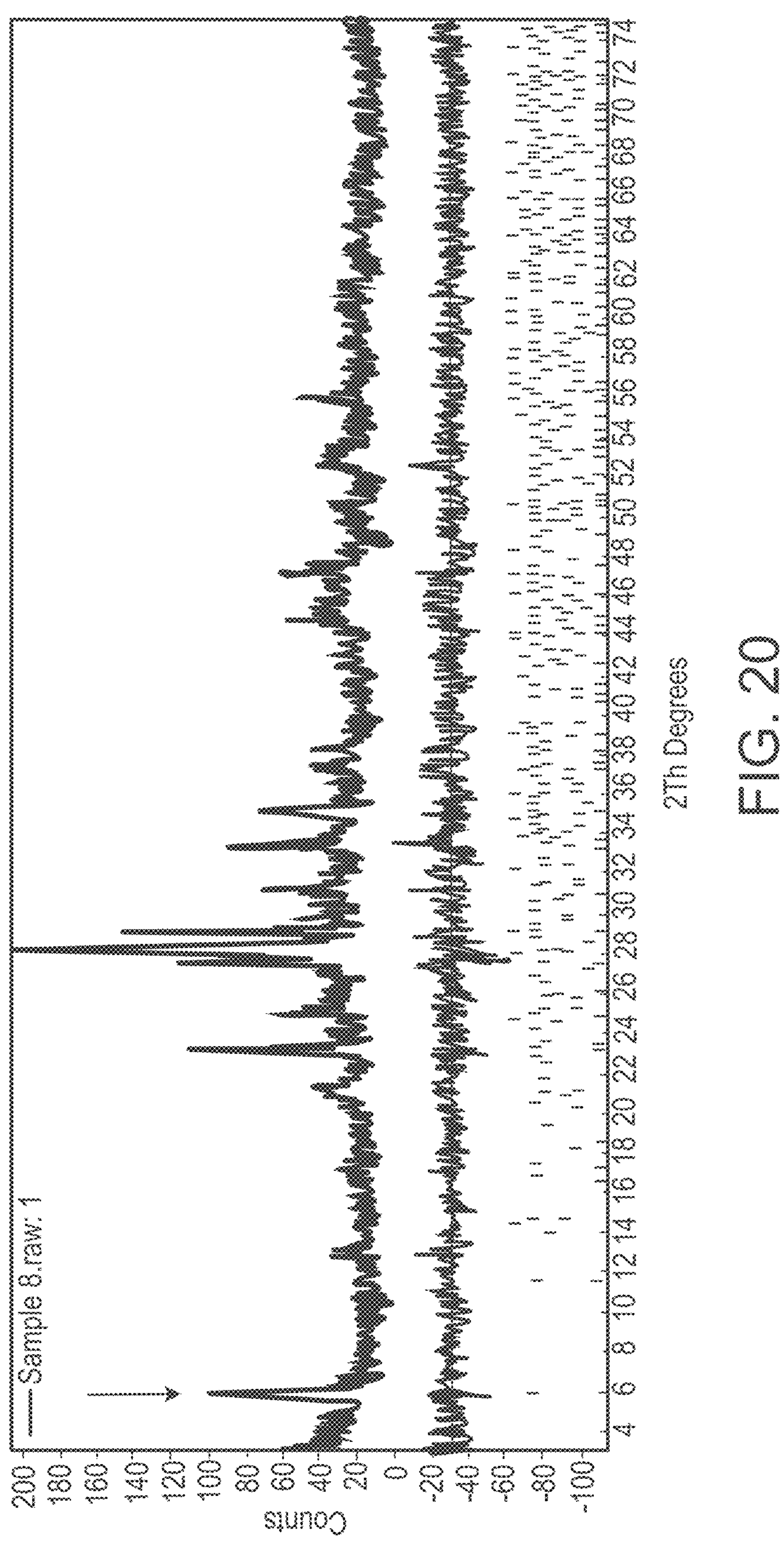
FIG. 20 is a screen shot showing XRD data including Rietveld refinement for the same sample used to obtain FIGS. 16 and 17.

FIG. 20 shows XRD data for the cesium HTS sample. The coarse line at the top is the raw data. The fine line at the top is the calculated curve obtained by Rietveld analysis. The coarse line at the bottom is the residual difference between the raw data and the calculated curve. The arrow shows the main peak affected by Cs incorporation. The analysis used the data obtained from the magnetic measurements and EDS that shows the existence of two different superconducting phases: a low temperature superconductor assigned to the phase with little or no incorporation of Cs and a room temperature superconductor phase assigned to the phase with a high degree of Cs incorporation.

Example 8: Ion Replacement: Members of the Rubidium and the Potassium Families

Figure 21:
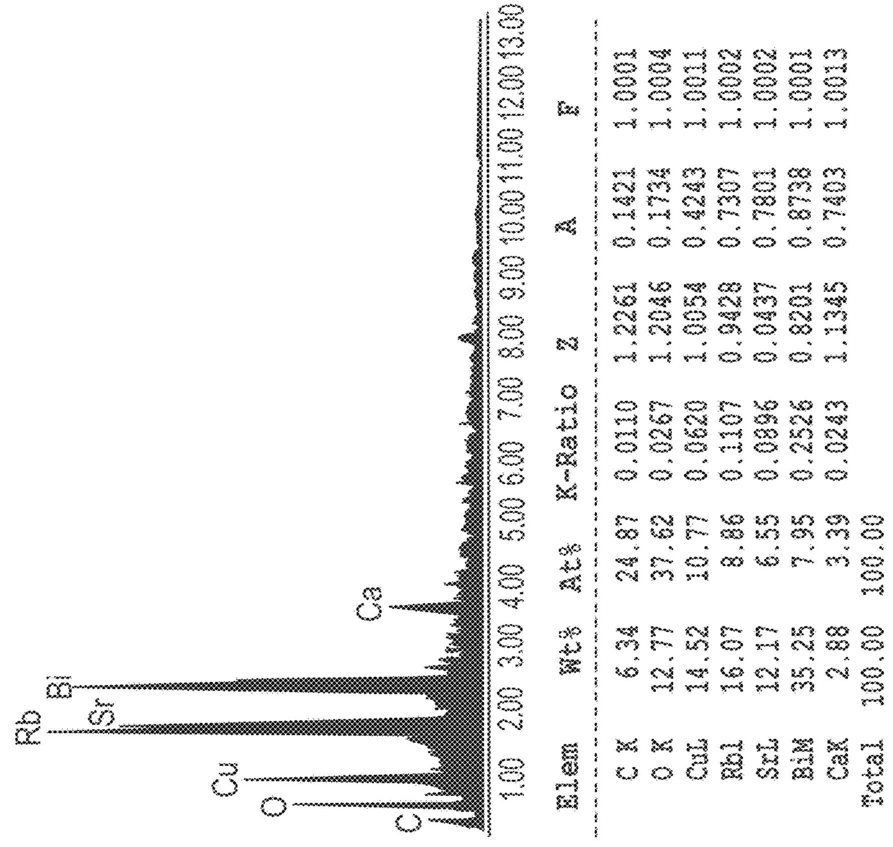
FIG. 21 is a SEM micrograph with EDS analysis of a sample in the rubidium family.
Figure 21:

FIG. 21 shows a SEM micrograph with EDS analysis of another sample of the rubidium family. The sample was synthesized by a method similar to Example 1. The weight ratio between $Rb_2CO_3$ and the Bi2212 precursor was 8:2. The grinded mixture was heated to 750° C. and dwelled there for 4-6 hours. The mixture was then heated to 810° C. and sintered for 150-300 hours. The long sintering time allowed for diffusion and ion replacement of Rb for Sr. FIG. 21 shows a crystallite of a new compound belonging to the rubidium family and including the $RbCaCuO_4$ cluster or the $Rb_2CuO_4$ cluster. Measurements were done on Environmental Scanning Electron Microscope (ESEM) Quanta 200 (FEI). The system included an EDS system for quantitative analysis of the various elements present in the sample. The electron beam was focused at the black spot. The table in FIG. 21 shows the atomic fraction and the weight fraction of the different elements obtained from the EDS analysis at that spot. The results show that the atomic ratio of Rb increased from 0% to about 9%, indicating Rb was incorporated into the crystal lattice. The atomic fractions suggest the following formula: $BiC_mSr_2Rb_2CaCu_2O_y$. Therefore, the EDS results suggest x>0.5. Without wishing to be bound by theory, it is believed that such a high value of x can explain the room temperature superconductivity observed in this sample.

Figure 22A:
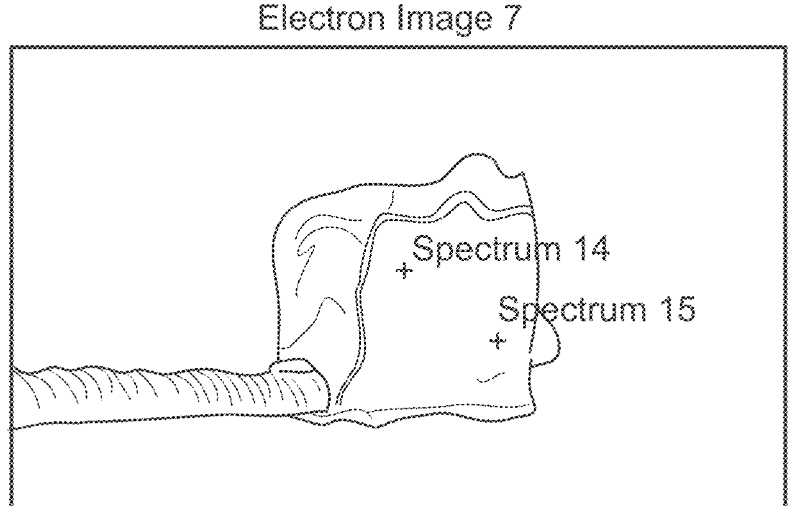
FIG. 22A is a SEM micrograph showing a crystallite hanging on a probe in an FEI Helios dual beam system.
Figure 22B:
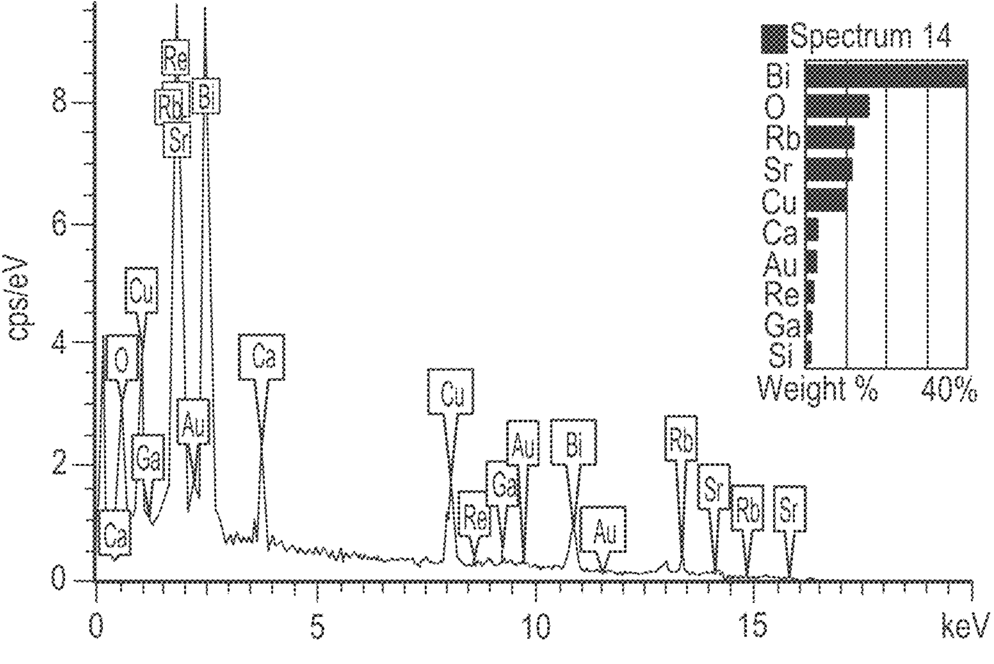
FIG. 22B is the spectrum showing the result of the EDS analysis at spot number 14 in FIG. 22*a*.

FIG. 22A shows such a crystallite hanging on a probe in an FEI Helios dual beam system. The system combined a Focused Ion Beam (FIB) with an electron beam (e-beam). The small crystal was identified by the e-beam, extracted by the FIB and the probe, cleaned with FIB on the probe, and analyzed by the e-beam and EDS. The spectrum in FIG. 22B is the result of the EDS analysis at spot number 14 shown in FIG. 22A. The EDS results suggest the following general formula $BiC_m(Rb_xSr_{1-x})_4CaCu_2O_y$. The weight fractions of Sr and Rb are almost identical, showing x~0.5. Without wishing to be bound by theory, it is believed that such a high value of x can explain the room temperature superconductivity observed in this sample.

Figure 23:
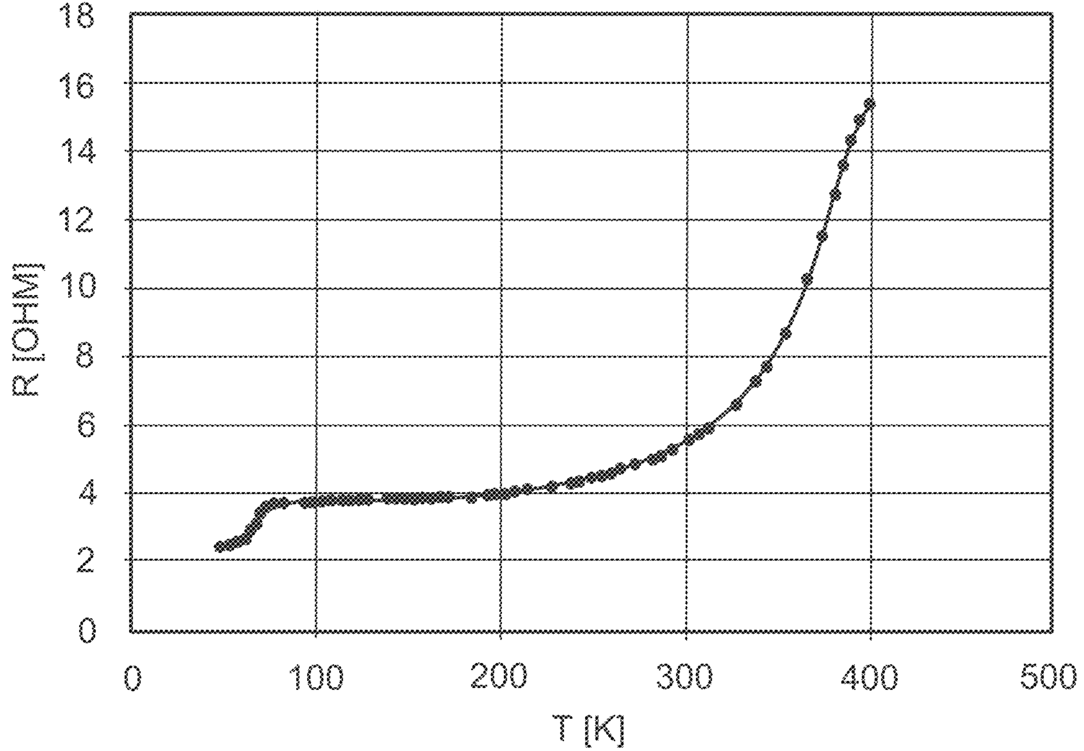
FIG. 23 is a graph showing a resistance-temperature curve of a sample grown at the same conditions under which the crystallite shown in FIG. 22A was obtained.

FIG. 23 shows the resistance vs. temperature graph for a sample made by the same method as the sample shown in FIG. 21. The measurement was done by the three probe method in a Quantum Design PPMS system. A transition temperature at about 80K indicates the presence of residual precursor Bi2212. FIG. 23 shows that this sample has a Tc above 350K. The residual resistance is high because of the three probe method used here.

Figure 24:
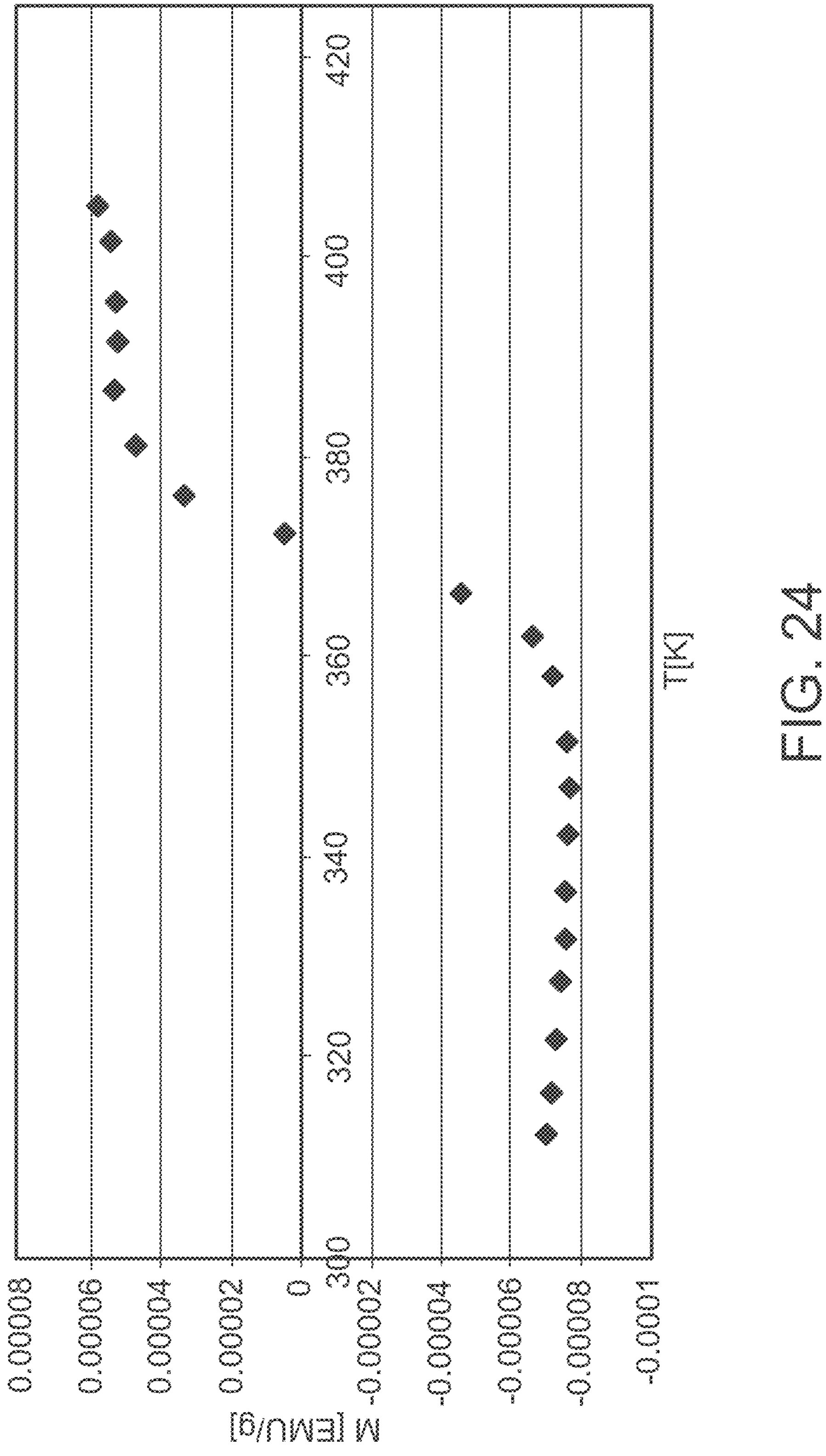
FIG. 24 is a graph showing a magnetic moment-temperature curve of a sample grown at the same conditions under which the crystallite shown in FIG. 22A was obtained.

FIG. 24 shows the magnetic moment vs. temperature graph for a sample made by the same method as the sample shown in FIG. 21. As can be seen in this figure, the sample shows a diamagnetic response (negative magnetic moment) below room temperature. The magnetic moment becomes positive at a temperature (i.e., Tc) of about 370K, well above room temperature. The measurement was done on a Quantum Design MPMS system equipped with an oven for high temperature measurements.

Figure 25A:
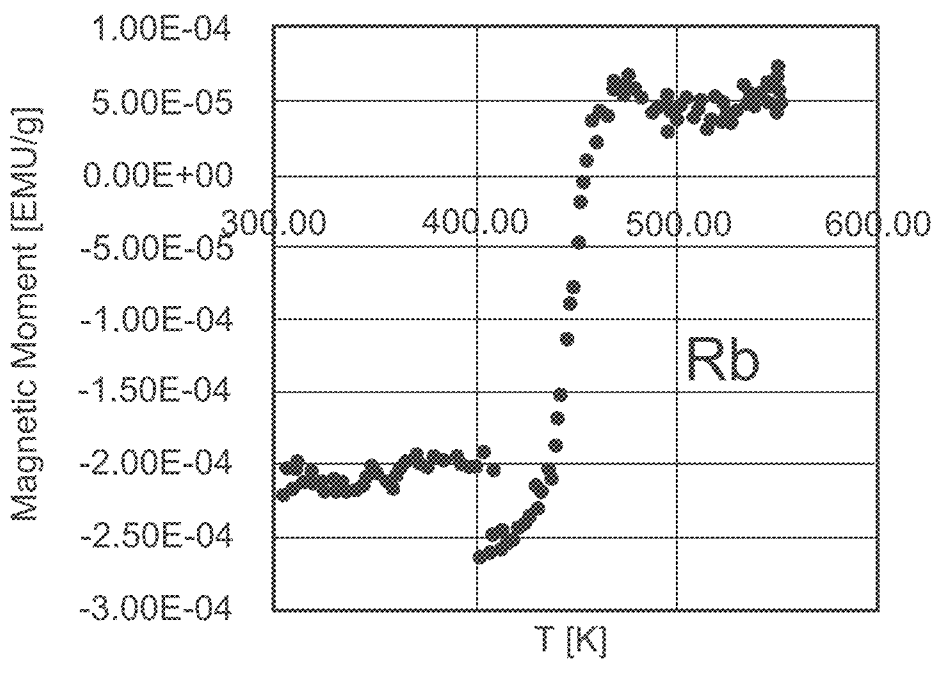
FIG. 25A is a graph showing the magnetic moment vs. temperature of a sample of the rubidium family grown by the long term ion exchange method.

FIG. 25A shows the magnetic moment vs. temperature graph for a sample of the rubidium family, grown at the same conditions as the sample shown in FIG. 21, but for a longer sintering time of 180 hours. EDS measurements on the crystals showed the atomic ratio Bi:Sr:Rb:Ca:Cu to be approximately 2:2:2:1:2. The magnetic measurement was done on the same system as the system used to obtain the results shown in FIG. 24. As can be seen in FIG. 25A, the transition is sharper, indicating a Tc of about 450K.

Figure 25B:
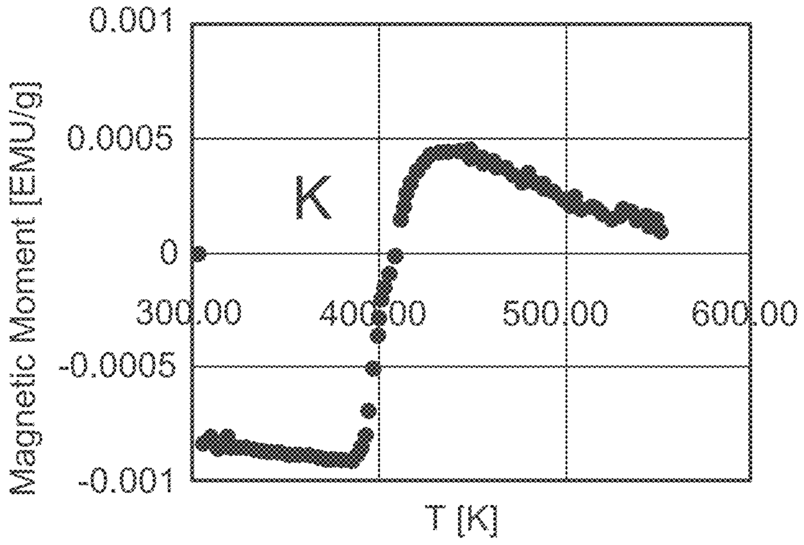
FIG. 25B is a graph showing the magnetic moment vs. temperature of a sample of the potassium family grown by the long term ion exchange method.

FIG. 25B shows the same type of magnetic measurement on a sample of the potassium family grown by the same method as the sample shown in FIG. 21, except that the weight ratio between $K_2CO_3$ and Bi2212 was 2:8 and the dwelling time at 810° C. was 180 hours. EDS measurements on the crystals showed the atomic ratio Bi:Sr:K:Ca:Cu to be approximately 2:2:2:1:2. The transition here indicates a Tc of about 400K. It should be noted that such a difference in Tc between the rubidium compound and potassium compound is in accordance with the model described herein, where the larger ionic radius of rubidium creates a lower overlap between the oxygen p orbitals, measured as a lower energy difference in the calculation. Such a lower overlap creates a more shallow band at the Fermi level and therefore larger $\rho_2(q)$, which results in a higher Tc.

FIG. 26 shows the results of small crystal diffraction of a sample belonging to the rubidium family. The left panel shows one of the frames. The measurements were performed on ID29 beam of the European Synchrotron Radiation Facility (ESRF). EDS and X-Ray Fluorescence (XRF) on the small crystals showed the same composition as in FIGS. 21 and 22. The right panel shows the result of refinement of the structure. The square in the middle defines the cluster described herein. Cu ions are located at the corners of the square and the oxygen ions are along the edges. The rubidium ion was found to be located just above the center of the square, replacing the Sr ion at the apex of the cluster, in accordance with the model described herein. The distances between the ions in the cluster were found to be typical of the cuprates, with the distance Cu—O being appx. 1.9 Å. The lattice parameters were found to be a=5.3880 (11)Å, b=5.3760(11)Å and c=15.484(3)Å, in accordance with a strained cuprate structure. The height of the Rb ion above the $CuO_2$ plane was found to be about 2.3 Å. For such a cluster, the model described herein predicts an overlap of less than 10 meV as an estimation of the narrow band dispersion. This value should be compared with the measured value of 40 meV band dispersion in Bi2212. Without wishing to be bound by theory, it is believed that such a low value of the band dispersion gives rise to a very high $\rho_2$ (q) that can explain the room temperature superconductivity observed in this sample.

Figure 27:
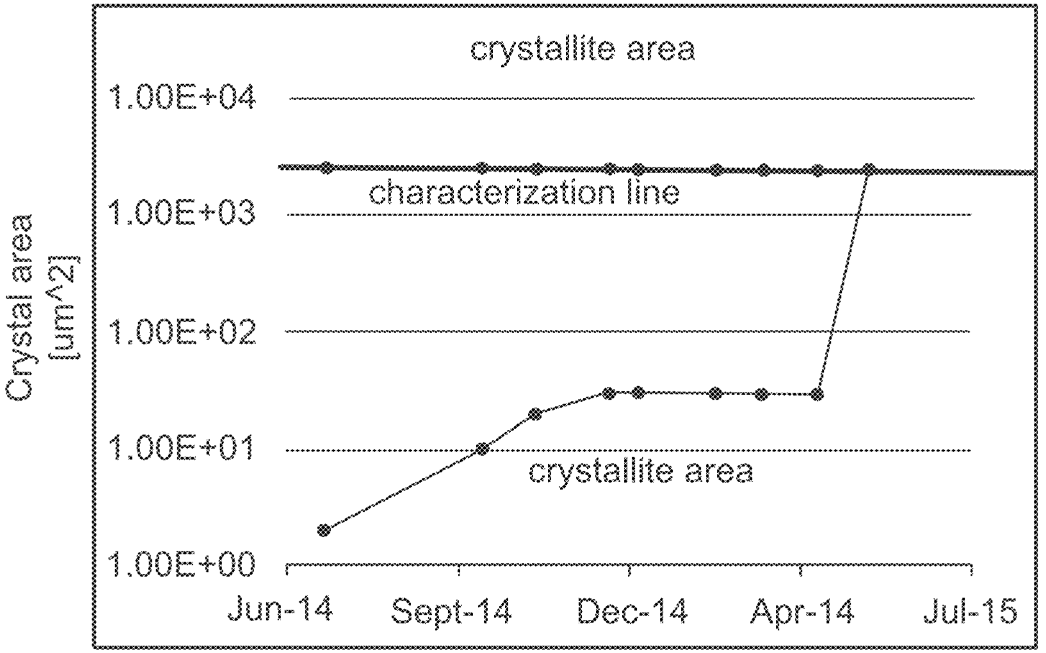
FIG. 27 shows the various crystal sizes obtained over a period of a year. The graph indicates a significant increase in the crystal size of HTS material.

FIG. 27 shows the various crystal sizes obtained over a period of a year. The graph indicates a significant improvement in the concentration crystal size of HTS material in the samples.

Example 9: Incorporation of Rb into an RCO Film Using ALD

A film with the target formula $(La,Rb)_2CuO_4$ (referred to as a RLCO film) was deposited onto an LAO substrate using ALD. The temperature and pulse lengths for the reactants are shown in Table 1:

TABLE 1

Reactant temperatures and pulse lengths for ALD deposition of RLCO films.

| Reactant | Temperature (° C.) | Pulse length (s) |
|---|---|---|
| $La(thd)_3$ | 185 | 3 |
| $Cu(acac)_2$ | 139 | 4 |
| RbO-t-Bu | 175 | 13 |
| $H_2O$ | | 2 |
| $O_3$ | | 3 |

The pulse sequence for this ALD process was 7La-1Cu-1Rb-1Cu-7La-1Rb-1Cu, with a 3 second purge in each cycle. The deposition temperature in the ALD reactor was 210° C. and the pressure in the reactor was 3.7 mBar.

The elemental composition of the resulting layer was measured by X-Ray Fluorescence (XRF). The results are shown in Table 2, and indicate a nominal composition of $La_{1.82}Rb_{2.15}CuO_x$, which is reasonably close to the target composition of $(La,Rb)_2CuO_4$. These results indicate successful incorporation of Rb into the ALD-deposited film. The film had a thickness ranging from 112 nm to 253 nm, depending on the position in the deposition chamber. The growth rate per cycle of the film ranged from 1.1 Å/cycle to 2.5 Å/cycle. The film had a refractive index of about 1.6.

TABLE 2

Elemental composition of ALD-deposited RLCO film.

| Element | Mass % | Fraction |
|---|---|---|
| La | 51.3 | 0.365 |
| Rb | 34.9 | 0.433 |
| Cu | 13.8 | 0.201 |

Figure 32:
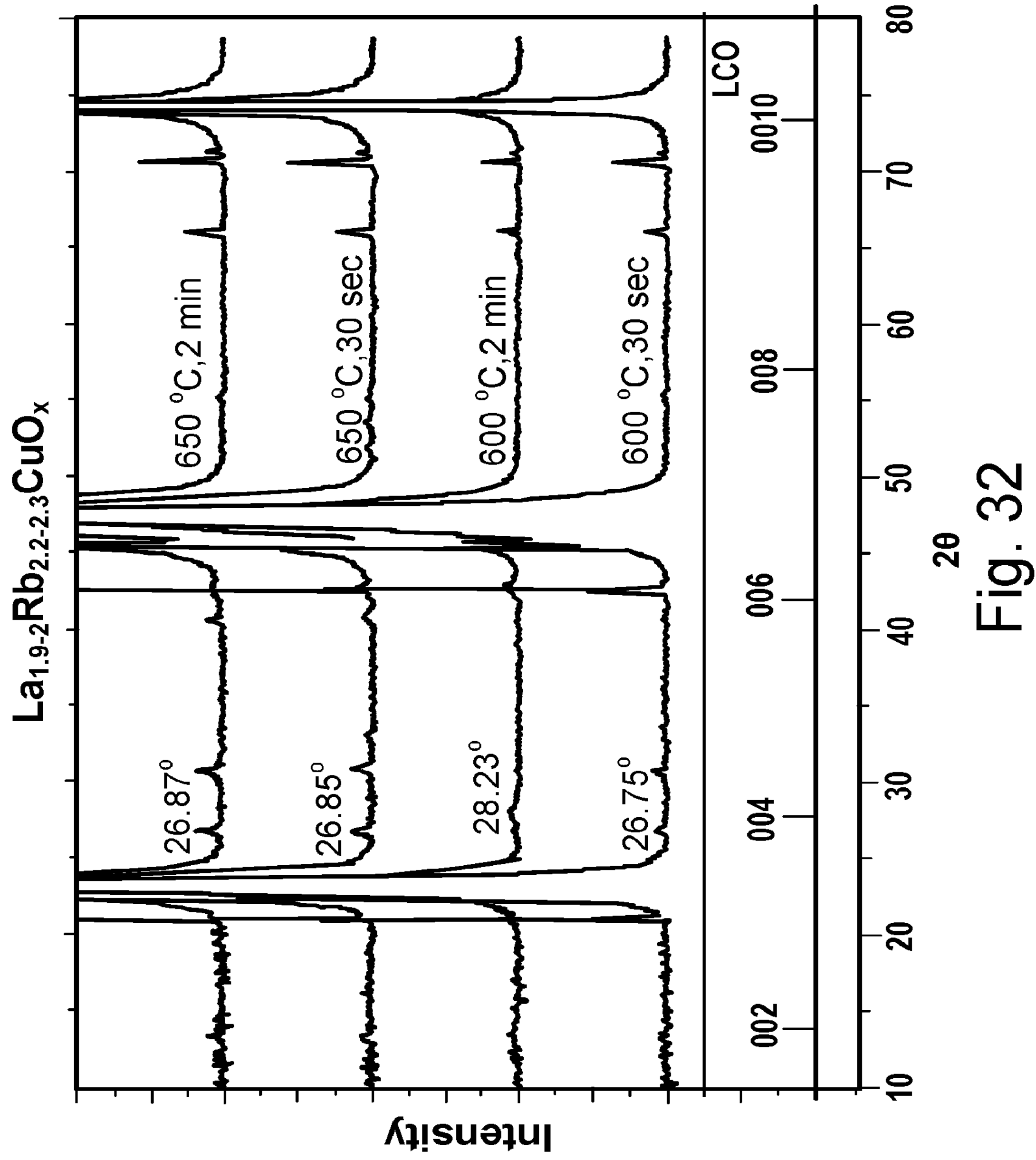
FIG. 32 shows X-ray diffraction (XRD) data for an ALD-deposited high temperature superconductor material.

Following elemental analysis, four samples were annealed to study the effect of post-deposition anneal on the crystallinity of the samples. Anneals were performed at 600° C. and 650° C., for 30 seconds and 2 minutes. All anneals were carried out in air at atmospheric pressure. FIG. 32 shows X-ray diffraction results of the four annealed samples, indicating a high degree of crystallinity.

The combination of the Rb incorporation and the high degree of crystallinity indicate that the ALD process and subsequent anneal described in this example are able to produce a crystalline material in which an alkali metal (here, Rb) is incorporated into the crystal structure in sites that would otherwise have been occupied by alkaline or rare earth metals (here, La).

Another RLCO film with the target formula $(La,Rb)_2CuO_4$ was deposited onto an LAO substrate using ALD with the same process parameters shown in Table 1, with a pulse sequence of 7La-2Cu-1Rb-2Cu, with a 3 second purge in each cycle. The deposition temperature in the ALD reactor was 210° C. and the pressure in the reactor was 3.7 mBar. Following ALD deposition, the film was annealed at 600° C. for 15 minutes in air in a rapid thermal processing (RTP) furnace with a ramp rate of 2° C. per second.

The elemental composition of the resulting layer, as measured by XRF, indicate a nominal composition of $La_{2.01}Rb_{5.93}CuO_x$, indicating successful incorporation of Rb into the ALD-deposited film. The film had a thickness ranging from 201 nm to 370 nm, depending on the position in the deposition chamber. The growth rate per cycle of the film ranged from 2.0 Å/cycle to 3.7 Å/cycle. The film had a refractive index of about 1.5.

Figure 33:
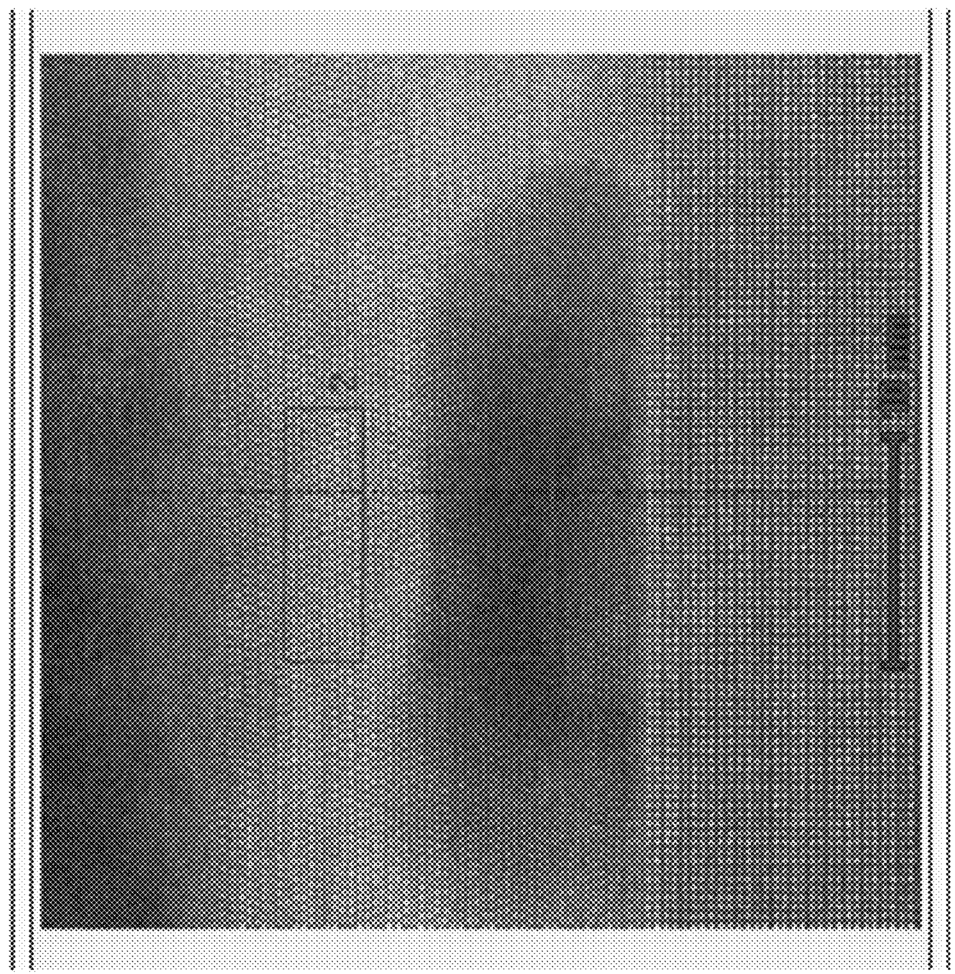
FIG. 33 is a TEM micrograph of an ALD-deposited high temperature superconductor material.
Figure 34A:
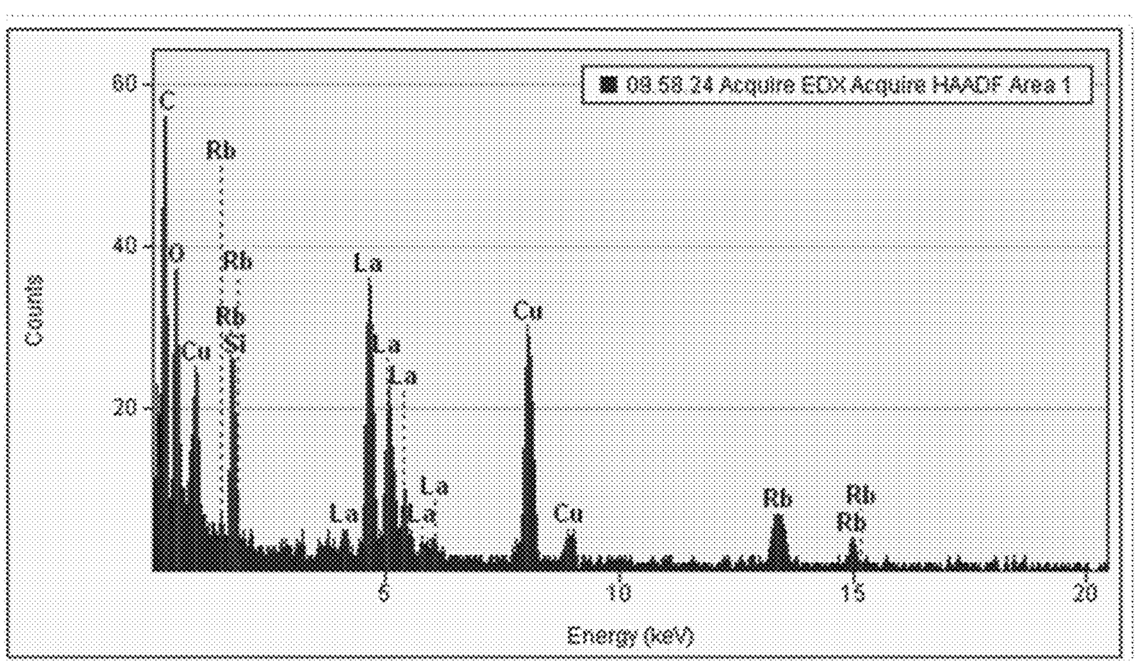
FIGS. 34A and 34B are energy-dispersive X-ray (EDX) spectra of regions of the material shown in FIG. 33.
Figure 34B:
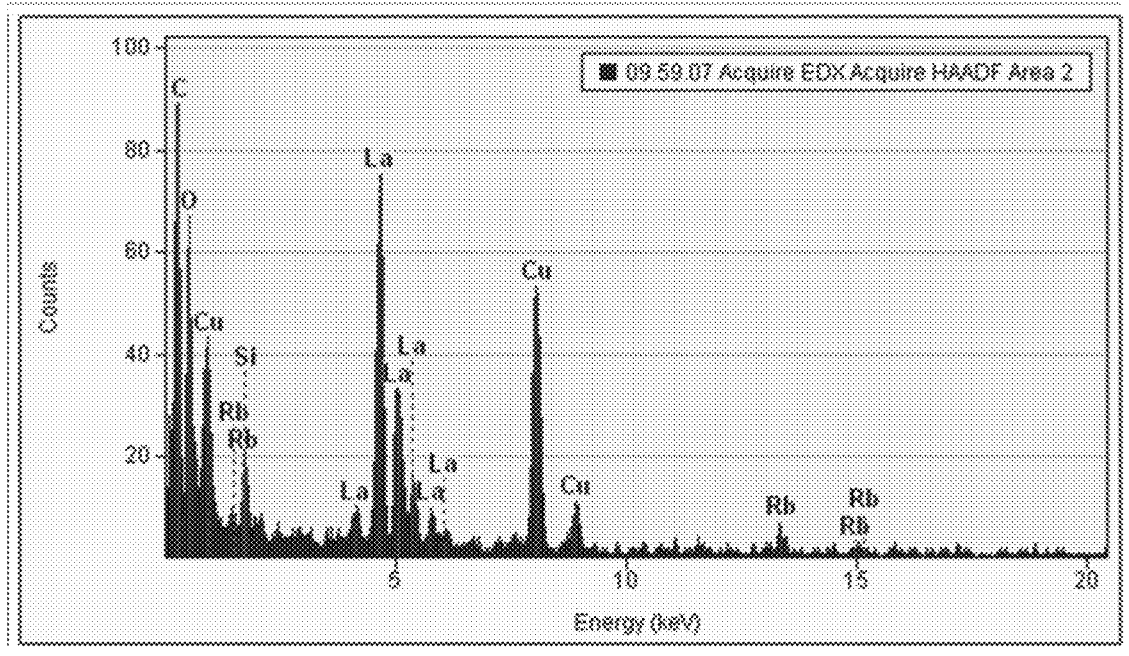

Referring to FIG. 33, a TEM image shows distinct crystalline regions in the ALD-deposited RLCO film, with darker regions indicating a larger fraction of Rb incorporation. The TEM image shows that the crystallinity of the film persists in the darker regions, indicating that Rb has been incorporated into the crystal lattice of the metal oxide film. These results are confirmed by Energy-dispersive X-ray (EDX) spectra taken at Regions 1 and 2, shown in FIGS. 34A and 34B, respectively. As can be seen from the EDX spectra, Region 1 (a darker region in the TEM image) contains a significant amount of Rb, as shown by the presence of both 1 and k peaks in the EDS spectrum. Region 2 (a lighter region) contains much less Rb. These results confirm successful incorporation of Rb into the crystalline lattice of the ALD-deposited RLCO film.

Example 10: Synthesis of Superconducting Materials Using ALD

High temperature RLCO superconductor materials with the target formula $(Rb_xLa_{1-x})_2CuO_4$ were synthesized using atomic layer deposition at 230° C. on an LAO substrate in accordance with the pseudocode shown in FIG. 35. The film was post annealed at 650° C. for 10 minutes. The list of depositions is summarized in Table 3.

TABLE 3

Compositions formed by ALD deposition.

| Composition | Precursors | Growth (Å) per cycle |
|---|---|---|
| La—O | $La(thd)_3$, 185° C.<br>$O_3$ | |
| La—O | $La(thd)_3$, 185° C.<br>$O_3$ | |
| Cu—O | $Cu(acac)_2$, 135° C.<br>$O_3$ | |
| La—Cu—O | $La(thd)_3$, 185° C.<br>$Cu(acac)_2$, 140° C.<br>$O_3$ | |
| 2La—Cu—O | $La(thd)_3$, 185° C.<br>$Cu(acac)_2$, 135° C.<br>$O_3$ | 0.37 ± 0.01 |
| 3La—Cu—O | $La(thd)_3$, 185° C.<br>$Cu(acac)_2$, 135° C.<br>$O_3$ | 0.34 ± 0.01 |
| 5La—2Cu—O | $La(thd)_3$, 185° C.<br>$Cu(acac)_2$, 135° C.<br>$O_3$ | 0.32 ± 0.02 |
| 17La—5Cu | $La(thd)_3$, 185° C.<br>$Cu(acac)_2$, 135° C. | 0.40 ± 0.01 |
| 17La—1Rb—5Cu—1Rb | $La(thd)_3$, 185° C.<br>$Cu(acac)_2$, 135° C.<br>$RbO^tBu$, 185° C.<br>$O_3$ | 0.60 ± 0.02 |

TABLE 3-continued

| Compositions formed by ALD deposition. | | |
|---|---|---|
| Composition | Precursors | Growth (Å) per cycle |
| 17La—2Rb—5Cu—2Rb | $La(thd)_3$, 185° C.<br>$Cu(acac)_2$, 135° C.<br>$RbO^tBu$, 185° C.<br>$O_3$ | 0.92 ± 0.03 |
| 17La—3Rb—5Cu—3Rb | $La(thd)_3$, 185° C.<br>$Cu(acac)_2$, 135° C.<br>$RbO^tBu$, 185° C.<br>$O_3$ | |
| 17La—4Rb—5Cu—4Rb | $La(thd)_3$, 185° C.<br>$Cu(acac)_2$, 135° C.<br>$RbO^tBu$, 185° C.<br>$O_3$ | 1.61 ± 0.02 |

The Rb content was controlled by varying y (the number of Rb-pulses in the layers pre- and post-Cu). Samples with y=1, 2, 3, and 4 were prepared.

A pulsed composition of 17:4:5:4 for La:Rb:Cu:Rb provided a composition close to the desired phase.

A region of crystalline material was selected for further evaluation, including I-V measurements at room temperature and transmission electron microscope (TEM) micrography.

Figure 36A:
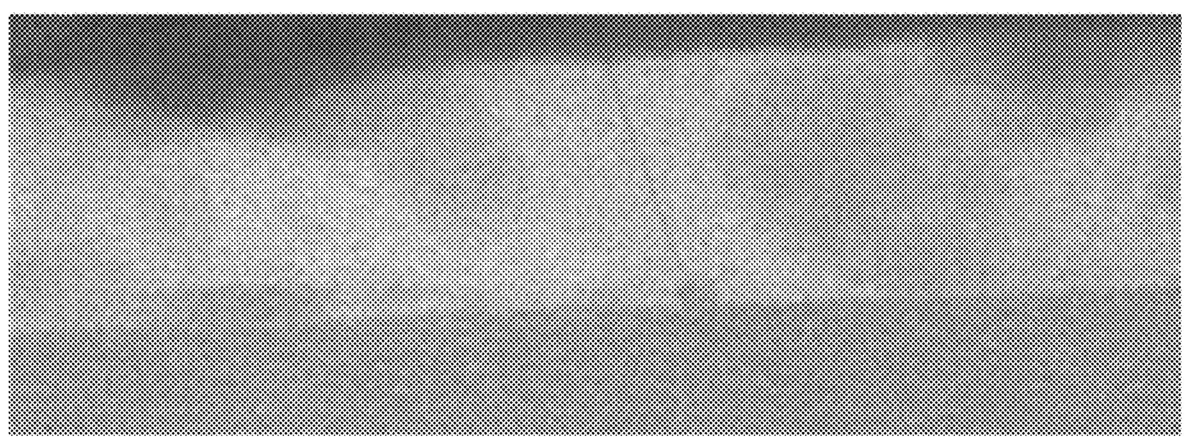
FIGS. 36A and 36B are low and high magnification TEM micrographs, respectively, of a section of high temperature superconductor material sample.
Figure 36B:
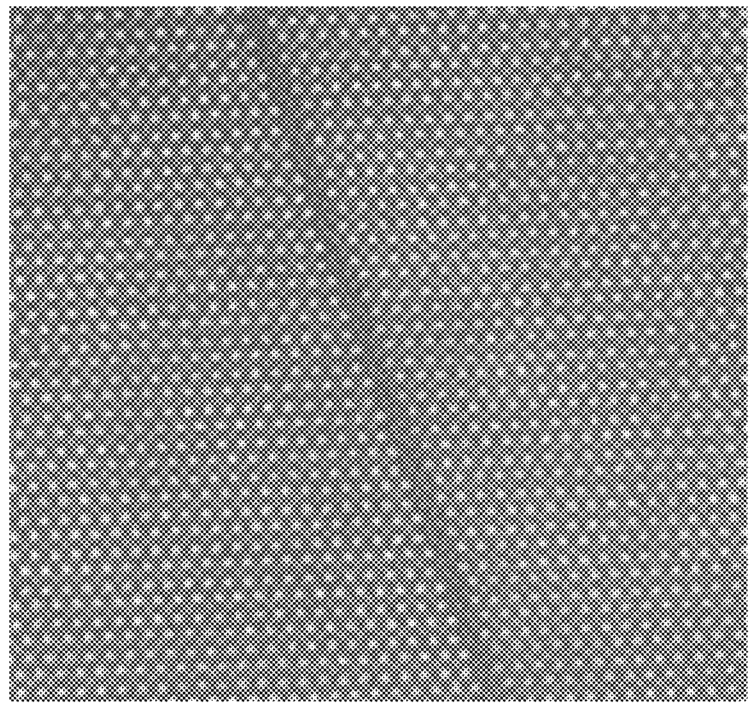

FIGS. 36A and 36B show TEM micrographs of this material. FIG. 36A shows the material at relatively low magnification. The lighter colored region is the thin film and the darker colored region beneath is the substrate. FIG. 36B shows the thin film at higher magnification. A defect in the crystalline structure, running diagonally through the image, is clearly visible. Individual atoms are dearly visible as bright centers. It is evident from the figure that this intrinsic device is composed of an array of epitaxial regions with very fine weak links between them, with tunneling from one region to another.

Figure 37:
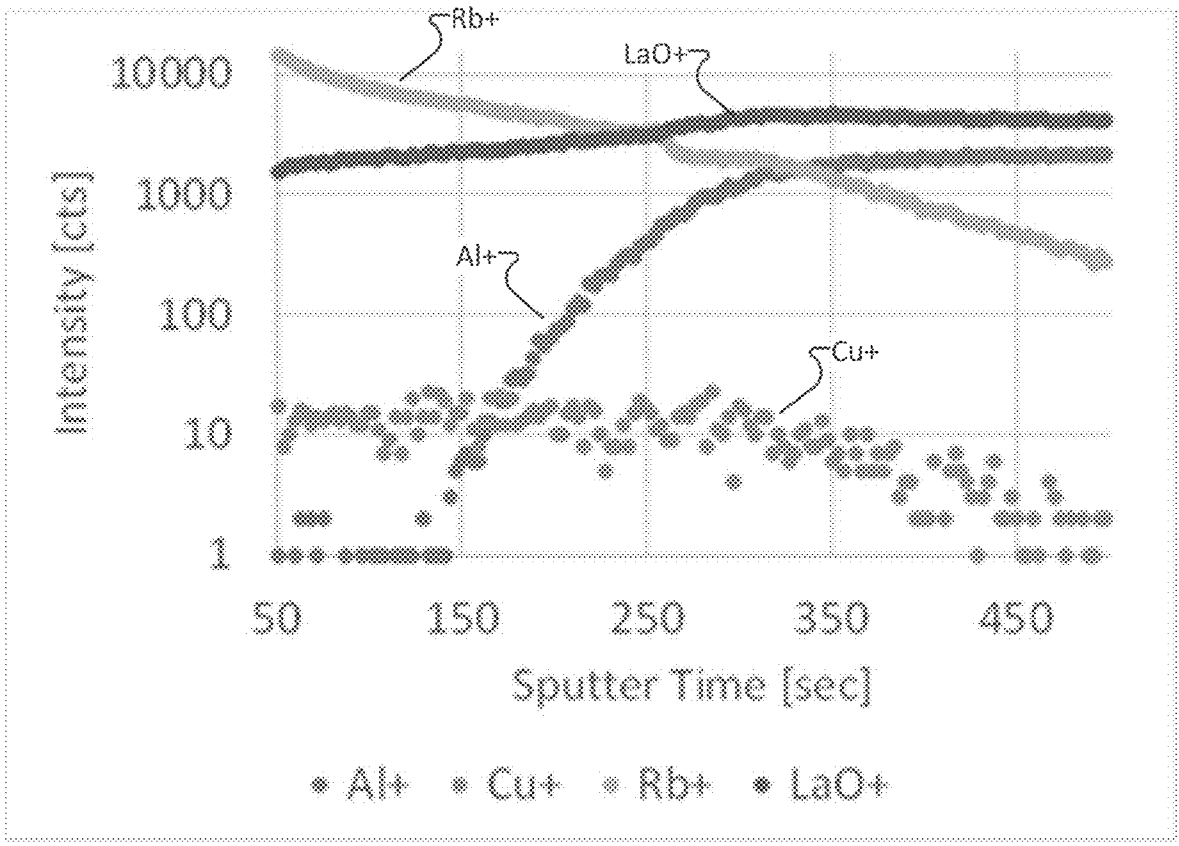
FIG. 37 shows a plot of intensity as a function of sputter time for a Time of Flight Secondary Ion Mass Spectroscopy (TOF-SIMS) spectrum for a high temperature superconductor material sample.

FIG. 37 is a Time of Flight Secondary Ions Mass Spectroscopy (TOF-SIMS) spectrum of the sample showing the high presence of Rb in the film relative to other components, indicating the incorporation of Rb into the film deposited by ALD. The rise of the Al peak signifies the interface with the substrate. This demonstrates successful transformation of the crystal lattice to include a large fraction of rubidium ions in the structure. The La fraction increases gradually from the top of the thin film towards the substrate while the Rb fraction decreases gradually from the surface to the substrate. At least for some thickness below the surface of the layer, x in the formula above is larger than 0.5. For such a high value of the Rb fraction, it is believed that the material exhibits superconductivity at room temperature.

FIGS. 38A-38C shows room temperature I-V curves of Josephson junction arrays produced from the $(Rb_xLa_{1-x})_2CuO_4$ sample. FIG. 38A shows a change in slope of the I-V relationship; FIGS. 38B and 38C show a flat dependence of the voltage on current in the range of 25 mA to 100 mA. These data indicate that the room temperature I-V response of the samples is due to the presence of a tunneling junction composed of regions of superconducting material connected by weak links.

Figure 39:
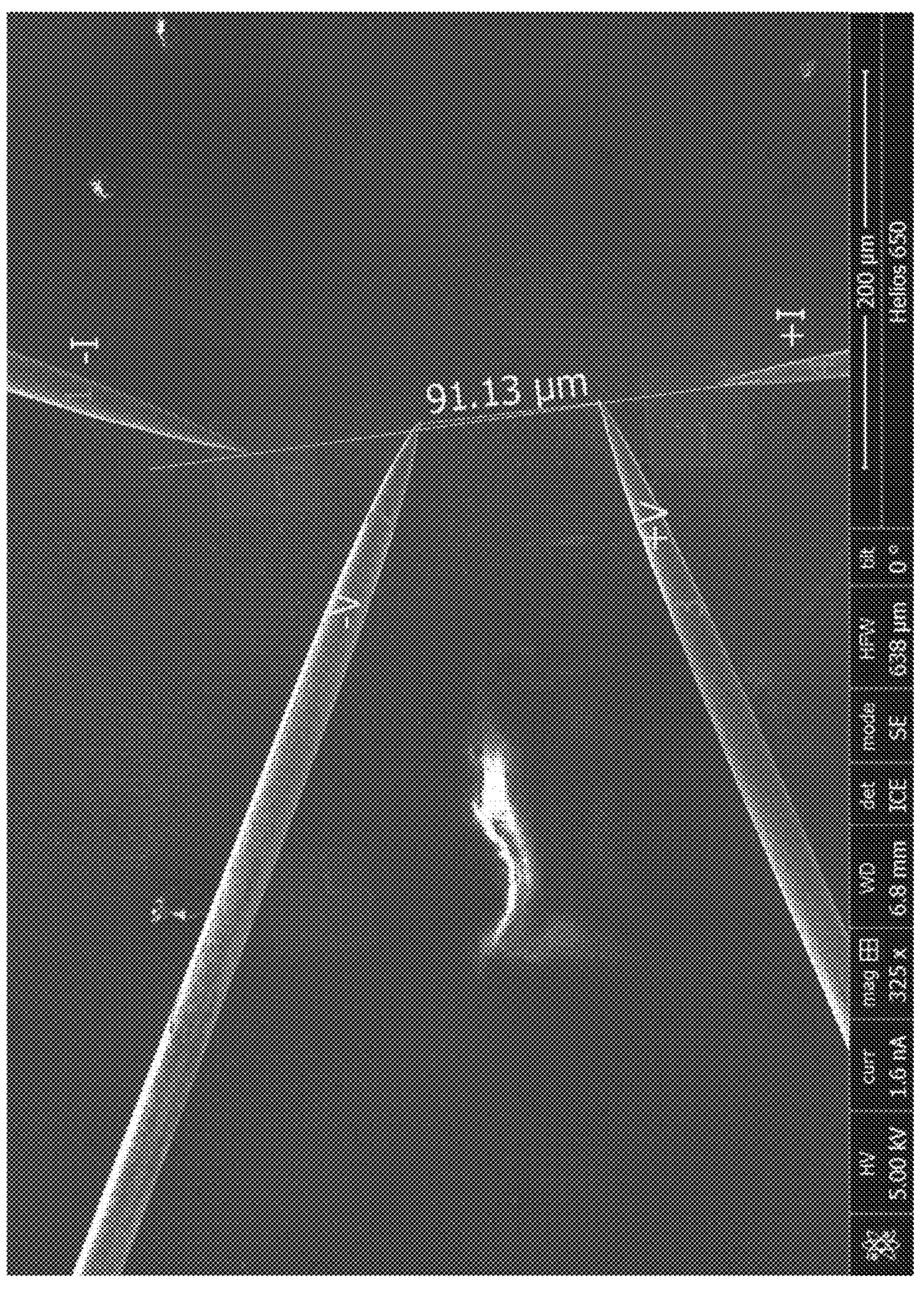
FIG. 39 is an SEM picture of a 4-point probe configuration used for obtaining room temperature I-V characteristics

These experiments were carried out by a four-point probe at a compliance voltage of 10 V in a Helios 650 nano-lab. FIG. 39 is a scanning electron microscopy image of an example of a four-point probe measurement configuration. FIGS. 38A-38C and FIG. 40 show data from measurements carried out at different locations on the same sample.

Figure 40:
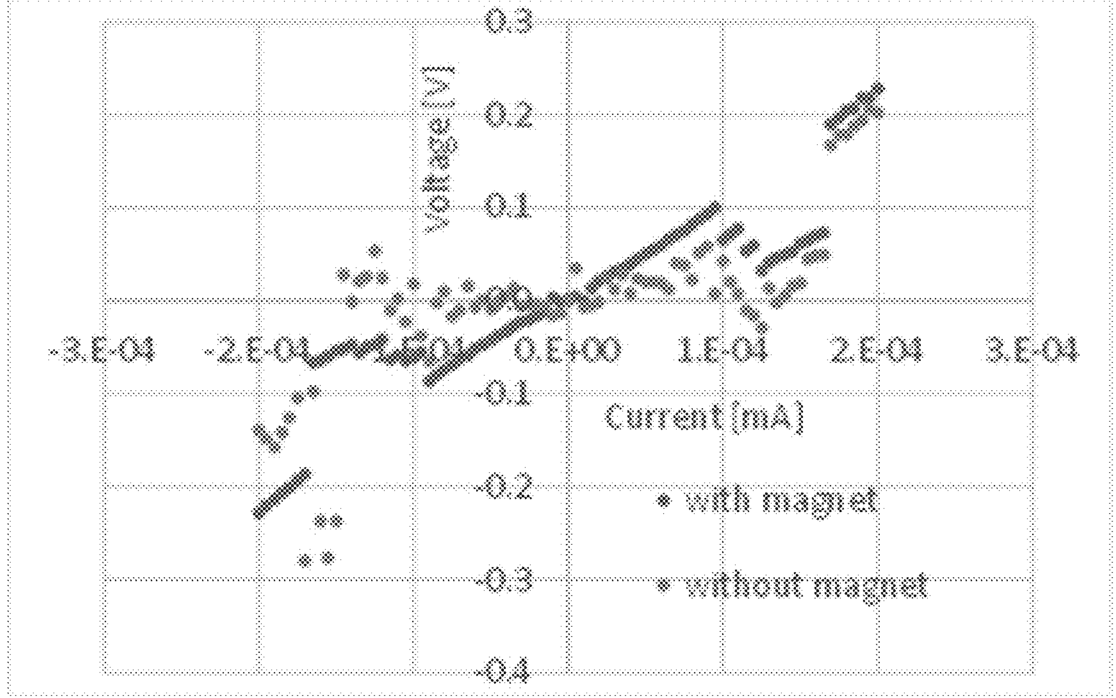
FIG. 40 is a plot showing a room temperature I-V characteristic of a Josephson junction formed from a high temperature superconductor material.

Referring to FIG. 40, the effect of a magnetic field on the junction array was characterized. The current-voltage characteristic of the $(Rb_xLa_{1-x})_2CuO_4$ sample was measured in a dual beam focused ion beam (FIB) (FEI Helios 600) with and without a small magnet positioned near, but external to, the chamber of the FIB. Even though the FIB chamber is shielded against external magnetic fields, the small magnet had a detectable effect on the I-V characteristic of the material. The current at zero voltage was suppressed by the magnetic field, and the slope of the curve at low current changed dramatically. Furthermore, a switching operating between maximum and minimum zero voltage current (referred to as Josephson current) was triggered by moving around the small magnet.

Prophetic Example 1: Synthesis Using Atomic Layer Deposition

High temperature superconductor materials with the target formula $La_{2-x}Sr_xRb_2CuO_4$ is synthesized using atomic layer deposition process described in Example 9 above by replacing 1-3 of the 17 $La(thd)_3$-pulses with $Sr(thd)_2$.

Prophetic Example 2: Synthesis Using Atomic Layer Deposition

High temperature superconductor materials with the target formula $La_{2-x}Sr_xRb_2Na_2Cu_3O_8$ is synthesized using atomic layer deposition described in Prophetic Example 1 above by incorporating Na-deposition into the process.

Example 11: Growth of a Superconducting RLCO Film Using MBE

Experiments were performed to evaluate the ability of MBE to enable the growth of a film incorporating alkali metal ions into sites that would otherwise have been occupied by alkaline earth metals or rare earth metals. Specifically, high temperature superconductor materials with the target formula $(Rb_xLa_{1-x})_2CuO_4$ (e.g., $(La,Rb)_2CuO_4$) (referred to as an RLCO film) were grown on a (100) LAO substrate using MBE. The composition and crystallinity of the material was characterized and the material was confirmed to exhibit superconductivity.

Alkali metal sources, including Rb, K, Na and Cs sources, were prepared by mixing the alkali metals with indium in a glove box.

The thermocouple temperature of the substrate was kept at 700° C. and the pyrometer temperature of the substrate was measured at 640° C. The ozone pressure during MBE was 2.00E-6 Torr. The growth temperatures for the sources were as follows:

La base: 1460° C.

Cu tip: 1030° C.; Cu base: 1010° C.

Rb tip: 310° C.; Rb base: 290° C.

A buffer layer of $La_2CuO_4$ was grown onto the LAO substrate for a growth time of 10 minutes, following by 30 minutes of growth time for the growth of the RLCO film with target composition $(La,Rb)_2CuO_4$. Growth was monitored by reflection high-energy electron diffraction (RHEED). The resulting sample is referred to as the Example 12 sample Rutherford backscattering spectrometry (RBS) was performed to characterize the composition of the Example 12 sample following MBE growth. RBS results are shown in Table 4. These results indicate that MBE growth enabled Rb incorporation into the RLCO film, e.g., at a stoichiometric ratio of Rb to Cu of approximately 3.5:17, or approximately 20% Rb.

TABLE 4

Elemental composition of MBE-grown RLCO film.

| Thickness, *10^15 at/$cm^2$ | La | Cu | O | Rb |
|---|---|---|---|---|
| 100/80 | 45.5/66.7 | 17.0/11.1 | 34.1/22.2 | 3.5 |

Figure 41:
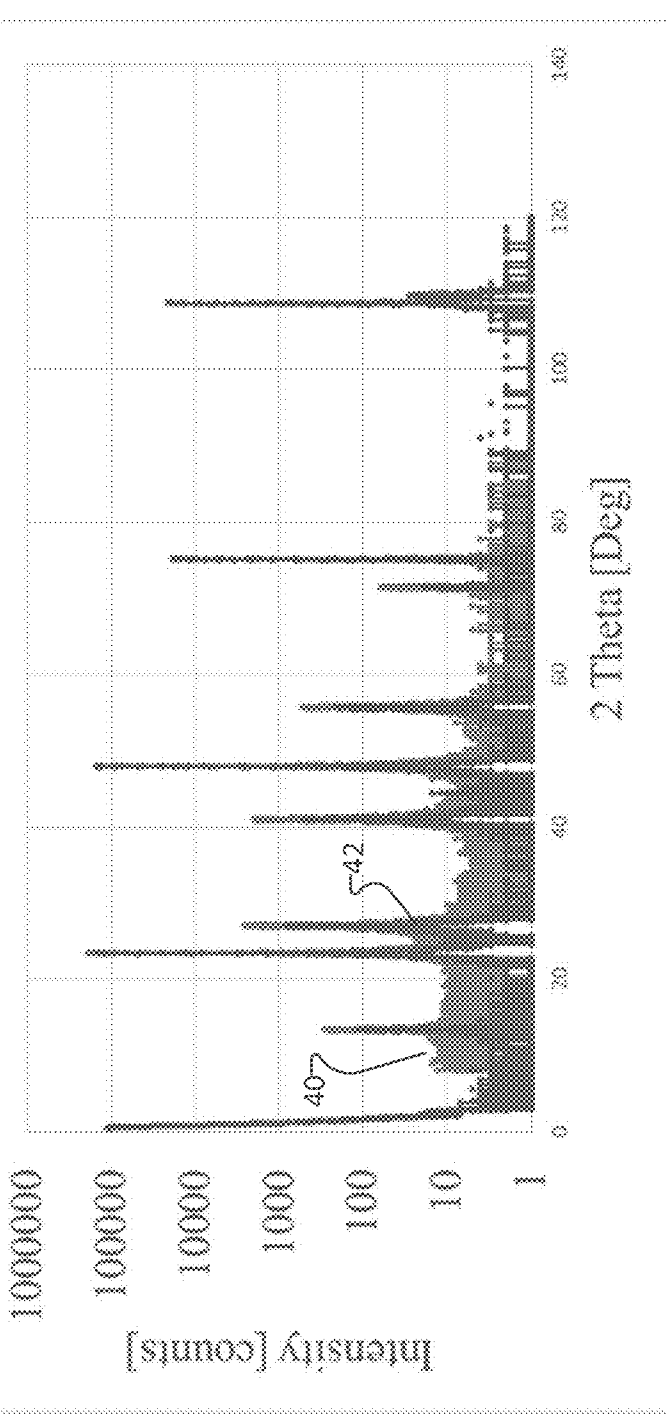
FIG. 41 shows X-ray diffraction (XRD) data for an MBE-grown high temperature superconductor material.

Referring to FIG. 41, high-resolution X-ray diffraction (XRD) theta-2-theta scans were performed to characterize the crystallinity of the RLCO layer of the Example 12 sample. The XRD data are shown as a curve 40. Reference data are shown as a curve 42. The reference data are taken from an XRD characterization of a $(La,Sr)_2CuO_4$ film on a $La_2CuO_4$ buffer layer on a (100) LAO substrate. As can be seen from the XRD data, the RLCO layer of the Example 12 sample is crystalline. Optical inspection of the fabricated sample showed crystalline regions having an area on the order of 10 mm×10 mm.

Figure 42:
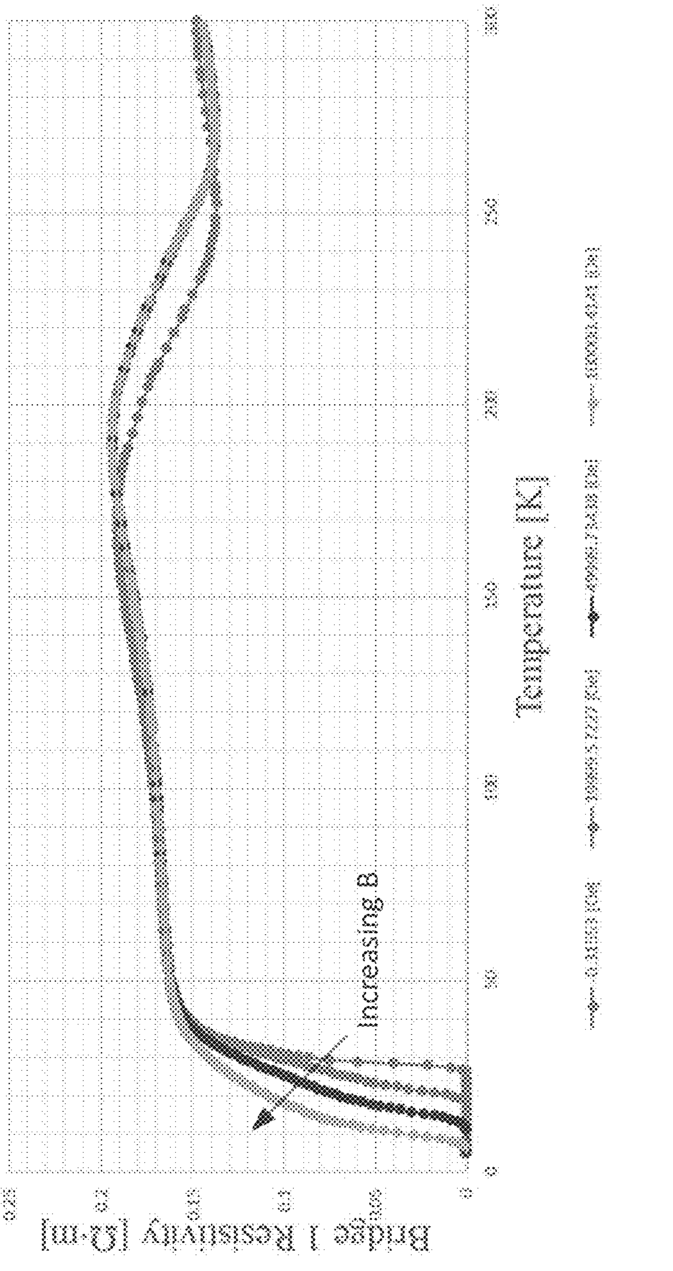
FIG. 42 shows 4-point resistivity data for an MBE-grown high temperature superconductor material.

FIG. 42 shows 4-point resistivity data for the Example 12 sample. The graph plots the resistance of the RLCO layer of the Example 12 sample as a function of temperature T. The 4-point contacts were prepared by applying indium solder to the four corners of a 10×10 mm piece of the Example 12 sample followed by wire bonding. The measurements were carried out in a Quantum Design physical property measurement system (PPMS). Each line represents application of a different strength magnetic field B: 0 T, 2 T, 5 T, and 10 T. The PPMS data demonstrate that the RLCO layer of the Example 12 sample is a superconducting material at certain temperatures.

Superconductivity can be observed in PPMS data as a sharp transition in the relationship between resistivity and temperature. As can be seen from the graph of FIG. 42, the onset of superconductivity in the RLCO layer is at about 50 K. Below that temperature, the RLCO layer is a superconducting material. At no applied magnetic field, a resistivity of substantially zero is reached at a temperature of about 38 K. Superconductivity is known to degrade with application of a magnetic field. As can be seen from the graph of FIG. 40, as the magnetic field applied to the Example 12 sample increases, the onset of superconductivity changes very little, but the temperature at which zero resistivity is reached decreases significantly, so that the transition is substantially broadened with increasing magnetic field. The effect of the magnetic field on the resistivity of the RLCO layer of the Example 12 sample is further confirmation of the superconducting nature of the RLCO material.

Without being bound by theory, it is believed that the RLCO layer of Example 12 has Rb incorporated into the crystal lattice in sites that would otherwise contain La. It is also believed that the onset of superconductivity will increase to even higher temperatures as higher fraction of clusters such as those described above are formed in the film.

Example 12: Incorporation of Rb into an RLCO Film Using MBE

An RLCO film with the target formula $(La,Rb)_2CuO_4$ was formed on a (100) STO substrate using MBE to further investigate the ability of MBE to result in incorporation of Rb into sites that would otherwise contain La. The use of the STO substrate facilitates evaluation of the composition of the MBE-grown RLCO film because (other than oxygen) there is no overlap in elements between the substrate and the RLCO film.

The thermocouple temperature of the substrate was kept at 700° C. and the pyrometer temperature reading of the substrate was between 540-550° C. The ozone pressure during MBE was 2.00E-6 Torr. The growth temperatures for the sources were as follows:

La base: 1434° C.

Cu tip: 1030° C.; Cu base: 1010° C.

Rb tip: 340° C.; Rb base: 320° C.

A RLCO film with target composition $(La,Rb)_2CuO_4$ was grown directly onto the STO substrate and was allowed to proceed for 33 minutes. The resulting sample is referred to as the Example 13 sample.

Figure 43:
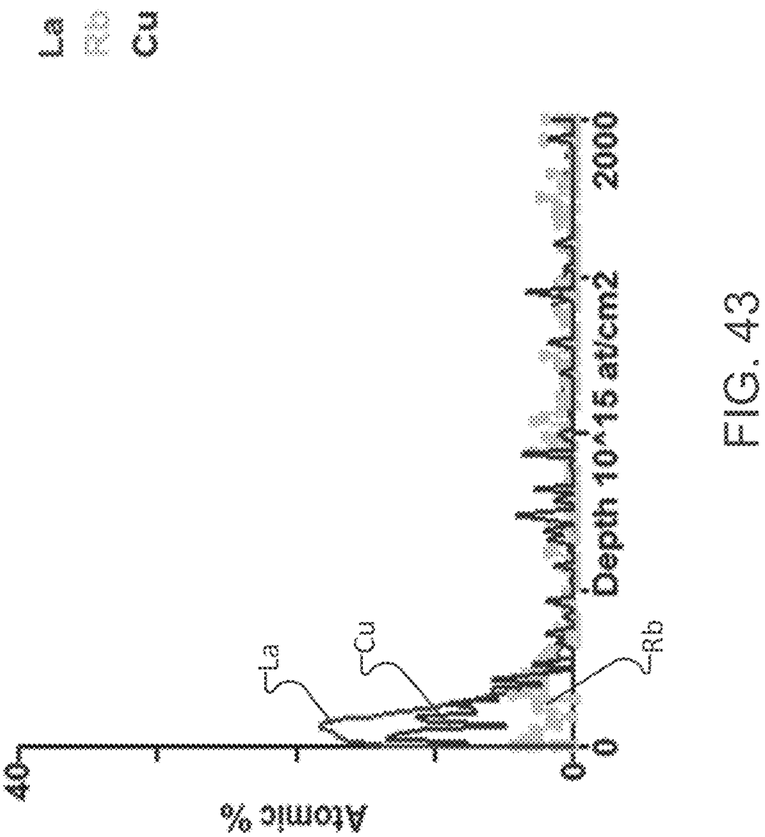
FIG. 43 shows Rutherford backscattering (RBS) elemental analysis data for an MBE-grown high temperature superconductor material.

RBS was performed to characterize the composition of the Example 13 sample following MBE growth. A summary of the RBS results is shown in Table 5 and a plot of the RBS data is shown in FIG. 43. The plot of FIG. 43 clearly shows the presence of La, Rb, and Cu close to the surface of the sample, indicating the incorporation of Rb into the MBE-grown RLCO film. The RBS data of Table 5 also indicate that the incorporation is approximately stoichiometric, with the concentration of La and Rb (22.6+5.9) being approximately twice that of Cu (14).

TABLE 5

RBS elemental analysis data of MBE-grown RLCO film.

| Thickness, *10^15 at/$cm^2$ | La | Cu | O | Rb |
|---|---|---|---|---|
| 128.55 | 22.6 | 14 | 57.2 | 5.9 |

Example 13: Growth of a Superconducting BRSCO Film Using MBE

High temperature superconductor materials with the target formula $Bi_2(Rb,Sr)_2CuO_{6+\delta}$ (referred to as a BRSCO film) were grown on a (100) $SrTiO_3$ (STO) substrate using MBE.

The thermocouple temperature of the substrate was kept at 785° C. and the pyrometer temperature of the substrate was kept at 605° C. The ozone pressure during MBE was 7.00E-6 Torr. The growth temperatures for the sources were as follows:

Cu tip: 1032° C.; Cu base: 1012° C.

Rb tip: 290° C.; Rb base: 270° C.

Sr tip: 545° C.; Sr base: °445 C

Bi tip: 655° C.; Bi base: °630 C.

A buffer layer of $Bi_2Sr_2CuO_{6+\delta}$ was grown onto the STO substrate for a growth time of 20 minutes, following by 40 minutes of growth time for the growth of the BRSCO film with target composition $Bi_2(Rb,Sr)_2CuO_{6+\delta}$. A LAO cap was then grown for 30 minutes on top of the BRSCO film. Growth was monitored by reflection high-energy electron diffraction (RHEED). The resulting sample is referred to as the Example 14 sample.

Figure 44:
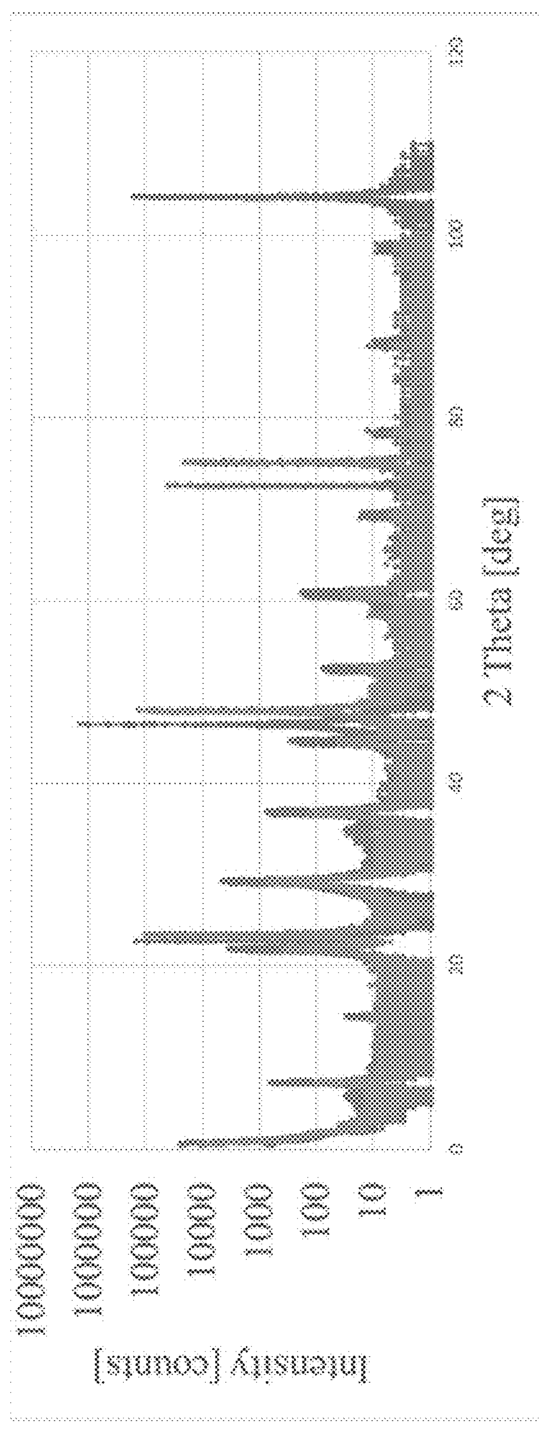
FIG. 44 shows XRD data for an MBE-grown high temperature superconductor material.

Referring to FIG. 44, high-resolution XRD theta-2-theta scans were performed to characterize the crystallinity of the BRSCO layer of the Example 13 sample. As can be seen from the XRD data, the BRSCO layer of the Example 13 sample is crystalline.

Figure 45:
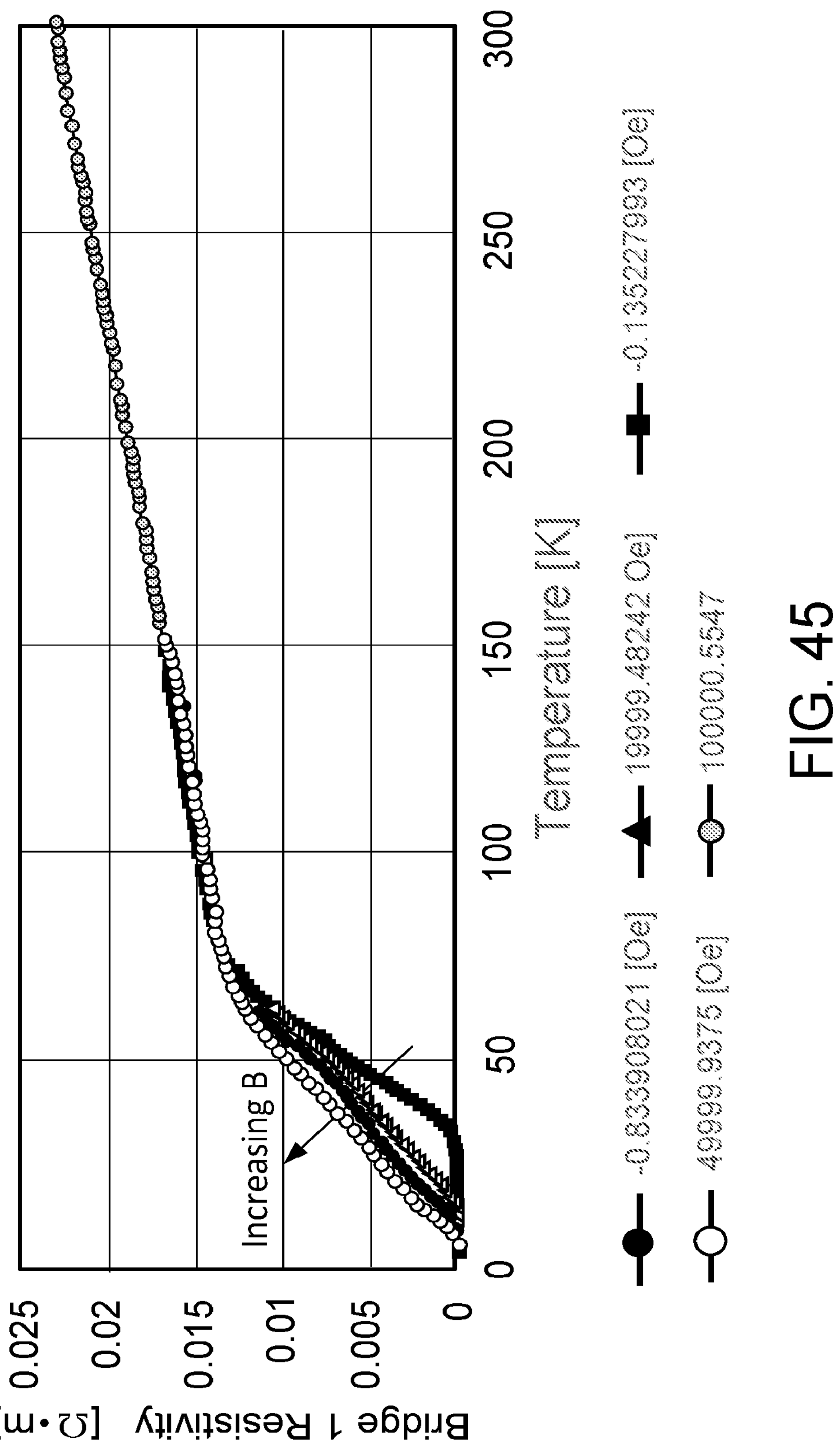
FIG. 45 shows PPMS data for an MBE-grown high temperature superconductor material.

FIG. 45 shows PPMS data for the Example 13 sample. The graph plots the resistivity of the BRSCO layer of the Example 13 sample as a function of temperature, for application of a magnetic field B of 0 T, 2 T, 5 T, and 10 T. The PPMS data demonstrate that the BRSCO layer of the Example 14 sample is a superconducting material at certain temperatures.

As can be seen from FIG. 45, the onset of superconductivity in the BRSCO layer is at about 70 K. Below that temperature, the BRSCO layer is a superconducting material. At no applied magnetic field, a resistivity of substantially zero is reached at a temperature of about 35 K. As the magnetic field applied to the Example 13 sample is increased, the onset of superconductivity remains substantially unchanged, but the temperature at which zero resistivity is reached decreases. The effect of the magnetic field on the resistivity of the BRSCO layer of the Example 13 sample is further confirmation of the superconductive nature of the BRSCO material.

Without being bound by theory, it is believed that the BRSCO layer of Example 13 has Rb incorporated into the crystal lattice in sites that would otherwise contain Sr. It is also believed that the onset of superconductivity will increase to even higher temperatures as higher fractions of clusters such as those described above are formed in the film.

Example 14: Incorporation of Rb into a BRSCO Film Using MBE

A film with the target formula $Bi_2(Rb,Sr)_2CuO_{6+\delta}$ was formed on a (100) MgO substrate using MBE to further demonstrate the ability of MBE to result in incorporation of Rb into sites that would otherwise contain Sr. The use of the MGO substrate facilitates evaluation of the composition of the MBE-grown BRSCO film because (other than oxygen) there is no overlap in elements between the substrate and the BRSCO film.

The thermocouple temperature of the substrate was kept at 700° C. and the pyrometer temperature of the substrate was kept at 650° C. The ozone pressure during MBE was 6.00E-6 Torr. The growth temperatures for the sources were as follows:

Cu tip: 1030° C.; Cu base: 1010° C.

Rb tip: 315° C.; Rb base: 295° C.

Sr tip: 482° C.; Sr base: 457° C.

Bi tip: 645° C.; Bi base: 620° C.

A film with target composition $Bi_2(Rb,Sr)_2CuO_{6+\delta}$ was grown directly onto the MgO substrate and was allowed to proceed for 60 minutes. The resulting sample is referred to as the Example 15 sample.

Figure 46:
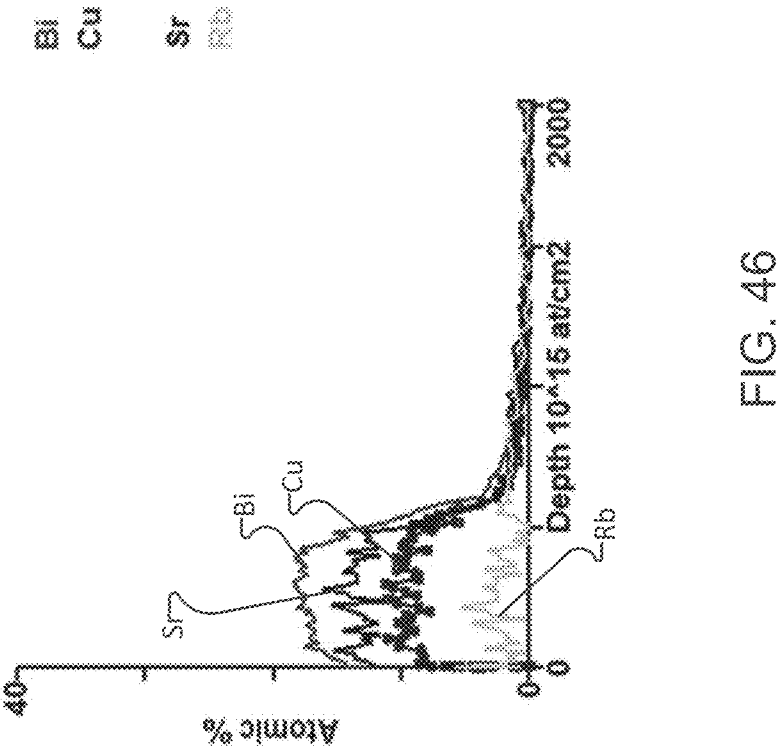
FIG. 46 shows RBS elemental analysis data for an MBE-grown high temperature superconductor material. Like reference symbols in the various drawings indicate like elements.

RBS was performed to characterize the composition of the Example 15 sample following MBE growth. A summary of the RBS results is shown in Table 6 and a plot of the RBS data is shown in FIG. 46. The plot of FIG. 46 clearly shows the presence of Bi, Rb, Sr, and Cu close to the surface of the sample, indicating the incorporation of Rb into the MBE-grown film. The RBS data of Table B also indicate that the incorporation is approximately stoichiometric, with ratio of Bi to Cu being approximately 2:1 and the ratio of Bi to (Sr and Rb) being approximately 1:1.

TABLE 6

RBS elemental analysis data of MBE-grown BRSCO film.

| Thickness, *10^15 at/cm$^2$ | Bi | Cu | Sr | O | Rb |
|---|---|---|---|---|---|
| 545.24 | 18.2 | 9.1 | 14.4 | 54.7 | 3.5 |

Figure 47:
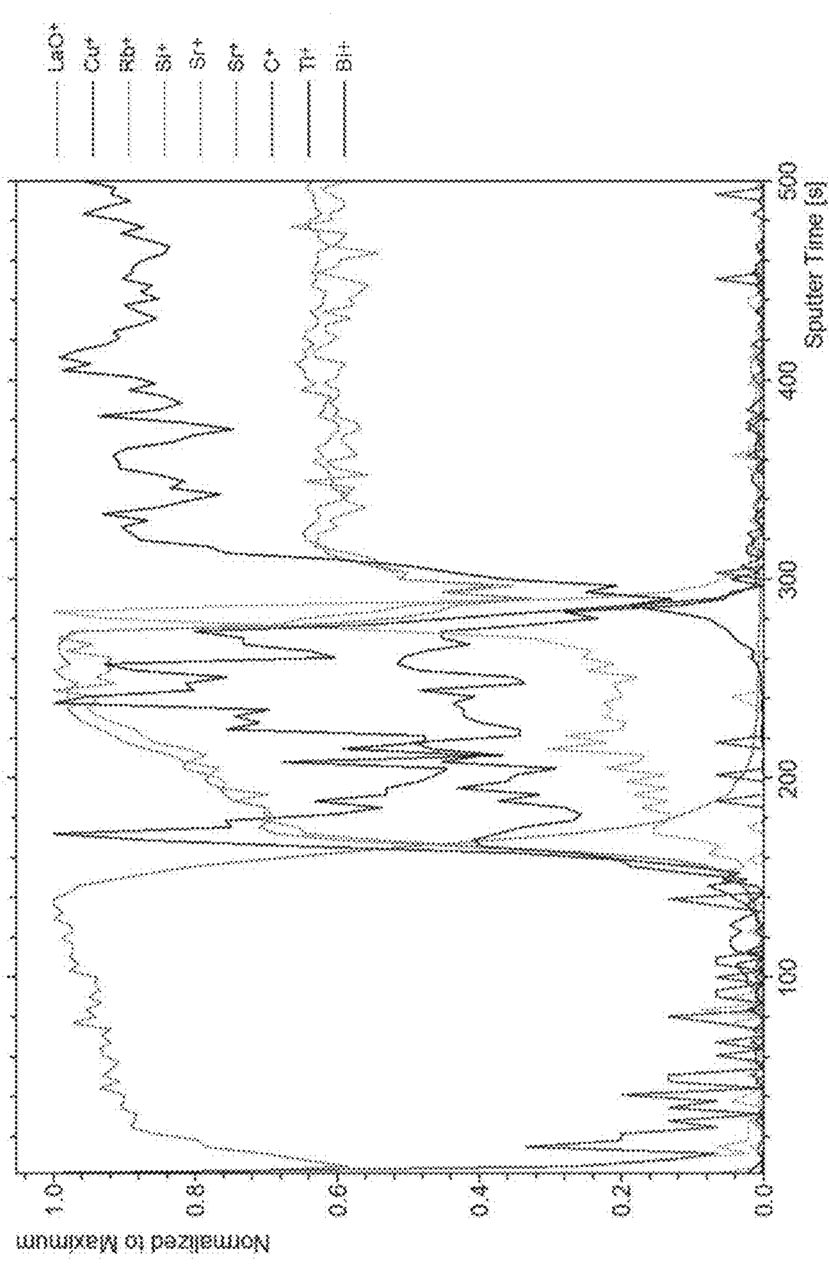
FIG. 47 shows a plot of intensity as a function of sputter time for a Time of Flight Secondary Ion Mass Spectroscopy (TOF-SIMS) spectrum for a high temperature superconductor material.

FIG. 47 is a TOF-SIMS measurement of the sample of example 13. The cross section of the sample is revealed as function of sputtering time. First, the cap layer of LaAlO3 is revealed. Below that layer is the BRSCO layer, clearly demonstrating the presence of Rb. The rise of the Ti signal signifies the interface with the SrTiO3 substrate.

APPLICATIONS

In some embodiments, junctions, such as described in Example 9 and shown in the TEM micrographs of FIGS. 36A and 36B, can be combined to form a Superconducting Quantum Interference Device (SQUID). Such SQUIDs can be used as a magnetometer. In further embodiments, multiple junctions can be combined in an array to form a processor (e.g., a CPU) formed from superconducting electronics components such as RSFQ. Such devices can exhibit high operating speeds with small dissipation losses. Other embodiments are within the scope of the following claims.

What is claimed is:

1. A superconducting article formed by a method comprising:

forming, on a substrate, a metal oxide film including ions of an alkali metal and ions of a transition metal, and ions of one or more of an alkaline earth metal and a rare earth metal by atomic layer deposition, including:

exposing the substrate to one or more pulses of a reactant including one or more of the alkaline earth metal and the rare earth metal;

exposing the substrate to one or more pulses of a reactant including the transition metal; and exposing the substrate to one or more pulses of a reactant including the alkali metal; and annealing the substrate with the metal oxide film formed thereon.

2. The superconducting article of claim 1, in which the substrate comprises a semiconductor wafer.

3. The superconducting article of claim 1, in which the substrate comprises a metal substrate.

4. The superconducting article of claim 1, in which the substrate comprises an $LaAlO_3$ substrate.

5. The superconducting article of claim 1, in which the metal oxide film has a thickness of between 30 nm and 1 μm.

6. The superconducting article of claim 1, in which the alkali metal ions comprise one or more of Li ions, Na ions, K ions, Rb ions, and Cs ions.

7. The superconducting article of claim 1, in which the transition metal ions comprise one or more of Cu ions and Fe ions.

8. The superconducting article of claim 1, in which the metal oxide film includes La, Rb, Cu and O.

9. The superconducting article of claim 8, in which the metal oxide film has a composition of $(Rb_xLa_{1-x})_2CuO_4$.

10. The superconducting article of claim 9, in which x is greater than or equal to 0.5.

11. The superconducting article of claim 1, in which the substrate comprises one or more of a diffusion barrier and a buffer layer.

12. The superconducting article of claim 1, in which in the metal oxide film, the alkali metal ions replace at least some of the alkaline earth or rare earth ions, and in which the metal oxide film has a critical temperature at least 50% greater than a critical temperature of a metal oxide film in which alkali ions do not replace the alkaline earth or rare earth ions.

13. The superconducting article of claim 1, in which the metal oxide film includes La ions, Rb ions, and Cu ions and has a critical temperature at least 50% greater than a metal oxide film including La ions and Cu ions and not including Rb ions.

14. The superconducting article of claim 13, in which the metal oxide film has a critical temperature at least 100% greater than a critical temperature of the metal oxide film in which alkali ions do not replace the alkaline earth or rare earth ions.

15. The superconducting article of claim 1, in which the metal oxide film includes crystalline regions including the alkali metal ions.

16. The superconducting article of claim 1, in which from 10% to 100% of the alkaline earth metal ions or rare earth metal ions are replaced in a crystal structure of the metal oxide film by the alkali metal ions.

17. A superconducting article, comprising:

a substrate; and a superconducting metal oxide film formed on the substrate, the metal oxide film including ions of an alkali metal, ions of a transition metal, and ions of an alkaline earth metal or a rare earth metal.

18. The superconducting article of claim 17, in which the alkali metal ions comprise one or more of Li ions, Na ions, K ions, Rb ions, and Cs ions.

19. The superconducting article of claim 17, in which the metal oxide film has a composition of $(Rb_xLa_{1-x})_2CuO_4$.

20. The superconducting article of claim 17, in which the metal oxide film comprises Bi ions, Rb ions, Sr ions, and Cu ions.

21. The superconducting article of claim 20, in which the metal oxide film has a composition of $Bi_2(Rb_xSr_{1-x})_2CuO_{6+\delta}$.

* * * * *